(12) United States Patent
Kwon et al.

(10) Patent No.: US 11,600,548 B2
(45) Date of Patent: Mar. 7, 2023

(54) METHODS AND HEAT DISTRIBUTION DEVICES FOR THERMAL MANAGEMENT OF CHIP ASSEMBLIES

(71) Applicant: Google LLC, Mountain View, CA (US)

(72) Inventors: Woon-Seong Kwon, Santa Clara, CA (US); Yuan Li, Sunnyvale, CA (US); Zhi Yang, Fresh Meadow, NY (US)

(73) Assignee: Google LLC, Mountain View, CA (US)

( * ) Notice: Subject to any disclaimer, the term of this patent is extended or adjusted under 35 U.S.C. 154(b) by 70 days.

(21) Appl. No.: 17/333,607

(22) Filed: May 28, 2021

(65) Prior Publication Data
US 2021/0375715 A1 Dec. 2, 2021

Related U.S. Application Data

(60) Provisional application No. 63/066,550, filed on Aug. 17, 2020, provisional application No. 63/032,197, filed on May 29, 2020.

(51) Int. Cl.
*H01L 23/373* (2006.01)
*H01L 23/00* (2006.01)
(Continued)

(52) U.S. Cl.
CPC ........ *H01L 23/3732* (2013.01); *H01L 23/562* (2013.01); *H01L 24/32* (2013.01);
(Continued)

(58) Field of Classification Search
CPC .................................................. H01L 23/3732
(Continued)

(56) References Cited

U.S. PATENT DOCUMENTS 5,909,056 A 6/1999 Mertol
6,313,521 B1 11/2001 Baba
(Continued)

FOREIGN PATENT DOCUMENTS

CN 113347805 A 9/2021
TW 201030300 A 8/2010
(Continued)

OTHER PUBLICATIONS

Extended European Search Report for European Patent Application No. 21176553.2 dated Nov. 16, 2021. 7 pages.
(Continued)

*Primary Examiner* — Ajay Arora
(74) *Attorney, Agent, or Firm* — Lerner, David, Littenberg, Krumholz & Mentlik, LLP

(57) ABSTRACT

According to an aspect of the disclosure, an example microelectronic device assembly includes a substrate, a microelectronic element electrically connected to the substrate, a stiffener element overlying the substrate, and a heat distribution device overlying the rear surface of the microelectronic element. The stiffener element may extend around the microelectronic element. The stiffener element may include a first material that has a first coefficient of thermal expansion ("CTE"). A surface of the stiffener element may face toward the heat distribution device. The heat distribution device may include a second material that has a second CTE. The first material may be different than the second material. The first CTE of the first material of the stiffener element may be greater than the second CTE of the second material of the heat distribution device.

20 Claims, 56 Drawing Sheets

(51) Int. Cl.
 *H05K 3/34* (2006.01)
 *H05K 7/20* (2006.01)
 *H01L 25/065* (2023.01)
(52) U.S. Cl.
 CPC .......... *H01L 24/83* (2013.01); *H05K 3/3436* (2013.01); *H05K 7/20254* (2013.01); *H01L 25/0655* (2013.01); *H01L 2223/58* (2013.01); *H01L 2224/32* (2013.01); *H01L 2224/32245* (2013.01); *H01L 2924/15311* (2013.01); *H05K 2201/10378* (2013.01); *H05K 2203/041* (2013.01)
(58) Field of Classification Search
 USPC ........................................ 438/122; 257/706
 See application file for complete search history.

(56) References Cited

U.S. PATENT DOCUMENTS

| | | | |
|---|---|---|---|
| 7,312,261 | B2 | 12/2007 | Sachdev et al. |
| 7,459,782 | B1 | 12/2008 | Li |
| 7,468,886 | B2 | 12/2008 | Coico et al. |
| 7,724,527 | B2 | 5/2010 | Coico et al. |
| 7,731,079 | B2 | 6/2010 | Campbell et al. |
| 7,781,883 | B2 | 8/2010 | Sri-Jayantha et al. |
| 7,816,785 | B2 | 10/2010 | Iruvanti et al. |
| 8,023,268 | B2 | 9/2011 | Fukuzono et al. |
| 8,299,608 | B2 | 10/2012 | Bartley et al. |
| 8,743,545 | B2 | 6/2014 | Campbell et al. |
| 9,070,656 | B2 | 6/2015 | Hooper et al. |
| 9,385,060 | B1 | 7/2016 | Hool et al. |
| 9,735,043 | B2 | 8/2017 | Ho et al. |
| 9,960,145 | B2 | 5/2018 | Costa et al. |
| 10,553,516 | B1 | 2/2020 | Canaperi et al. |
| 10,553,522 | B1 | 2/2020 | Canaperi et al. |
| 2006/0261469 | A1* | 11/2006 | Ni .......................... H01L 24/29 257/E23.09 |
| 2011/0042784 | A1 | 2/2011 | Edwards et al. |
| 2016/0165755 | A1 | 6/2016 | Bodenweber et al. |
| 2018/0294202 | A1* | 10/2018 | Cheng .................. H01L 21/565 |
| 2020/0161215 | A1 | 5/2020 | McNamara et al. |
| 2021/0378106 | A1 | 12/2021 | Iyengar et al. |

FOREIGN PATENT DOCUMENTS

| | | |
|---|---|---|
| WO | 2010059879 A2 | 5/2010 |
| WO | 2017111945 A1 | 6/2017 |

OTHER PUBLICATIONS

Partial European Search Report for European Patent Application No. 21176533.4 dated Nov. 17, 2021. 11 pages.
Extended European Search Report for European Patent Application No. 21176533.4 dated Apr. 12, 2022. 12 pages.

\* cited by examiner

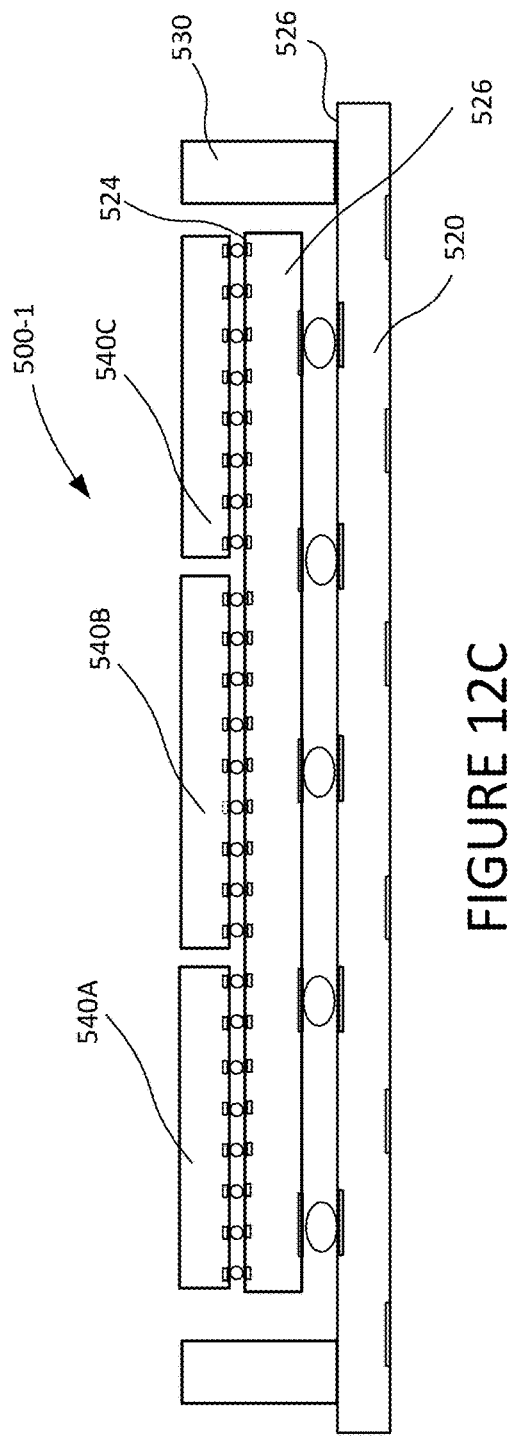
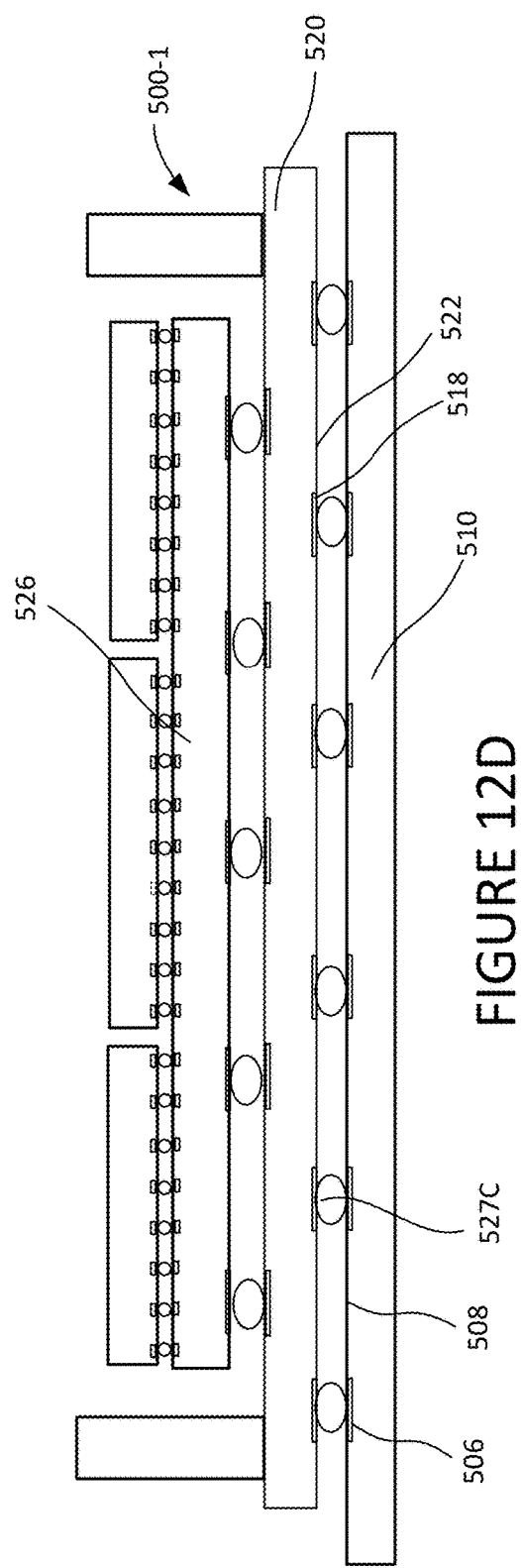

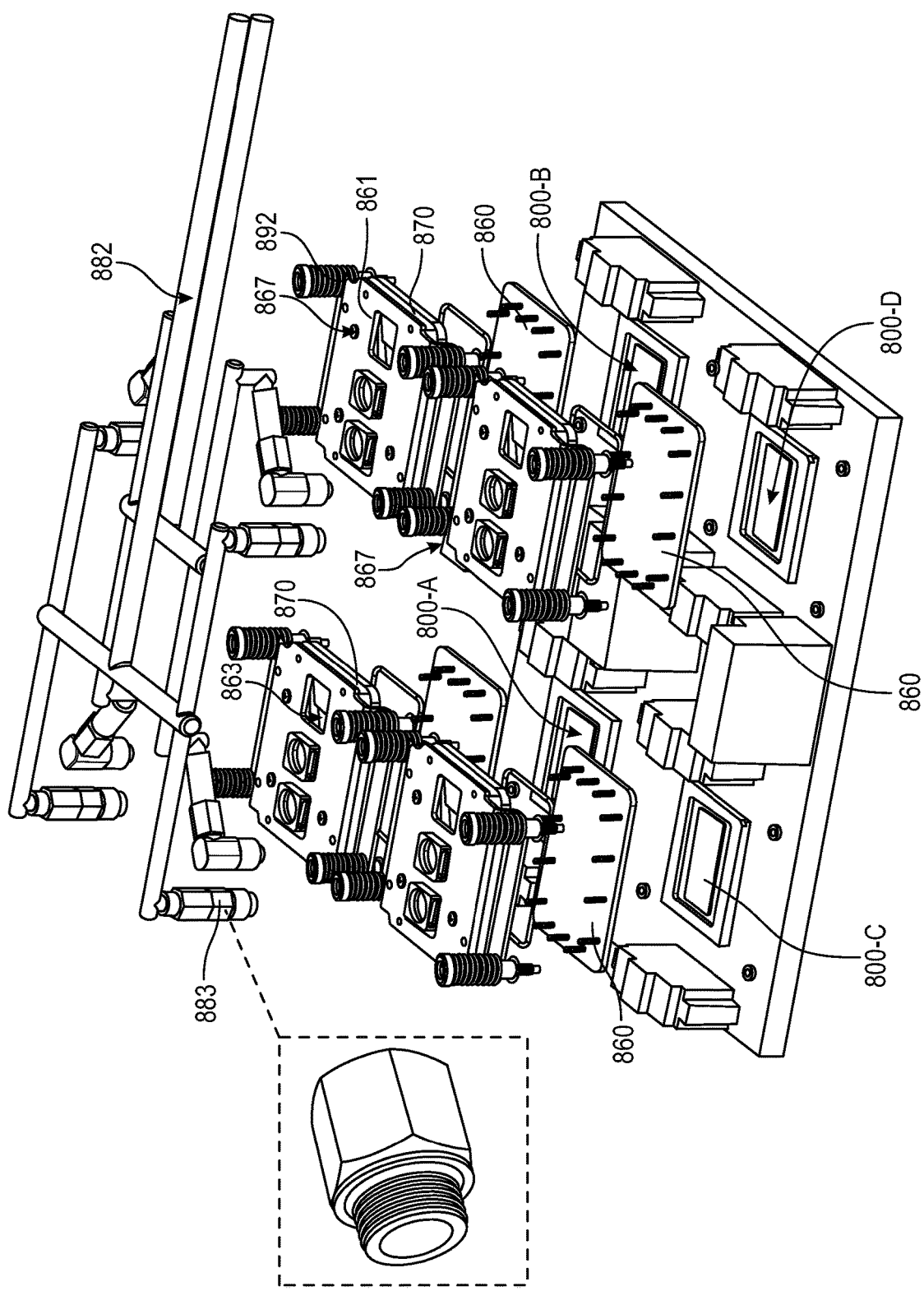

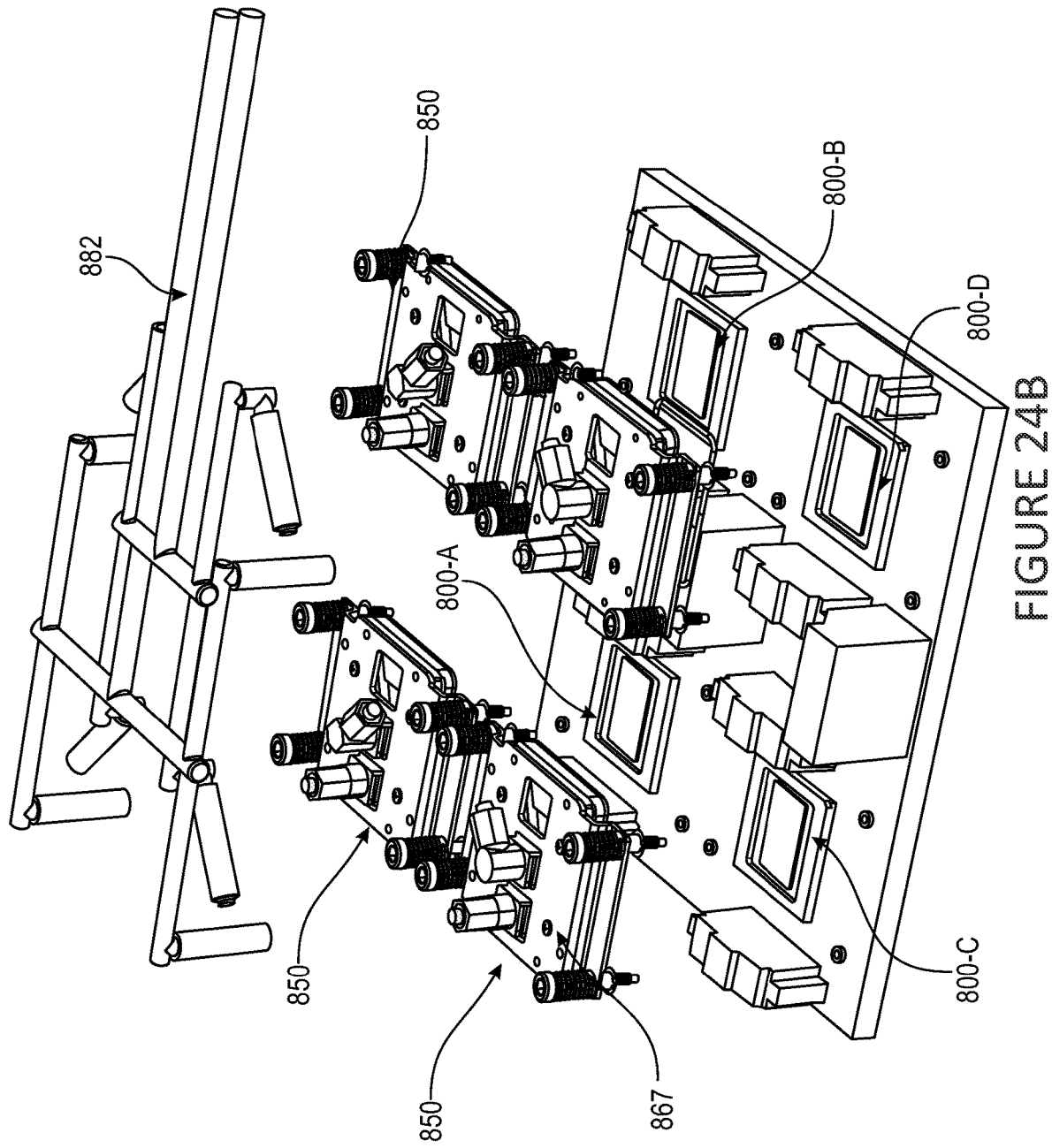

| TIM | TIM Thickness (um) | TIM K (W/mk) | Cold Plate Base | Cold Plate Fins | Supportable Chip Heat Flux (w/mm2) at 95C Tj |
|---|---|---|---|---|---|
| Grease | 100 | 6 | Copper | Copper | 4.0 |
| Grease | 100 | 6 | Slv Dia | Copper* | 4.4 |
| Grease | 100 | 6 | Slv Dia | Slv Dia | 4.8 |
| Soldered | 200 | 40 | Slv Dia | Slv Dia | 7.2 |
| Soldered | 200 | 40 | Copper | Copper | 5.8 |

FIGURE 26

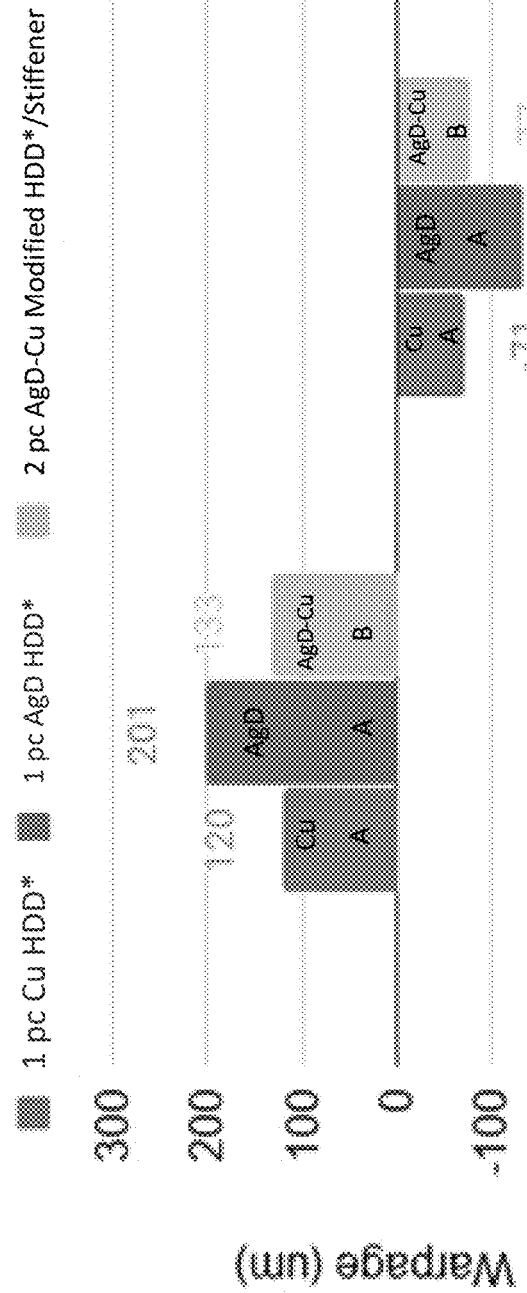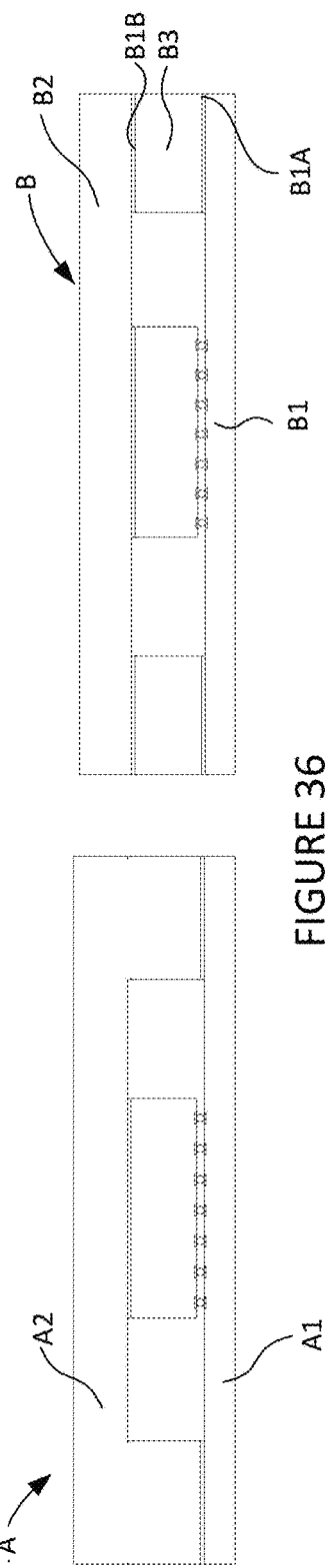
FIGURE 36

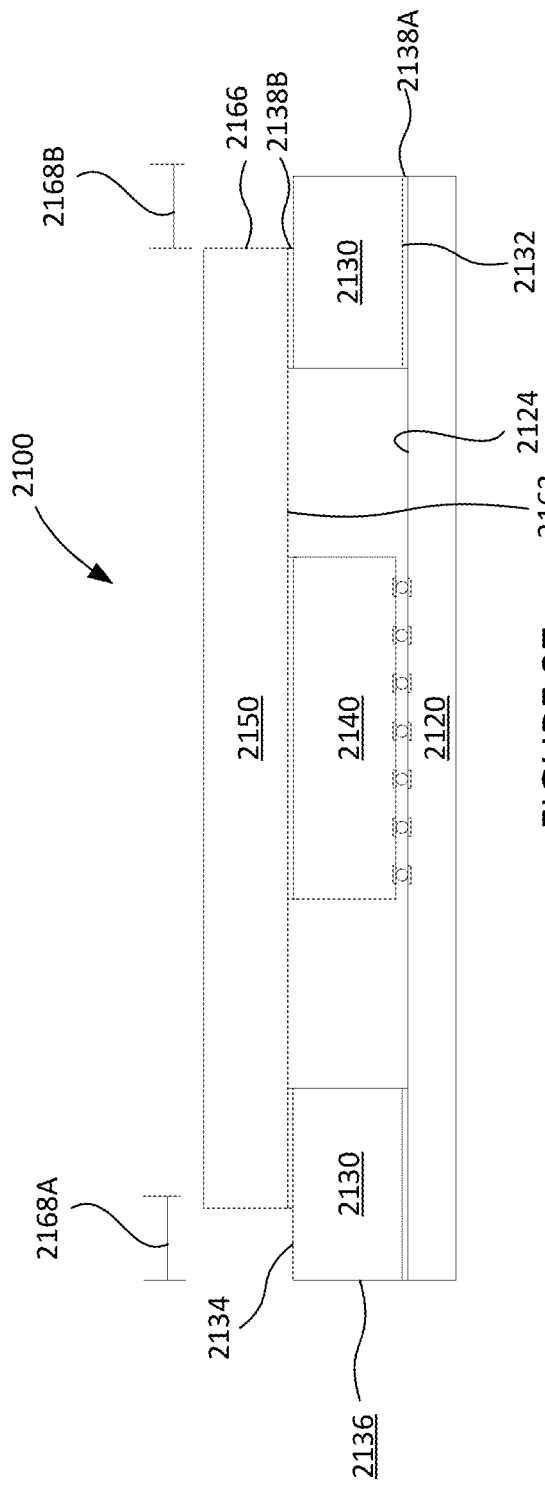
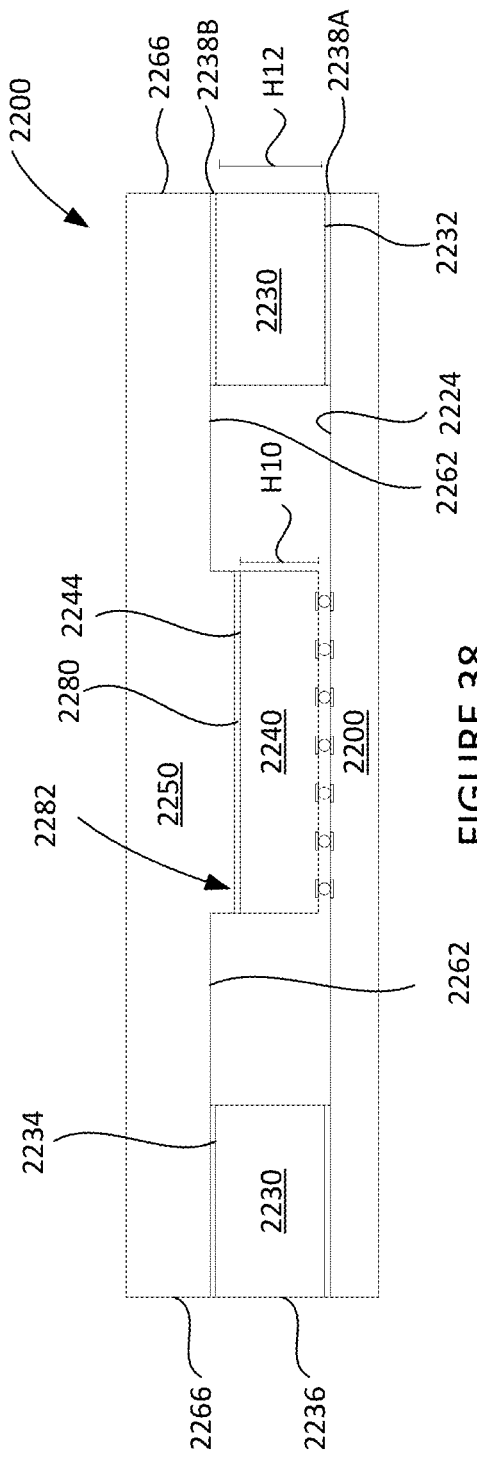

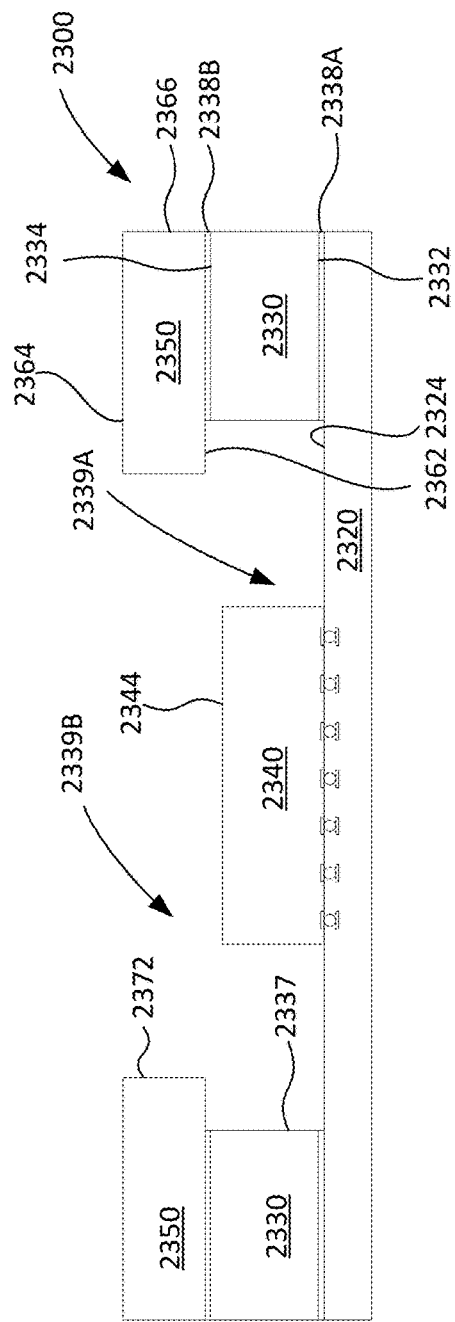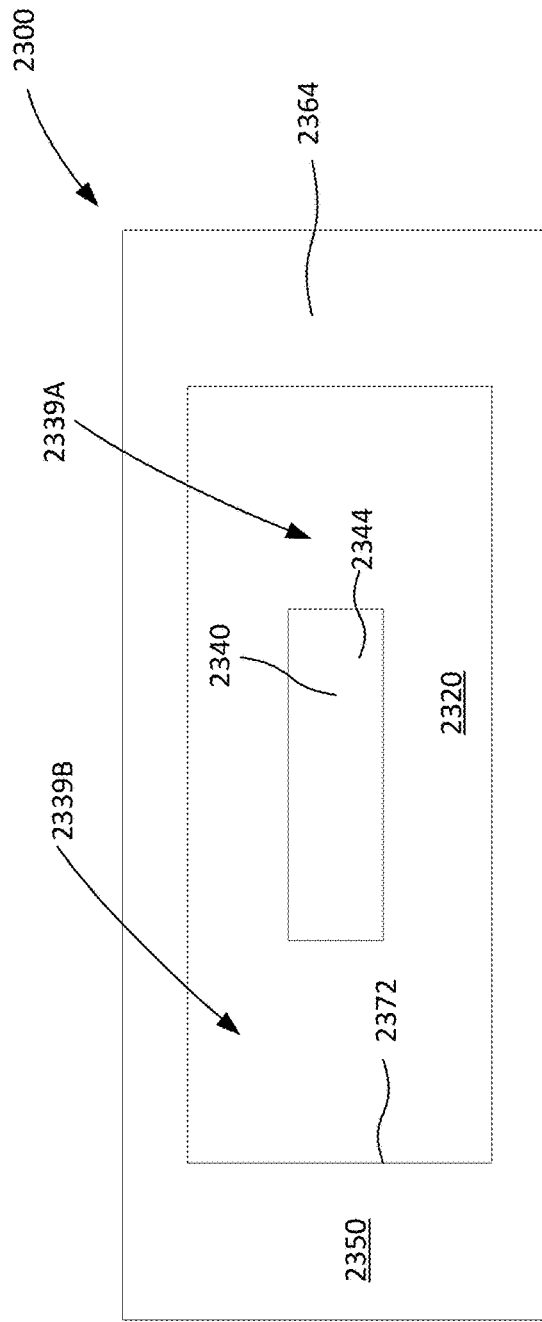

METHODS AND HEAT DISTRIBUTION DEVICES FOR THERMAL MANAGEMENT OF CHIP ASSEMBLIES

CROSS REFERENCE TO RELATED APPLICATIONS

The present application claims the benefit of the filing date of U.S. Provisional Patent Application No. 63/032,197, filed May 29, 2020, entitled Methods And Heat Distribution Devices For Thermal Management Of Chip Assemblies, and also claims the benefit of the filing date of U.S. Provisional Patent Application No. 63/066,550, filed Aug. 17, 2020, also entitled Methods And Heat Distribution Devices For Thermal Management Of Chip Assemblies, the disclosures all of which are hereby incorporated herein by reference.

BACKGROUND

This application relates to the field of electronics, and particularly thermal management and cooling of chip assemblies utilizing heat distribution devices, such as cold plates. Such heat distribution devices can be utilized within a microelectronic assembly to aid in the reduction of heat generated by microelectronic elements with the assembly, as well as heat generated by components external to the assembly.

In addition to industry standard chip packages, the exploration of special purpose silicon is expected to result in high power heat sources in servers. This technology may also be applied to graphics processing units ("GPUs") and custom application-specific integrated circuits ("ASICs"). Further, services such as imaging and artificial intelligence ("AI") will likely require large computer resources at a high density, with many servers in close proximity to one another. Data centers around the globe are being mandated to simultaneously increase energy efficiency, consolidate operations and reduce costs. These trends indicate that high performance cooling technologies that scale well with cooling cost and energy are needed, while enabling cooling for high density electronics.

Heat distribution devices are commonly used to cool and regulate the temperature of microelectronic elements, in a microelectronic assembly. Such heat distribution devices can include heat sinks, water blocks, cold plates, and the combination of one or more of these and other devices.

The coefficient of thermal expansion ("CTE") mismatch between the heat distribution device and other components in the chip assembly can stress the assembly when any one of these components expands at a different rate than other components due to temperature changes that occur during manufacture or use of the chip assembly. In typical assemblies, a one piece heat distribution device comprised of a single thermally conductive material can overlie the rear surface of the chip and also extend toward and be attached to the substrate. Due to the CTE mismatches between the substrate, the heat distribution device, and chip, cycling of the chip assembly through one or more reflow processes and operation of the chip assembly can further cause warpage of the substrate and/or chip, as well as other mechanical failure within the assembly.

BRIEF SUMMARY

The present application is directed to a microelectronic device assembly that includes a substrate, a microelectronic element electrically connected to the substrate, a stiffener element overlying the substrate, and a heat distribution device overlying the rear surface of the microelectronic element. The stiffener element may extend around the microelectronic element. The stiffener element may include a first material that has a first coefficient of thermal expansion ("CTE"). A surface of the stiffener element may face toward the heat distribution device. The heat distribution device may include a second material that has a second CTE. The first material may be different than the second material. The first CTE of the first material of the stiffener element may be greater than the second CTE of the second material of the heat distribution device.

The present application provides for a method of manufacturing a chip assembly that comprises joining an in-process unit to a printed circuit board; reflowing a bonding material disposed between and electrically connecting the in-process unit with the printed circuit board, the bonding material having a first reflow temperature; and then joining a heat distribution device to the plurality of semiconductor chips using a thermal interface material ("TIM") having a second reflow temperature that is lower than the first reflow temperature. The in-process unit further comprises a substrate having an active surface, a passive surface, and contacts exposed at the active surface; an interposer electrically connected to the substrate; a plurality of semiconductor chips overlying the substrate and electrically connected to the substrate through the interposer, and a stiffener overlying the substrate and having an aperture extending therethrough, the plurality of semiconductor chips being positioned within the aperture.

Aspects of the present disclosure provide for effectively cooling chip assemblies. For example, a method of manufacturing a chip assembly includes providing an in-process unit, and then bonding the in-process unit to a printed circuit board. A heat distribution device may be joined to the plurality of chips. The in-process unit can include a substrate that has a top surface and an opposed bottom surface. An interposer can be electrically connected to the substrate. A plurality of semiconductor chips may overlie the substrate and be electrically connected to the substrate through the interposer. A stiffener may overlie the substrate. Bonding the in-process unit to the printed circuit board can occur by reflowing a bonding material that joins contacts of the substrate with contacts of the printed circuit board. The joining of the heat distribution device to the plurality of chips can be accomplished using a high thermally conductive thermal interface material ("TIM"), the heat distribution device including a plurality of thermally conductive fins.

In one example, the heat distribution device may be a cold plate having a base and a lid coupled to the base. The method can further include joining the base of the cold plate to rear surfaces of the plurality of chips. The base of the cold plate can be further joined to a top surface of the stiffener. The lid can further be attached to the base of the cold plate. Additionally, an o-ring may be positioned within the base of the cold plate prior to coupling the lid of the cold plate to the base of the cold plate.

In another example, the stiffener may be spaced away from the heat distribution device.

In another example, a shim may be positioned within the stiffener to control bond line thickness. The shim may extend circumferentially around the plurality of semiconductor chips and may occupy a space within the recess of the stiffener.

In another example, prior to joining the heat distribution device to the rear surfaces of the semiconductor chips, the TIM may be provided on one of the rear surfaces of the semiconductor device or bottom surface of the heat distribution device. In one example, prior to joining the heat distribution device to the rear surfaces of the semiconductor chips, the TIM may be provided on rear surfaces of the semiconductor device. In another example, prior to joining the heat distribution device to the rear surfaces of the semiconductor chips, the TIM may be provided on a bottom surface of the heat distribution device.

In another example, the heat distribution device further comprises a plurality of thermally conductive fins. A first fin length of at least some of the thermally conductive fins is greater than a second fin length of remaining fins of the thermally conductive fins. A first height of at least one of the plurality of semiconductor chips is less than a second height of the other of the plurality of semiconductor chips. The at least some of the thermally conductive fins having a first fin length are positioned to overlie the at least one of the plurality of semiconductor chips having a first height.

In another example, joining the heat distribution device includes using an external compression device to apply pressure on the heat distribution device. The compression device may be a weight configured to overlie the heat distribution device during manufacturing of the chip assembly, and the weight may be applied to a top surface of the heat distribution device.

In another example, the compression device may include a rigid plate and springs at opposed ends of the rigid plate. The rigid plate may be positioned over a rear surface of the heat distribution device and secure the rigid plate to the printed circuit board.

In another example, the heat distribution device further includes an inlet and an outlet, and fluid connections may be provided to connect the inlets and outlets to a fluid so as to enable the introduction and ejection of fluid into and out of the heat distribution device.

Providing the in-process unit can further include providing a plurality of in process units. Providing a heat distribution device can further include providing a plurality of heat distribution devices. The method can further include bonding the plurality of in-process units to the printed circuit board by reflowing a bonding material that joins contacts of each of the substrates within the plurality of in-process units with contacts of the printed circuit board; joining a plurality of heat distribution devices to each of the plurality of chips in each of the plurality of in-process units by reflowing the high thermally conductive thermal interface material ("TIM"), each of the heat distribution devices including a plurality of thermally conductive fins, an inlet, and an outlet; and joining the inlet and outlet of each of the heat distribution devices to one another so that the inlets and outlets of one of the plurality of in-process units are in fluid connection with the inlets and outlets of another of the plurality of in-process units.

According to aspects of the disclosure, a microelectronic device assembly may include a printed circuit board, a substrate overlying and electrically connected to the circuit board, and a plurality of microelectronic devices electrically connected to the substrate. The chips may have an active surface facing toward the substrate and a passive surface facing away from the substrate. Cavities may be positioned within at least one of the plurality of microelectronic devices, and wherein the cavities are filled with a high thermally conductive material.

In one example, the high thermally conductive material may be flush or positioned below a rear surface of the at least one of the plurality of chips.

In another example, the high thermally conductive material extends beyond a rear surface of the at least one of the plurality of chips.

In another example, the microelectronic device assembly further includes a heat distribution device that includes a base and a lid. The base may further include thermally conductive fins, wherein a first material forming the cold plate is different than a second material forming the conductive fins.

According to aspects of the disclosure, a chip assembly includes a printed circuit board, a substrate, a plurality of chips, and a heat distribution device. The substrate may overlie and be electrically connected to the circuit board. A plurality of chips may be electrically connected to the substrate. Each of the plurality of semiconductor chips may have an active surface facing toward the substrate and a passive surface facing away from the substrate. A heat distribution device can include a plurality of fins. A length of at least some of the fins may be longer than a length of remaining fins. A height of at least one of the plurality of semiconductor chips is different than the other of the plurality of semiconductor chips. At least some of the fins overlie the at least one of the plurality of semiconductor chips.

According to an aspect of the disclosure, a method of manufacturing a chip assembly includes joining an in-process unit to a printed circuit board; reflowing a bonding material disposed between and electrically connecting the in-process unit with the printed circuit board; and then joining a heat distribution device to the plurality of semiconductor chips using a thermal interface material ("TIM"). The bonding material may have a first reflow temperature and the TIM may have a second reflow temperature that is lower than the first reflow temperature. The in-process unit may include a substrate, an interposer, a plurality of semiconductor chips, and a stiffener. The substrate may have an active surface, a passive surface, and contacts exposed at the active surface. An interposer may be electrically connected to the substrate. A plurality of semiconductor chips may overlie the substrate and be electrically connected to the substrate through the interposer. The stiffener may overlie the substrate and have an aperture that extends therethrough. The plurality of semiconductor chips may be positioned within the aperture.

In one example, the heat distribution device is a cold plate having a base and a lid. The method further includes joining the base and the lid together, and then joining the base to rear surfaces of the chips.

In another example, prior to joining the heat distribution device to rear surfaces of the plurality of semiconductor chips, the TIM is provided on rear surfaces of the semiconductor chips.

In another example, prior to joining the heat distribution device to rear surfaces of the plurality of semiconductor chips, the TIM is provided on a bottom surface of the heat distribution device. Additionally, the TIM may include a solder.

In another example, during reflow a compression device applies pressure to the heat distribution device. The compression device can be a weight configured to overlie the heat distribution device during the manufacture of the chip assembly and the method can further include applying the weight to a top surface of the heat distribution device. Alternatively or additionally, the compression device may be a rigid plate and include springs at opposed ends of the rigid plate. The method can further include positioning the rigid plate over a rear surface of the heat distribution device and securing the rigid plate to the printed circuit board.

In another example, the heat distribution device may be a cold plate that includes a base and a lid. The method can further include joining the base of the cold plate to rear surfaces of the plurality of semiconductor chips prior to attaching the lid to the base. Additionally, the method can further include joining the base of the cold plate to a top surface of the stiffener. The lid can further include an inlet and an outlet, and the method can further include providing fluid connections to connect the inlets and outlets to a fluid source so as to enable introduction and ejection of fluid into and out of the heat distribution device.

The reflowing the bonding material can include reflowing the bonding material disposed between the substrate and the printed circuit board. The heat distribution device can include a base, thermally conductive fins extending from at least a portion of the base, and a lid, wherein the base is comprised of a material having a thermal conductivity greater than 394 $W/m^2$, and at least one of the lid and the thermally conductive fins is comprised of a material having a thermal conductivity of 394 $W/m^2$ or less. In another example, the base is comprised of a material having a thermal conductivity greater than 400 $W/m^2$, and at least one of the lid and the thermally conductive fins is comprised of a material having a thermal conductivity of 400 $W/m^2$ or less.

In another example of this aspect, the joining the in-process unit can further include providing a plurality of in-process units, and providing a heat distribution device can further include providing a plurality of heat distribution devices. The method can further include bonding the plurality of in-process units to the printed circuit board by reflowing a bonding material that joins contacts of each of the substrates within the plurality of in-process units with contacts of the printed circuit board; joining a plurality of heat distribution devices to each of the plurality of semiconductor chips in each of the plurality of in-process units by reflowing the high thermally conductive thermal interface material ("TIM"), each of the heat distribution devices comprising a plurality of thermally conductive fins, an inlet, and an outlet; and joining the inlet and outlet of each of the heat distribution devices to one another so that the inlet and outlet of one of the plurality of in-process units are in fluid connection with the inlet and outlet of another heat distribution device of the plurality of in-process units.

According to another aspect of the disclosure, a microelectronic assembly includes a substrate, a plurality of semiconductor chips overlying the substrate, a heat distribution device, a thermally conductive material, and a printed circuit board. The substrate includes an active surface, a passive surface, and contacts exposed at the active surface. The heat distribution device includes a base, thermally conductive fins extending upwardly from the base, and a lid overlying and at least partially enclosing the fins within the base. At least the base is formed from a first material has a first thermal conductivity greater than 394 $W/m^2$. At least one of the lid and the thermally conductive fins is formed from a second material having a second thermal conductivity of less than 394 $W/m^2$ or less. A thermally conductive material may be disposed between the heat distribution device and the plurality of semiconductor chips. The coefficient of thermal expansion of at least one of the plurality of semiconductor chips and the base are substantially similar or identical. A printed circuit board may be electrically connected to the substrate. In another example, at least the base is formed from a first material that has a first thermal conductivity greater than 400 $W/m^2$, and at least one of the lid and the thermally conductive fins is formed from a second material having a second thermal conductivity of less than 400 $W/m^2$ or less.

In one example, the thickness of the TIM may be 200 microns or less.

In one example of this aspect, the thermally conductive fins are formed from the second material.

In another example, the lid may be formed from the second material

In still another example, both the lid and the thermally conductive fins are formed from the second material.

In another example, the lid and the thermally conductive fins are formed from the first material. Additionally, the first material may include silver diamond.

According to another aspect of the disclosure, a microelectronic device assembly includes a substrate and a plurality of microelectronic elements connected to the substrate. The microelectronic elements may include an active surface facing toward the substrate and a passive surface facing away from the substrate. One or more cavities may extend through at least one surface of the plurality of microelectronic elements, and the one or more cavities may be filled with a thermally conductive material to dissipate heat from the plurality of microelectronic elements.

In one example, the thermally conductive material may be flush or positioned below the at least one surface of the at least one of the plurality of microelectronic elements.

In another example, the thermally conductive material may extend beyond the at least one surface of the plurality of microelectronic elements.

In still another example, the assembly further includes a heat distribution device having a base and a lid. The base may further include thermally conductive fins. A first material forming the heat distribution device may be different than a second material forming the conductive fins.

According to another aspect of the disclosure, a chip assembly includes a substrate, a plurality of semiconductor chips electrically connected to the substrate and a heat distribution device joined to the plurality of semiconductor chips. Each of the plurality of semiconductor chips may have an active surface facing toward the substrate and a passive surface facing away from the substrate. The heat distribution device may include a plurality of thermally conductive fins. A first fin length of at least some of the thermally conductive fins may be greater than a second fin length of remaining fins. A first height of at least one of the plurality of semiconductor chips may be less than a second height of the other of the plurality of semiconductor chips. The at least some of the thermally conductive fins having a first fin length overlie the at least one of the plurality of semiconductor chips having the first height.

In one example, the heat distribution device may include a base overlying the plurality of semiconductor chips, and the plurality of thermally conductive fins extend away from the base.

In another example, at least some of the outermost tips of the thermally conductive fins are aligned with one another.

In another example, the base of the heat distribution device extends across rear surfaces of the plurality of semiconductor chips.

In still another example, the assembly may further include a printed circuit board electrically connected to the plurality of semiconductor chips.

In yet another example, the plurality of semiconductor chips includes the at least one of the plurality of chips and two directly adjacent chips positioned on opposed sides of the at least one of the plurality of chips. A bottom surface of the base may include a protrusion that extends adjacent a top surface of the at least one chip to accommodate a differing height of the at least one of the plurality of semiconductor chips.

According to another aspect, a method of assembling a cooling loop assembly to an in-process unit includes joining a plurality of in-process units to a circuit board; joining a plurality of heat distribution devices to corresponding ones of the plurality of in-process units, where each of the plurality of heat distribution devices includes an inlet and an outlet; and bonding a cooling loop assembly to the inlet and outlet of each of the plurality of heat distribution devices. Each in-process unit may include a substrate and at least one microelectronic element electrically connected to the substrate, where the microelectronic element may have an active front surface facing toward the substrate and an opposed rear surface facing away from the substrate. The cooling loop assembly may include a network of fluid lines connected to each inlet and each outlet.

In one example, the plurality of heat distribution devices may be joined to the corresponding plurality of in-process units prior to the bonding of the cooling loop assembly to each of the heat distribution devices. Additionally, each of the plurality of heat distribution devices may include a base and a lid. The inlets and outlets of each of the heat distribution devices may extend from the lid. The base of each of the plurality of heat distribution devices may be joined to the corresponding one of the plurality of in-process units prior to the lid of each of the plurality of the heat distribution devices and the bonding of the cooling loop assembly. Additionally, a bottom surface of each base of each of the plurality of heat distribution devices may be attached to a rear surface of the at least one microelectronic element of the corresponding ones of the plurality of in-process units. Additionally, a thermal interface material can be used to join the bottom surface of the base to the rear surface of at least one microelectronic element of each of the plurality of in-process units.

According to another example, the plurality of in-process units may each further include a stiffener overlying the substrate and extending around at least a portion of the at least one microelectronic element of each of the plurality of in-process units. The joining of the heat distribution device can further include joining the bottom surface of the base to the stiffener.

In another example, the cooling loop assembly may be joined to the inlet and outlet of each respective heat distribution device, prior to the joining of the lid to the base.

According to another example, the cooling loop assembly may be joined to the inlet and outlet of each of the heat distribution devices by one of a British Standard Pipe Parallel thread fitting, a barb, or brazing.

According to another example, the heat distribution device may be attached to the in-process unit prior to the joining of the cooling loop assembly to the heat distribution device.

According to another example, the in-process unit further includes an interposer electrically connected to the substrate. The at least one semiconductor chip may overlie the substrate and may be electrically connected to the substrate through the interposer.

According to another example, the at least one microelectronic element of at least one in-process unit of the plurality of in-process units comprises a plurality of microelectronic elements, and at least one of the plurality of microelectronic elements has been thinned so as to have a different height than at least one other of the plurality of microelectronic elements. A shape of the heat distribution device may be configured to accommodate the different height of the thinned microelectronic element.

According to an aspect of the disclosure, an example microelectronic device assembly includes a substrate, a microelectronic element electrically connected to the substrate, a stiffener element overlying the substrate, and a heat distribution device overlying the rear surface of the microelectronic element. The microelectronic element may have an active surface facing toward the substrate and a rear surface facing away from the substrate. The stiffener element may extend around the microelectronic element. The stiffener element may include a first material that has a first coefficient of thermal expansion ("CTE"). A surface of the stiffener element may face toward the heat distribution device. The heat distribution device may include a second material that has a second CTE. The first material may be different than the second material. The first CTE of the first material of the stiffener element may be greater than the second CTE of the second material of the heat distribution device.

According to an example of this aspect, the assembly may further include a first adhesive that joins the stiffener element to the substrate, and a second adhesive that joins the stiffener element to the heat distribution device. The first adhesive may have a first modulus of elasticity that is different than a second modulus of elasticity of the second adhesive. Additionally, the first modulus of elasticity of the first adhesive may be greater than the second modulus of elasticity of the second adhesive. Further, the first modulus of elasticity may range from 10 MPa to 100 MPa, and the second modulus of elasticity may range from 0.10 MPa to 10 MPa. The first and second modulus of elasticity differ.

According to another example of this aspect, the first CTE of the first material may be at least 50 percent greater than the second CTE of the second material of the heat distribution device. Furthermore, in some examples, the first CTE may be at least 17 ppm/WK at 20° C.

According to yet another example of this aspect, the first material of the stiffener element further includes a first thermal conductivity, and the second material of the heat distribution device may include a second thermal conductivity. The second thermal conductivity of the second material may be less than the first thermal conductivity of the first material. Additionally, in some examples, the first thermal conductivity may be greater than 394 W/mK at 20° C.

According to another example of this aspect, the first material may include copper. Alternatively, the second material may include silver diamond (AgD).

According to an example of this aspect, the first material comprises copper and the second material comprises AgD (silver diamond).

According to another example of this aspect, the stiffener element and the heat distribution device may be independent structures coupled together. Additionally, the heat distribution device may include a planar surface extending across an entire surface of the stiffener element and an entire rear surface of the microelectronic element.

According to yet another example of this aspect, the heat distribution device includes a top surface, an opposed bottom surface, and an edge surface extending therebetween. The surface of the stiffener may be a top surface facing toward the bottom surface of the heat distribution device. An opposed bottom surface of the stiffener may face toward the substrate. An edge of the stiffener may extend between the top and bottom surfaces of the stiffener.

Additionally, the heat distribution device may be laterally spaced away from the edge of the stiffener element. Alternatively, the edge of the heat distribution device may be vertically aligned with the edge of the stiffener element. In yet another alternative example, the edge of the heat distribution device may be an internal edge that extends around an aperture.

Additionally, according to another example of this aspect, where the edge of the heat distribution device may be an internal edge that extends around an aperture, the aperture may be a first aperture. The edge of the stiffener may be an internal stiffener edge extending around a second aperture of the stiffener. The internal edge of the heat distribution device may extend beyond the internal stiffener edge of the stiffener element, such that the first and second apertures are aligned.

In accordance with another aspect of the disclosure, an example microelectronic device assembly includes a substrate, a microelectronic element that is electrically connected to the substrate, a heat distribution device overlying the substrate, a heat distribution device overlying rear surfaces of the microelectronic element, and a thermally conductive interface material joining the heat distribution device to the rear surface of the microelectronic element. The microelectronic element may have an active surface facing toward the substrate and a passive surface facing away from the substrate. The stiffener element may extend around the microelectronic element. The stiffener element may have a first CTE and the heat distribution device may have a second CTE. The heat distribution device may be comprised of a first material that is different than a second material comprising the stiffener element. The first CTE may be at least 50% greater than the second CTE.

According to another example of this aspect, the assembly may further include a first adhesive joining the stiffener element to the substrate, and a second adhesive joining the stiffener element to the heat distribution device. The first adhesive has a different modulus of elasticity than the second adhesive. Additionally, the modulus of elasticity of the second adhesive may be less than the modulus of elasticity of the first adhesive.

In one example of this aspect, the first material of the stiffener element has a first thermal conductivity and the second material of the heat distribution device has a second thermal conductivity, the second thermal conductivity of the heat distribution device being greater than the first thermal conductivity of the stiffener element.

In another example of this aspect, the heat distribution device is comprised of silver diamond and the stiffener element is comprised of copper.

In another example of this aspect, the heat distribution device includes a planar surface extending across an entire rear surface of the stiffener element and the microelectronic device.

In yet another example, the heat distribution device includes a top surface and an opposed bottom surface, and an edge surface extending therebetween. The stiffener element includes a top surface facing toward the bottom surface of the heat distribution device, an opposed bottom surface, and an edge surface extending between the top and bottom surfaces. The edge of the heat distribution device is laterally spaced away from the edge of the stiffener element.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing.

FIG. 3B-1 is a perspective view of another example component of the chip assembly of FIG. 1.

FIG. 3B-2 is an enlarged portion of the example component of FIG. 3B-1.

FIGS. 12A-12H are an example method of manufacturing the chip assembly of FIG. 1.

FIG. 12H-1 is an alternative assembly method of manufacturing the chip assembly of FIG. 1.

FIG. 23A is an exploded view of example components of an example cooling assembly prior to being bonded with an example chip package, according to aspects of the disclosure.

FIG. 24B is an exploded view of example components of an example cooling assembly prior to being bonded with an example chip package, according to aspects of the disclosure.

FIG. 26 is a chart providing results of simulations.

FIG. 36 is an example chart showing substrate warpage comparison and corresponding devices.

FIG. 37 is an example schematic assembly according to aspects of the disclosure.

FIG. 38 is an example schematic assembly according to aspects of the disclosure.

FIG. 39 is an example schematic assembly according to aspects of the disclosure.

FIG. 40 is a top plan view of the example schematic assembly in FIG. 39.

DETAILED DESCRIPTION

Overview

Figure 1:
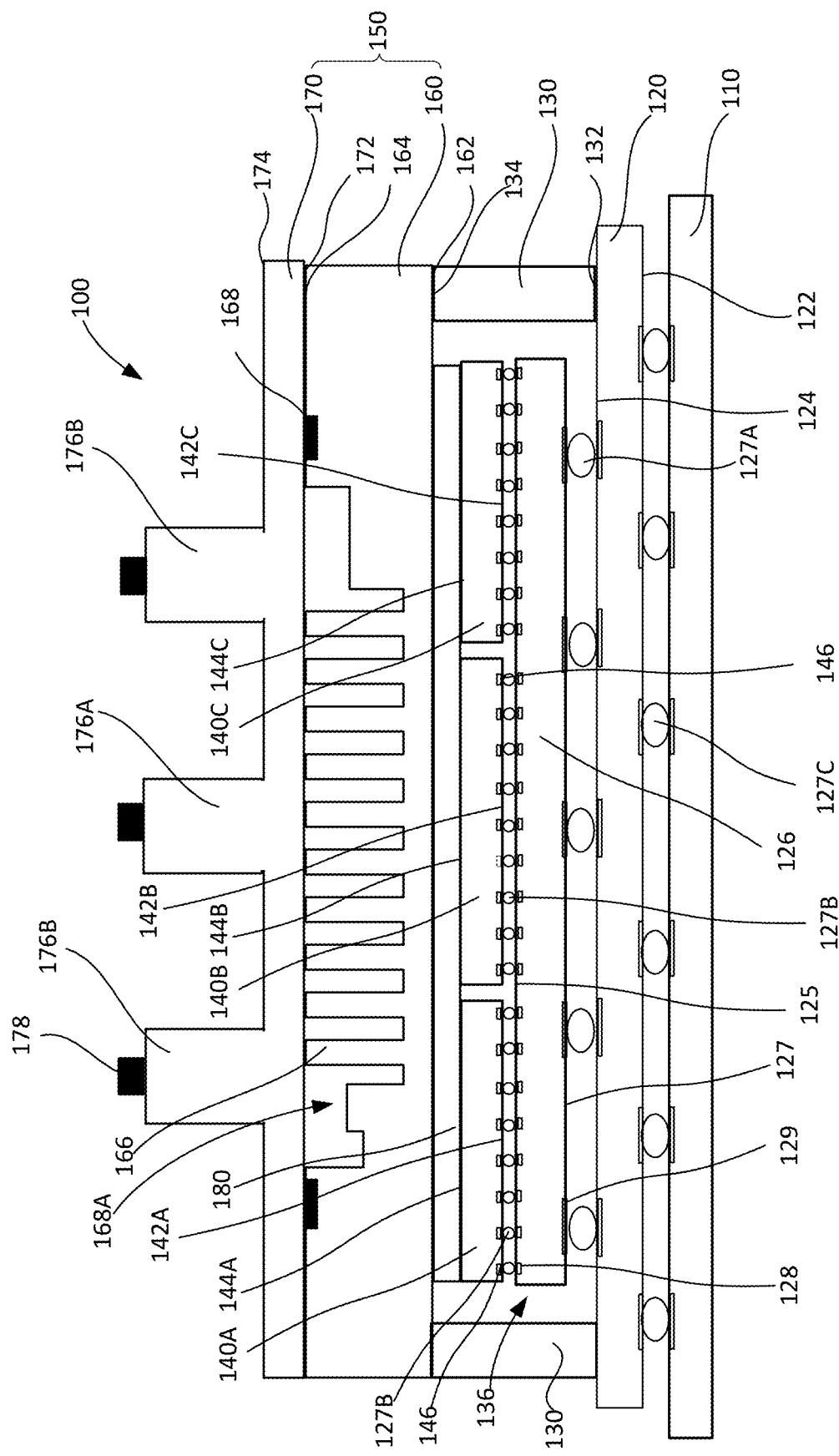
FIG. 1 is a schematic cross-sectional view of an example chip assembly according to aspects of the disclosure.

Aspects of the disclosure disclose chip assemblies that incorporate heat distribution devices, such as cold plates, that are bonded to chips using high thermally conductive materials and optimized methods of manufacture. Additionally, structures and methods disclosed herein allow for greater control of bond line thickness, which is essential for controlling heat generated by high power devices.

Heat generated by individual chips can further result in hot spots created at central portions of a chip, which can be difficult to access, especially when multiple chips are provided in an array. Aspects of the disclosure address the increased heat by the thinning of one or more portions of a chip and/or modifying the structure of the heat distribution device to accommodate the change in size of the chip. In one example, the bottom surface of the heat distribution device is adapted to accommodate the differing thicknesses of one or more chips that may have been thinned. The heat distribution device may include one or more protrusions extending from its bottom surface that can overlie and be in closer proximity to a chip that may be thinner than adjacent chips. This can improve the effectiveness of the heat distribution device. In another example, the die or chip can be thinned by providing a plurality of cavities in the rear surface of the die or chip. The cavities can be filled with high thermally conductive ("K") material for enhanced heat distribution. In another example, the plurality of cavities remains open and can be occupied by extended heat fins from a cold plate.

The material or combination of materials selected to manufacture the cold plate can further enhance the thermal conductivity and performance of a heat distribution device within a chip assembly. According to another aspect of the disclosure, an ultra-high thermally conductive material can be selected to form one or more portions of the heat distribution device. For example, the base or the fins of a heat distribution device may be formed from an ultra-high thermally conductive material, such as silver diamond.

A stiffener and a heat distribution device that extend across rear surfaces of the microelectronic element may be used in the chip assembly to enhance thermal conductivity and warpage control. This configuration can replace a one-piece and u-shaped heat distribution device that both extends around and along the rear surface of the chip assembly, that is directly attached to the substrate, and that is made from a single material, such as only copper. This configuration can similarly be used in place of a two-piece structures formed from the same material. Further, use of a select combination of materials for the heat distribution device and stiffener, alone or in combination with selected adhesives, can further optimize the thermal conductivity and warpage control within the chip assembly. For example, the adhesive used to join stiffener with substrate may have a modulus of elasticity that differs from the modulus of elasticity of a second adhesive used to join the stiffener with the heat distribution device. In one example, selection of silver-diamond (e.g., AgD) as a high thermally conductive material for the heat distribution device, and copper (e.g., Cu, Cu-OFE, CuOHF) for the stiffener can achieve enhanced thermal conductivity and warpage control. Better bond-line thickness control of the thermal interface materials can also be achieved using such combination. Additionally, use of copper to form the stiffener saves on the cost of forming a monolithic heat distribution device formed entirely of high-cost silver diamond material or other ultra-high conductive material.

It is to be appreciated that examples of microelectronic elements can include microelectronic chips, semiconductor chips, non-semiconductor chips, MEMs, ASICs, and the like. Further the discussion of the heat distribution devices herein will often be made in reference to a "chip(s)," but it is to be appreciated that the heat distribution devices disclosed herein are not limited to use with a chip, or any particular type of chip, and can encompass any microelectronic element or device that can benefit from a heat distribution device.

Example Packages

FIG. 1 illustrates a schematic cross-sectional view of a microelectronic element assembly 100 according to aspects of the disclosure. In this example, assembly 100 is supported by a printed circuit board 110, as well as a substrate 120 that overlies printed circuit board 110. The active front surfaces 142A, 142B, 142C of respective chips 140A, 140B, 140C may face toward and be joined in a ball grid array to substrate 120. Metallization (not shown) can also be provided on rear surfaces 144A, 144B, 144C of chips 140A, 140B, 140C. Chips 140A, 140B, 140C may be electrically interconnected with substrate 120 through an interposer 126, but as will be shown in other examples herein, an interposer is not required. Bonding material, such as solder balls 127B, may be used to electrically interconnect chips 140A, 140B, 140C with interposer 126, and bonding material, such as solder balls 127A, may be used to electrically interconnect and join interposer 126 with substrate 120. A cold plate 150 overlies rear surfaces 144A, 144B, 144C of respective chips 140A, 140B, 140C, and a stiffener 130 extends between bottom surface 162 of base 160 of cold plate 150 and top surface 124 of substrate 120. Bottom surface 122 of substrate 120 may be joined to another device, such as a printed circuit board 110, through another set of solder balls 127C.

Figure 2:
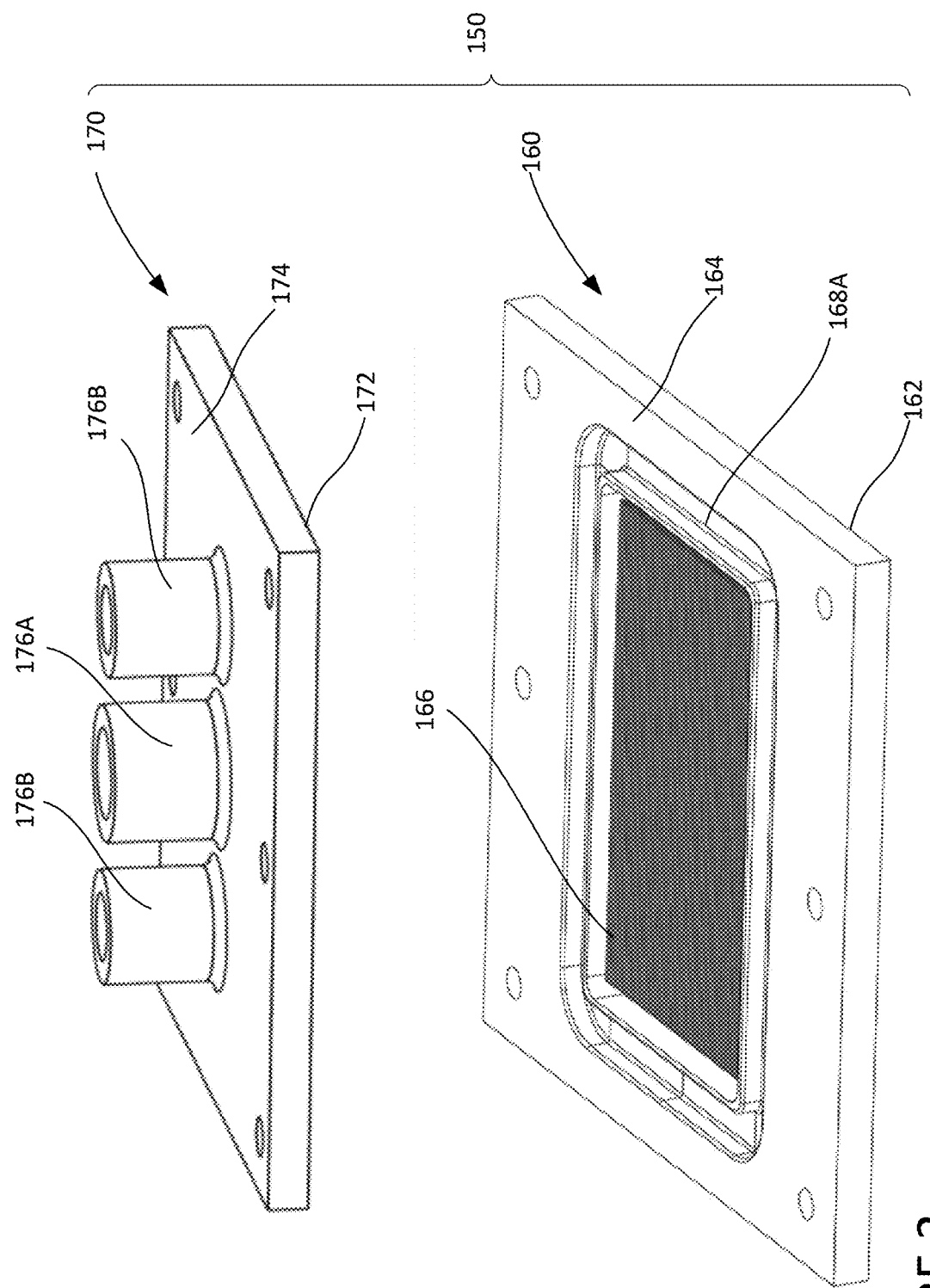
FIG. 2 is a perspective view of example components of the chip assembly of FIG. 1.

Cold plate 150 may include two components: a cold plate base 160 and a cold plate lid 170 that are joined together. With reference to FIGS. 2 and 3, an example base 160 and lid 170 are shown. Base 160 may include a bottom surface 162 and an opposed top surface 164. Similarly, lid 170 may include a bottom surface 172, and an opposed top surface 174 from which an inlet 176A and two outlets 176B may extend. In other examples, the configuration of inlets and outlets can vary, such as there being two outlets directly adjacent to one another, or two inlets and one outlet, or any desired configuration of inlets and outlets. Base 160 and lid 170 may be manufactured using molding, machining, and similar processes.

Base 160 may include a plurality of thermally conductive fins 166, which help to facilitate cooling of assembly 100, as well as a recess 168A extending around fins 166. Fins may be longitudinal structures extending away from a surface of the base, such as those known in the art. The fins may be integrally formed with the base or may be attached to the base by soldering, adhesive or the like. In this example, fins 166 are integrally formed with the base.

Lid 170 overlies base 160, such that bottom surface 172 of lid 170 is directly adjacent top surface 164 of base 160. Although not required and as shown in FIG. 1, O-rings 168 may be provided within recess 168A so as to form a seal between base 160 and lid 170. When joined together, base 160 and lid 170 enable fluids and gases to pass into cold plate 150 through inlet 176A, and out of cold plate 150 through outlets 176B. Additional O-rings 178 (FIG. 1) may also be provided adjacent inlets 176A and outlets 176B to provide a seal between inlet 176A and outlets 176B and the components which may be connected to them.

Base 160 and lid 170 may be formed from known heat dissipating materials, such as aluminum, copper, silver, and metal alloys. In this example, base 160 and lid 170 are formed from the same material, but in other examples, and as will be discussed in more detail below, the material comprising the base and the lid may differ.

Figure 3A:
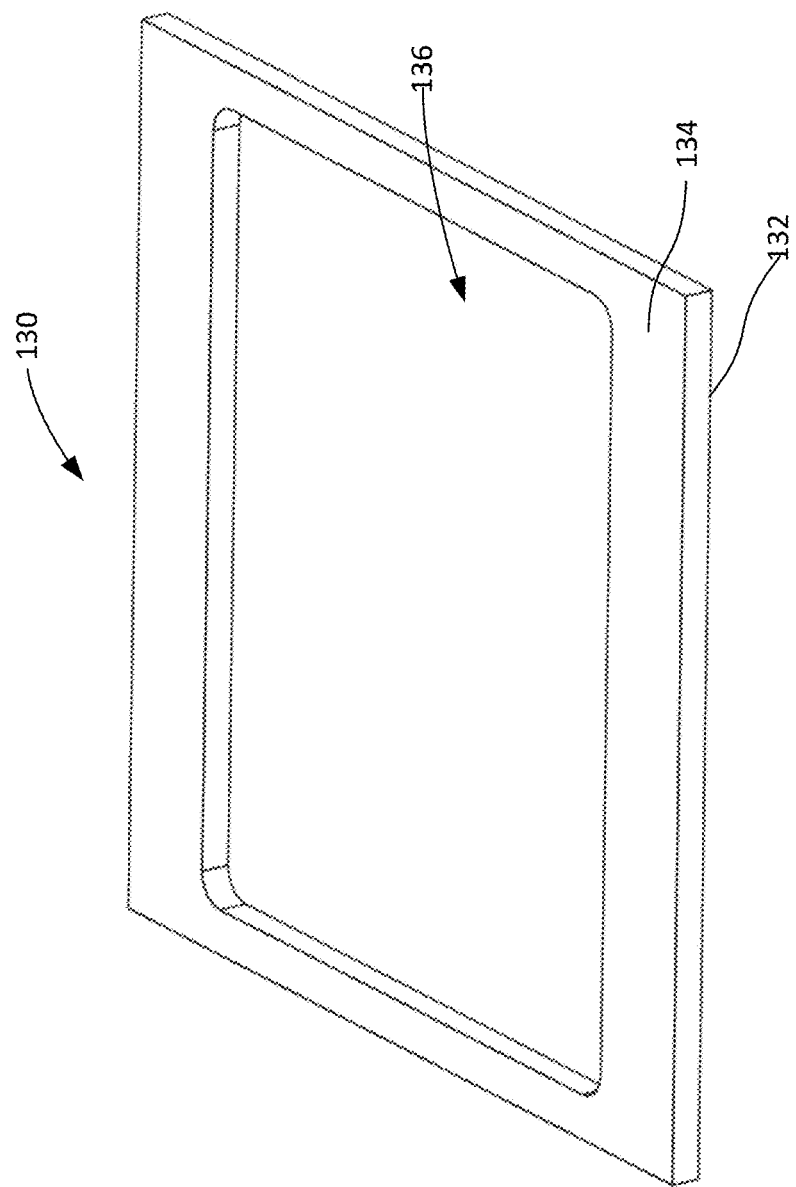
FIG. 3A is a perspective view of an example component of the chip assembly of FIG. 1.

With reference to FIGS. 1 and 3A, a stiffener ring, such as stiffener 130 may extend circumferentially around chips 140A, 140B, and 140C. Stiffener 130 includes a bottom surface 132, an opposed top surface 134, and an aperture 136 extending through the top and bottom surfaces 132, 134. The bottom surface 132 of stiffener 130 can be attached to the top surface 124 of substrate 120, and the top surface 134 of stiffener 130 can be attached to the bottom surface 162 of cold plate base 160 with a bonding material (not shown), such as an adhesive. Aperture 136 may be generally central with respect to an outer perimeter of stiffener 130, though in other examples the position of aperture 136 may be adjusted. For example, the size and shape and position of aperture 136 may be adapted based on circuitry of the underlying substrate 120 to be exposed through aperture 136 or the arrangement of chips 140A, 140B, 140C and interposer 126 within aperture 136.

Stiffener 130 can be comprised of various materials. In one example, stiffener is formed from copper and is later plated with electroless nickel (or similar metal to promote adhesion) to substrate 120.

Figures 1, 3B:
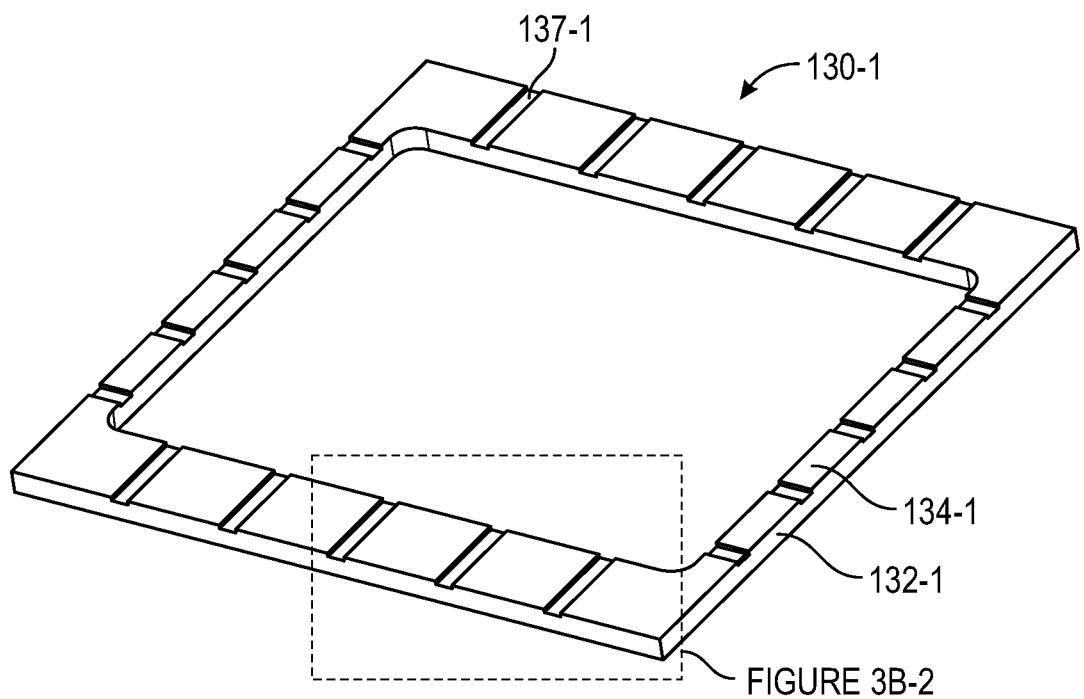
Figures 2, 3B:
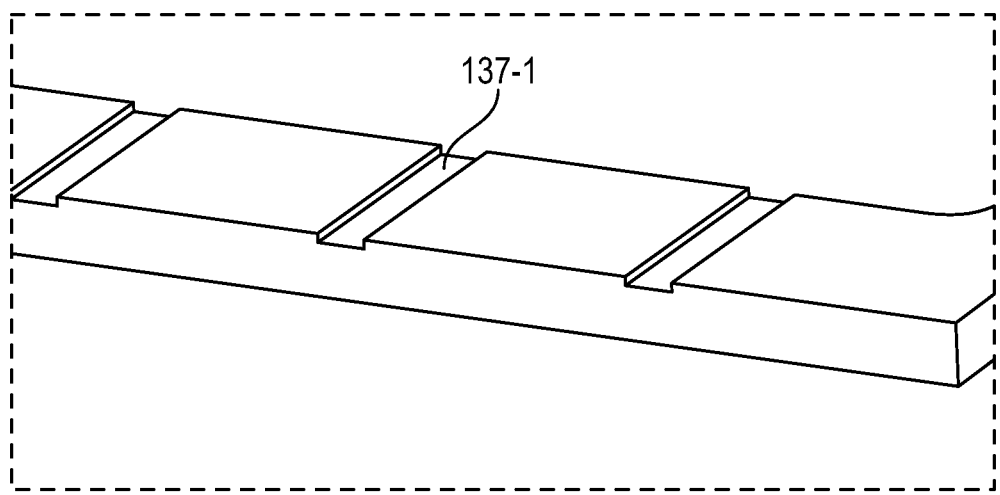
Figure 3C:
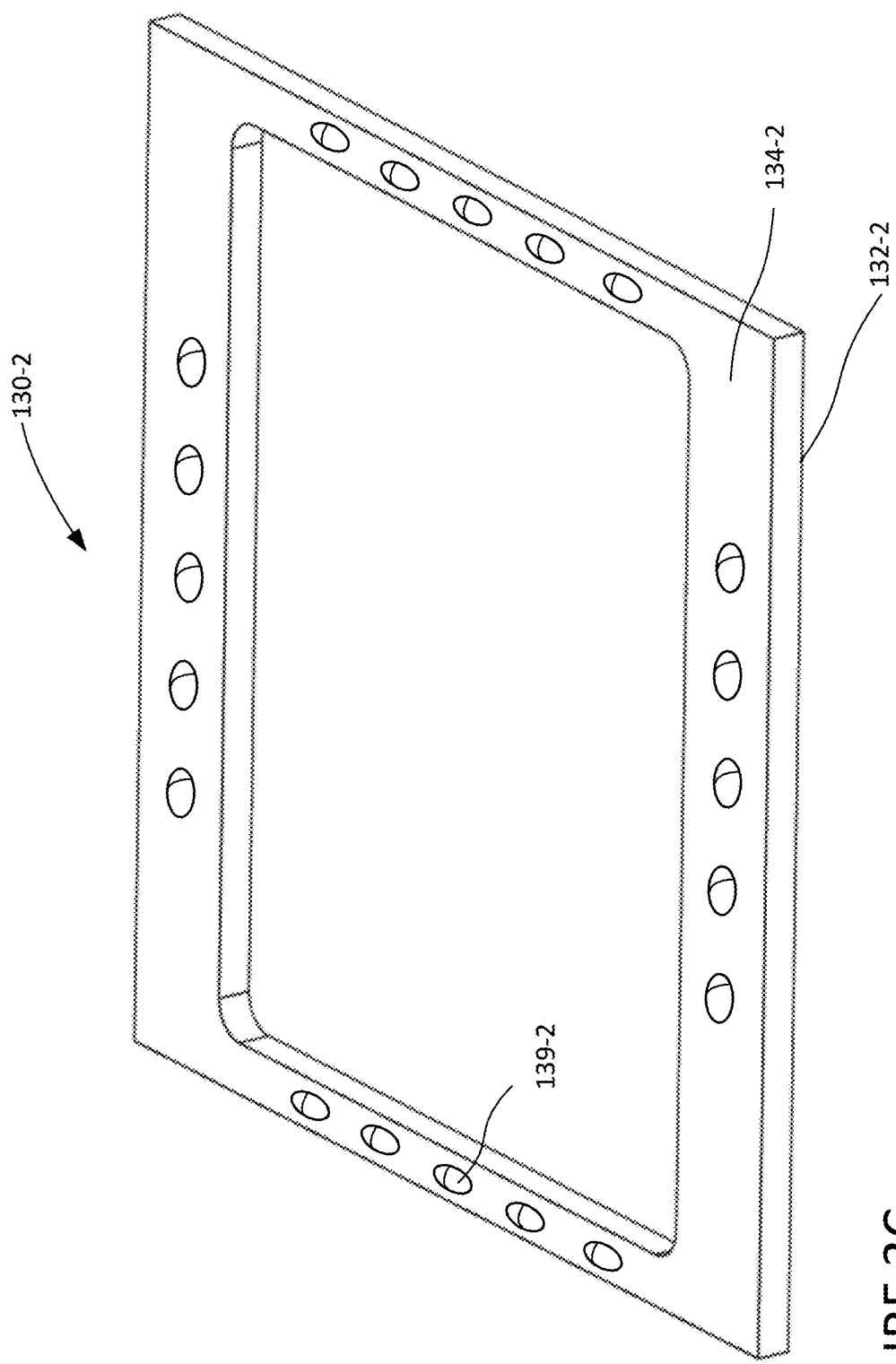
FIG. 3C is a perspective view of another example component of the chip assembly of FIG. 1.

The stiffener can be further modified to provide ridges 137-1 extending along at least one edge of stiffener 130-1. For example, FIGS. 3B-1 and 3B-2 illustrate ridges 137-1 extending around all four edges of stiffener 130-1, as well as partially between top surface 134-1 and opposed bottom surface 132-1. The ridges 137-1 allow for gas egress during the reflow process. The stiffener 130-1 can instead include apertures that extend fully through the thickness of the stiffener along at least one edge of the stiffer. For example, FIG. 3C illustrates apertures 139-2 extending around all four edges of stiffener 130-2, and between the top and bottom surfaces 134-2, 132-2, although any number of apertures can extend around one or more edges.

With reference back to FIG. 1, a thermal interface material ("TIM") with high thermal conductivity ("k") may be used to join or couple cold plate 150 directly to chips 140A, 140B, and 140C. In this example, bottom surface 162 of base 160 of cold plate 150 is directly joined to rear surfaces 144A, 144B, 144C of respective chips 140A, 140B, 140C through use of TIM 180. TIM 180 may be a high k TIM, which can also be a low melting temperature metal, including metal or graphite, such as Nano Ag or Indium, but other high k TIM materials may be implemented. Thus, direct soldering is one example for directly joining cold plate 150 to chips 140A, 140B, 140C. Additionally, in some implementations, it may be desired to use an ultra-high material for TIM, as will be discussed herein. However, the methods and structures disclosed herein can also be utilized with a low k TIM, with reduced levels of thermal conductivity.

TIM may be provided in any desired form, such as liquid, solid, semi-solid, and the like. For example, a TIM can be applied in liquid form, which will later cure and remain as a soft elastomer. In other examples, TIM can be a grease, film, or solder.

Interposer 126 may be a conventional interposer configured to provide an electrical interface routing between bond pads 146 of chips 140A-140C and contacts 128 disposed at the surface of the substrate 120 to which chips 140A-140C are attached. It is to be appreciated that throughout the disclosure, contacts at the surface, disposed at the surface, or exposed at the surface of the substrate is understood to mean having a surface exposed for an electrical interconnection. The contact itself may be partially above or below the surface of the substrate, may be fully disposed at the top surface of the substrate, or any configuration of contacts that allows for an electrical interconnection. Interposer 126 may include contacts 128 at its top surface 125, contacts 129 at its bottom surface 127, and conductive vias (not shown) extending between the top and bottom surfaces. Bond pads 146 of the chips 140A-140C may be directly joined and soldered to contacts at the interposer in a ball grid array pattern. Bond pads of chips 140A-140C will be conductively connected to contacts on substrate 120 through the conductive vias.

Interposer may be bonded to a printed circuit board 110 using an array of solder balls 127C. Solder balls may be first applied to either interposer 126 or contacts of printed circuit board 110. The printed circuit board may be any known circuit board adapted for use alone or in connection with another device. In some examples, the printed circuit board may be a server tray.

Figure 4:
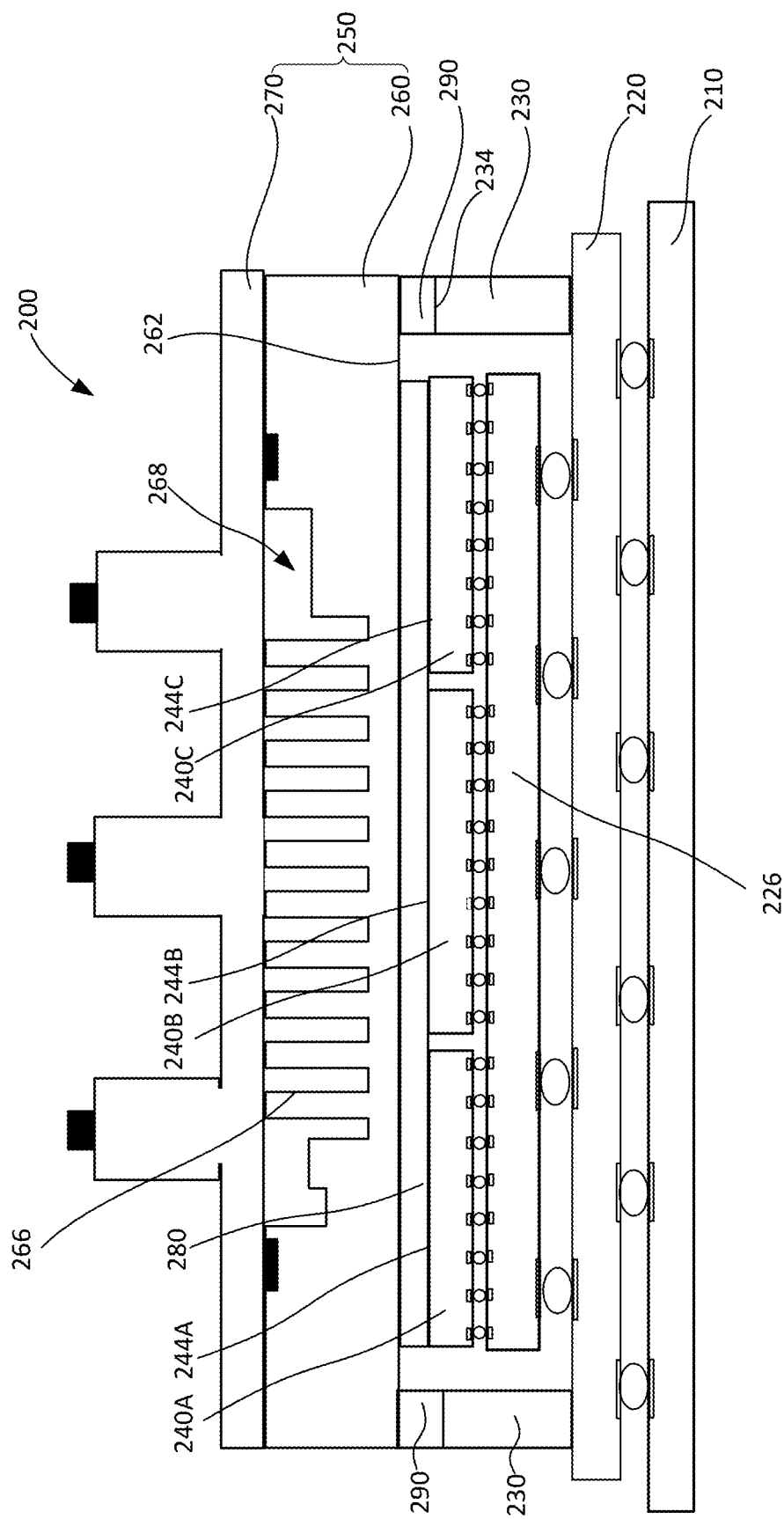
FIG. 4 is a schematic cross-sectional view of an example chip assembly according to aspects of the disclosure.

FIG. 4 is another example assembly 200 which is identical to FIG. 1, except that it further includes springs 290 overlying stiffener 230. As shown, assembly 200 includes a substrate 220 and chips 240A, 240B, and 240C electrically connected with the substrate 220 through interposer 226, all of which are attached to a printed circuit board 210. A cold plate 250 is provided within the assembly to distribute heat generated by chips 240A, 240B, 240C. Cold plate 250 further includes a base 260 and a lid 270. Base 260 may include a recess 268 and fins 266 provided within recess 268. Base 260 may directly overlie and be attached to rear surfaces 244A, 244B, 244C of chips 240A, 240B, 240C through a TIM 280, such as high k TIMs and other TIMs previously discussed herein. Base 260 may also directly overlie stiffener 230 and springs 290.

Figure 5:
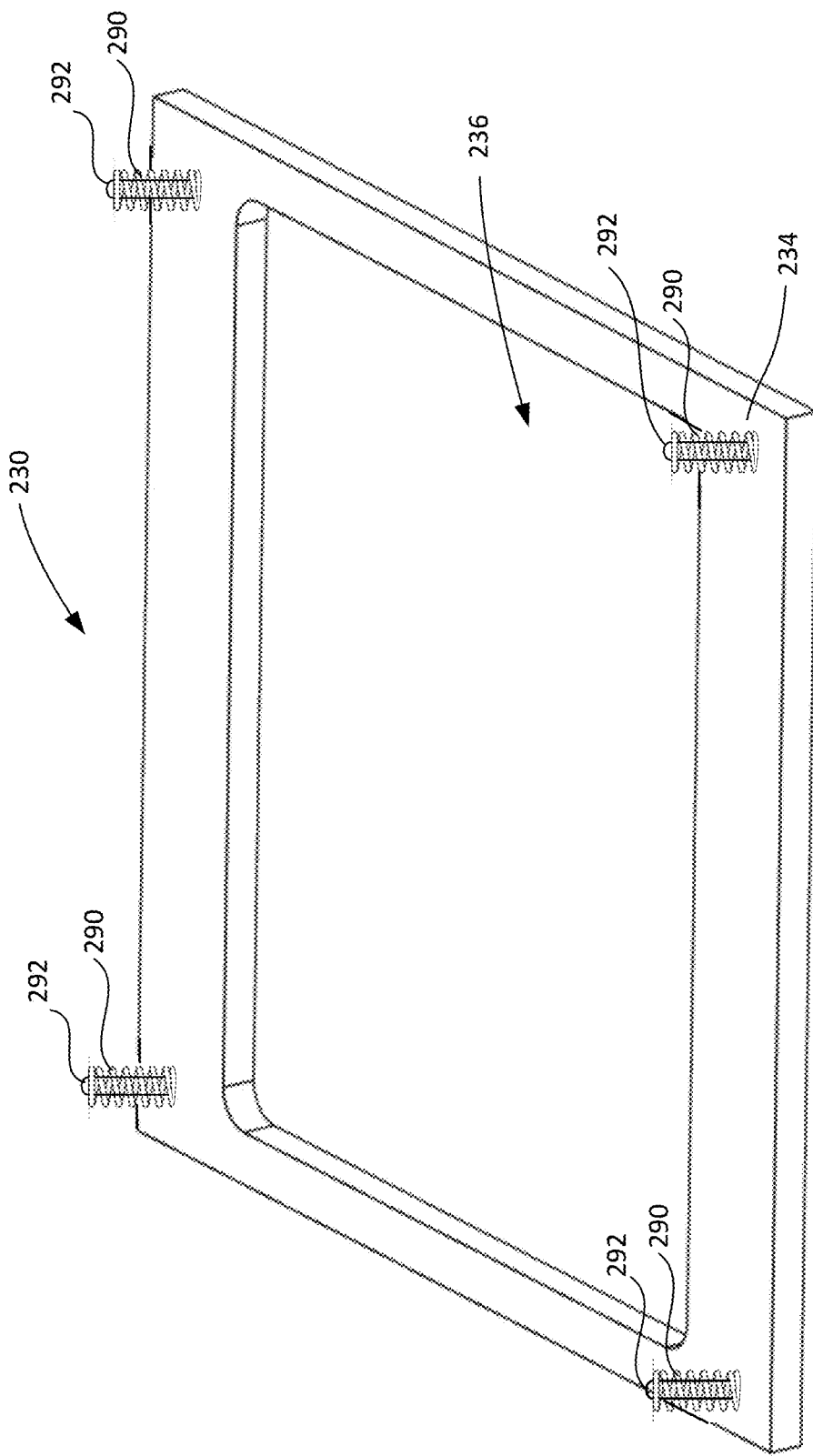
FIG. 5 is a perspective view of an example component of the example chip assembly of FIG. 4.

Springs 290 may be positioned between bottom surface 262 of base 260 and top surface 234 of stiffener 230. As shown in FIG. 5, posts 292 may be positioned at corners of stiffener 230 and extend away from top surface 234 of stiffener 230. Springs 290 may be wrapped around posts 292. Springs 290 can provide additional compression force to the substrate to minimize warpage of the assembly, as well as to enable greater control over bond line thickness of TIM 280.

Figure 6:
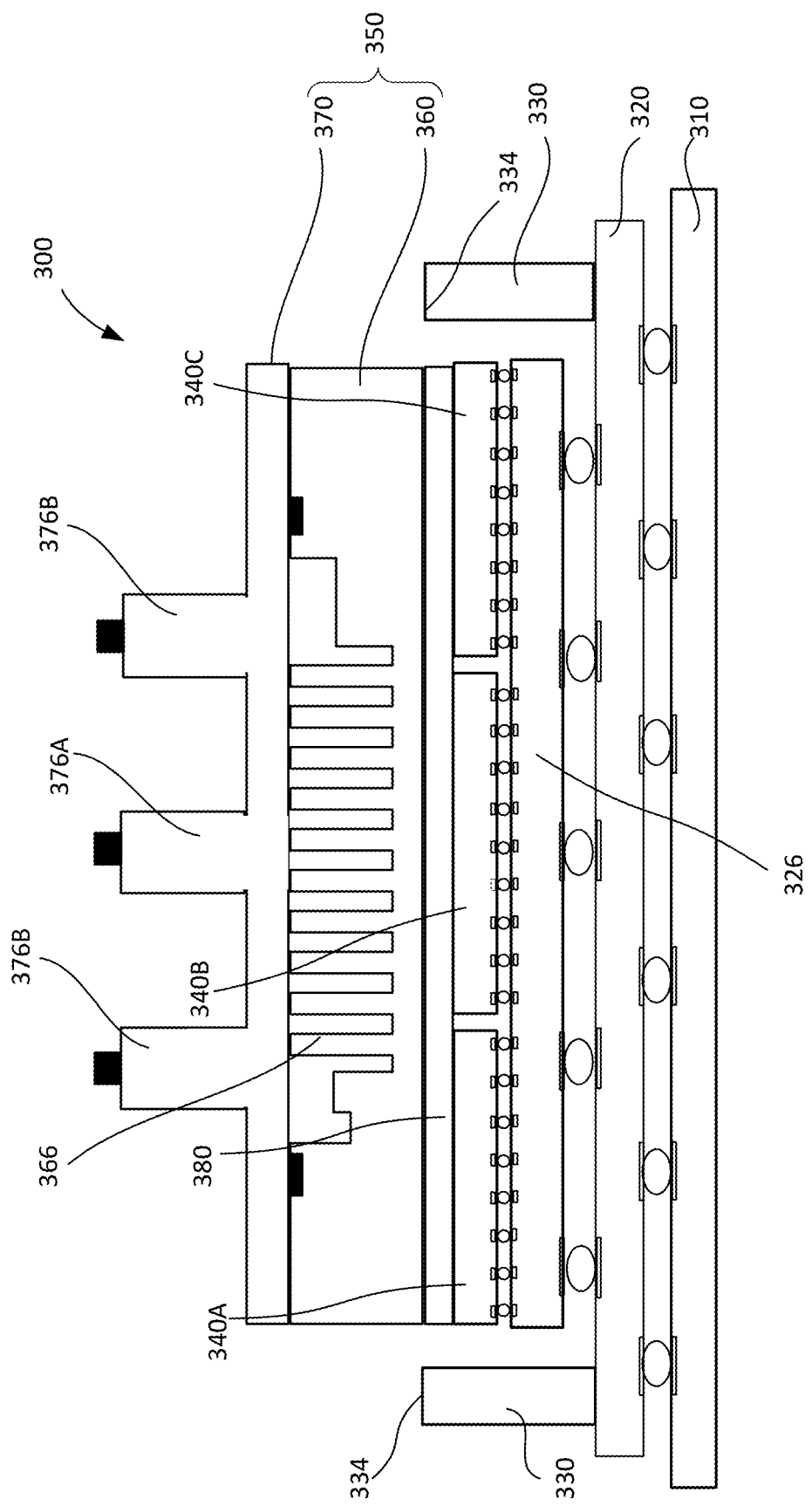
FIG. 6 is a schematic cross-sectional view of an example chip assembly according to aspects of the disclosure.

FIG. 6 provides another example assembly 300 according to aspects of the disclosure. Assembly 300 is similar to the prior examples to the extent that the assembly generally includes a substrate 320, a stiffener 330, an interposer 326, and a cold plate 350, all of which can overlie and be electrically interconnected printed circuit board 310. The cold plate further includes a base 360 with fins 366; and a lid 370 that includes at least one inlet. In this example, a single inlet 376A and two outlets 376B are provided. Additionally, a thermal TIM 380, including high k TIM previously discussed herein, can be used to join cold plate base 360 to chips 340A, 340B, 340C. Assembly 200 differs from the prior examples due to the arrangement of cold plate 350. As shown, cold plate 350 only overlies chips 340A, 340B, 340C and does not overlie stiffener 330. Top surface 334 of stiffener 330 instead remains exposed, since it no longer supports cold plate 350. In this arrangement, the weight of stiffener 330 alone becomes one of the primary forces maintaining warpage control over substrate 220 and printed circuit board 310 of assembly 300.

Figure 7:
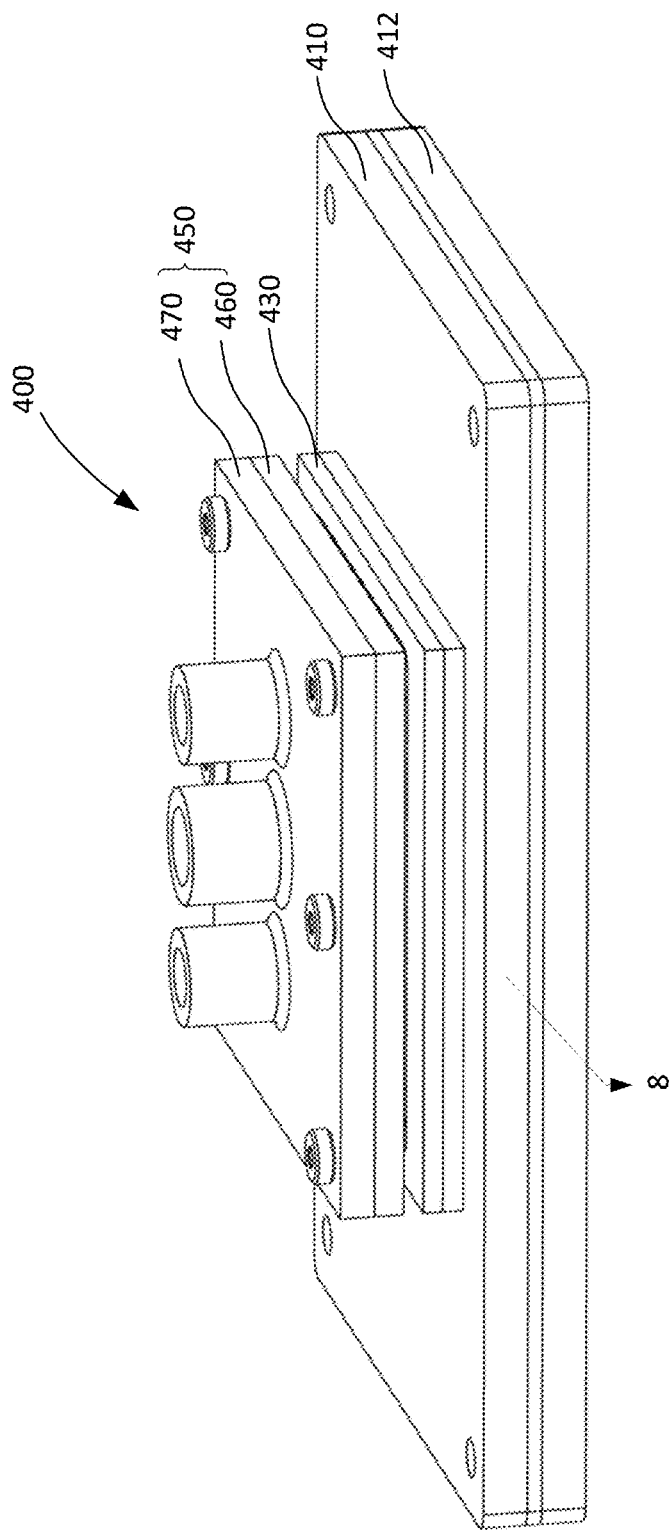
FIG. 7 is a perspective view of another example chip assembly according to aspects of the disclosure.
Figure 8:
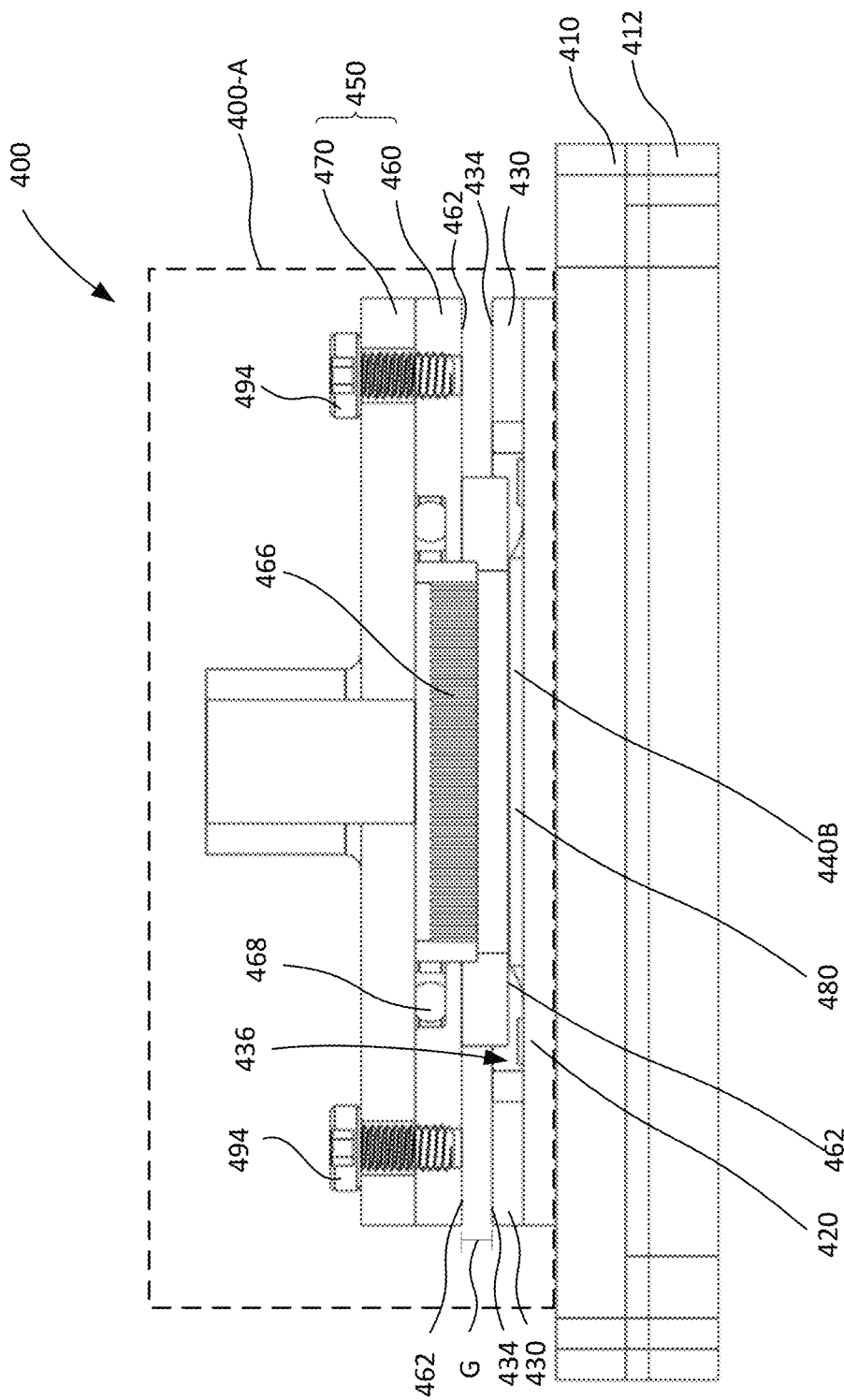
FIG. 8 is a cross-sectional view of FIG. 7 taken along plane 8-8.
Figure 9:
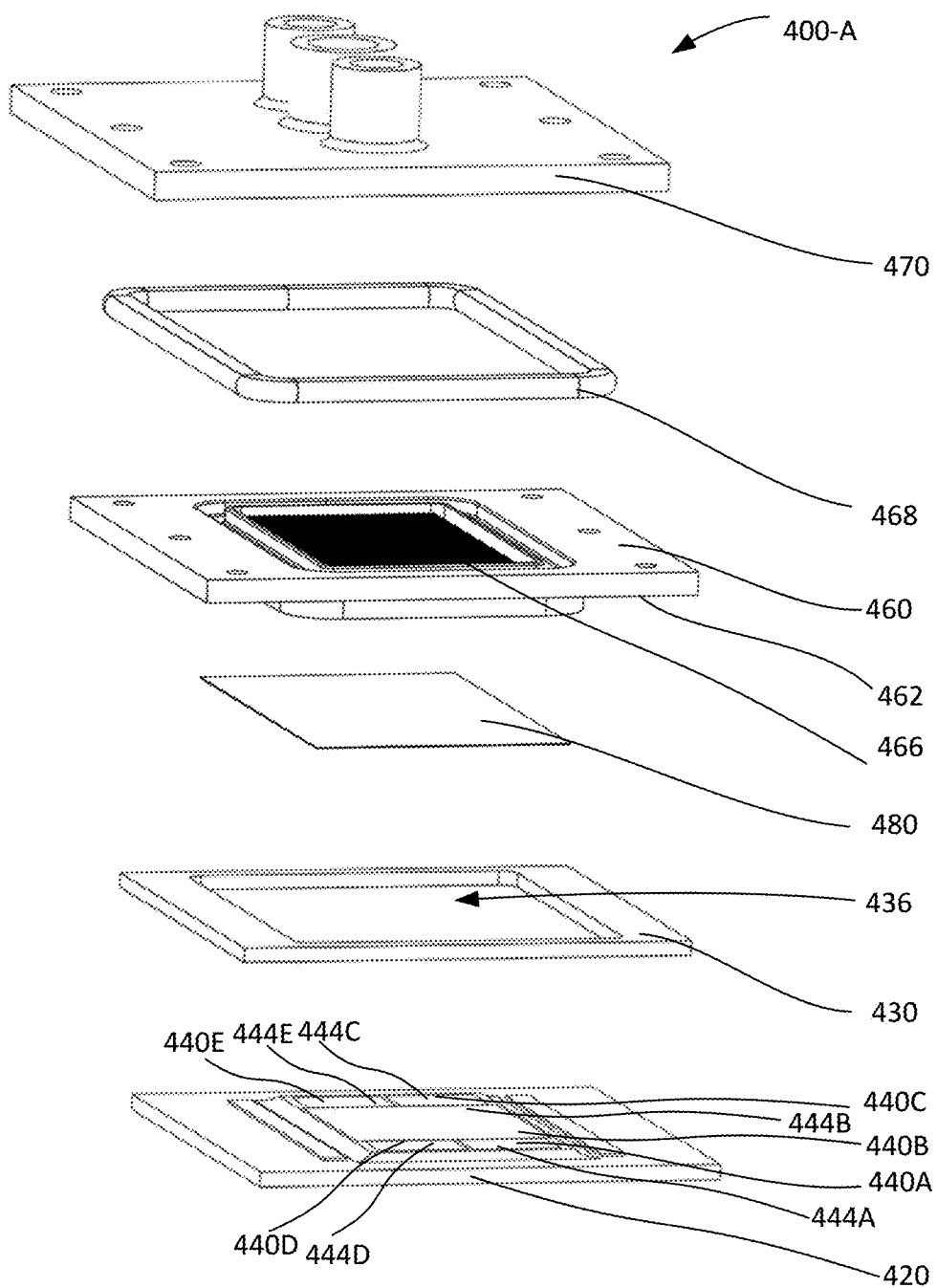
FIG. 9 is an exploded perspective view of the example chip assembly of FIG. 7.

FIGS. 7-9 illustrate another example assembly 400. FIG. 7 illustrates a perspective view of assembly 400 and FIG. 8 illustrates a cross-sectional view. This assembly 400 is similar to the previously disclosed assemblies, except that the microelectronic element is directly attached to the substrate without an interposer and a bolster plate 412 underlies a printed circuit board 410. As seen in FIG. 9, an exploded perspective view of a subassembly 400-A of assembly 400 without the printed circuit board and bolster plate 412 is illustrated. Subassembly 400-A (also shown in FIG. 8) can include a plurality of chips, a stiffener 430, a TIM 480, a cold plate 450 (which in this example includes a base 460 with fins 466 and a lid 470), and an O-ring 468, such as the examples previously disclosed herein, although numerous variations of the examples provided herein may be utilized. TIM can include at least a high k TIM or an ultra-high k TIM, as previously discussed herein. In this example, four chips are provided in a face-down position, but any number of chips may be implemented. As shown in FIG. 8, cold plate base 460 and cold plate lid 470 are joined together by screws 494. Bottom surface 462 of base 460 is joined to rear surfaces 444A-444E of respective chips 440A-440E with a TIM 480, such as disclosed herein. Chips 440A-440E are joined directly to substrate 420. Although not shown, bond pads on chips 440A-440E may be joined to contacts on substrate 420 through solder connections, such as a ball grid array. Stiffener 430 overlies substrate 420. Chips 440A-440E and a portion of bottom surface 462 of base 460 are positioned within aperture 436 of stiffener 430. In this example, base 460 overlies stiffener 430, but is not directly attached to stiffener 430. A gap G (FIG. 8) exists between bottom surface 462 of base 460 and top surface 434 of stiffener 430, such that cold plate 450 does not apply a direct compression force onto stiffener 430.

Figure 10A:
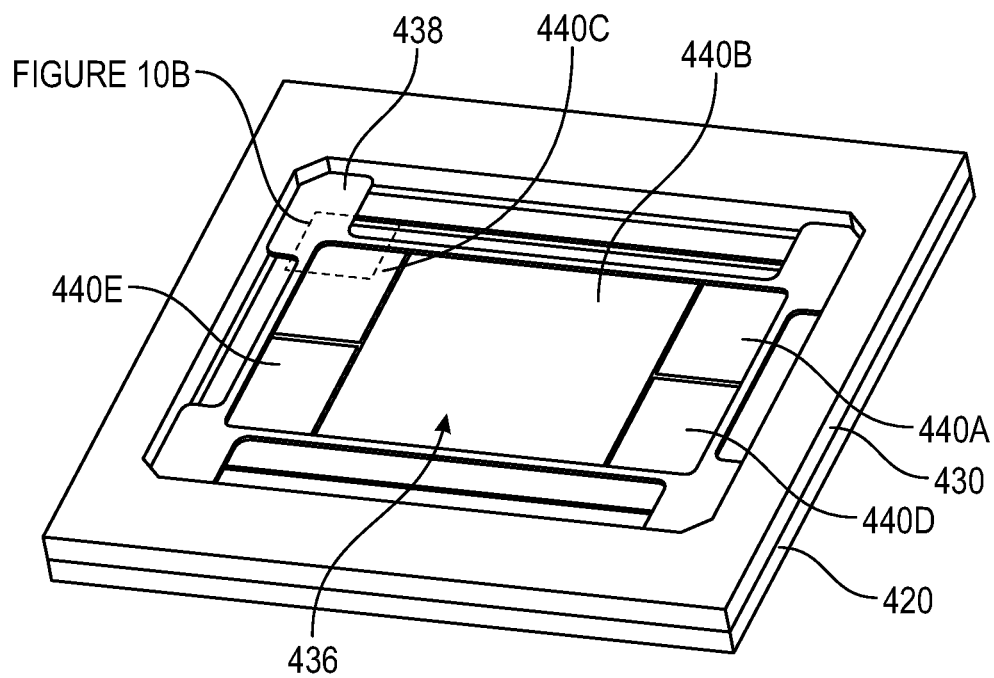
FIG. 10A is a combination of another example set of components from FIG. 7.
Figure 10B:
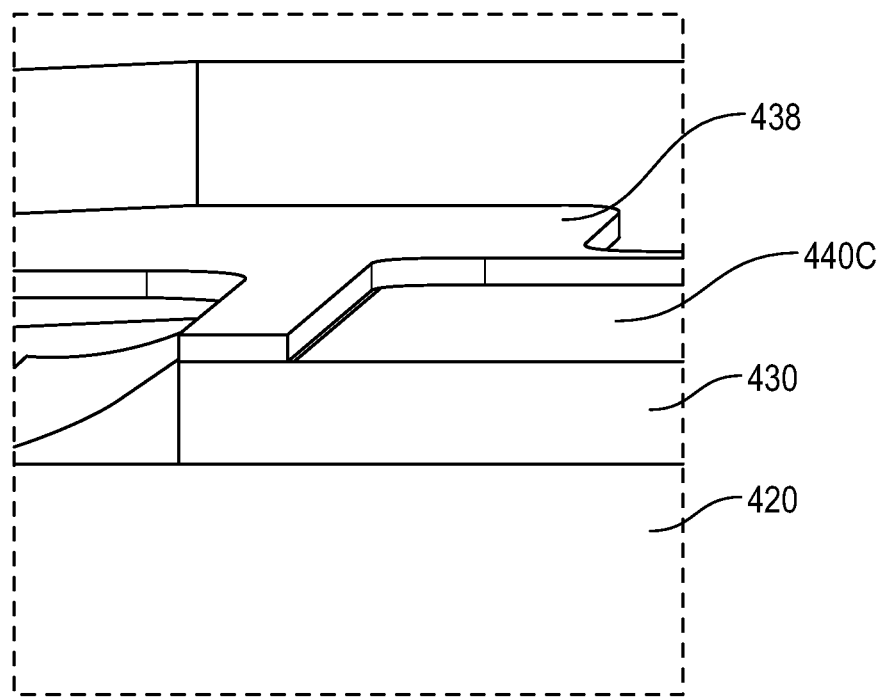
FIG. 10B is an enlarged portion of FIG. 10A.

FIGS. 10A-10B illustrate another example arrangement for stiffener 430, substrate 420, and chips 440A-440E within aperture 436 of stiffener 430, which can be implemented into any one of the aforementioned assemblies. As shown, a shim 438 may be provided within aperture 436 of stiffener 430. Shim 438 can extend around the outermost edge surfaces of chips 440A-440E. As shown in FIG. 11, the enlarged perspective view, stiffener ring 430 can be attached to substrate 420. As shown, chips 440A-440E are directly attached to substrate 420.

Figure 11A:
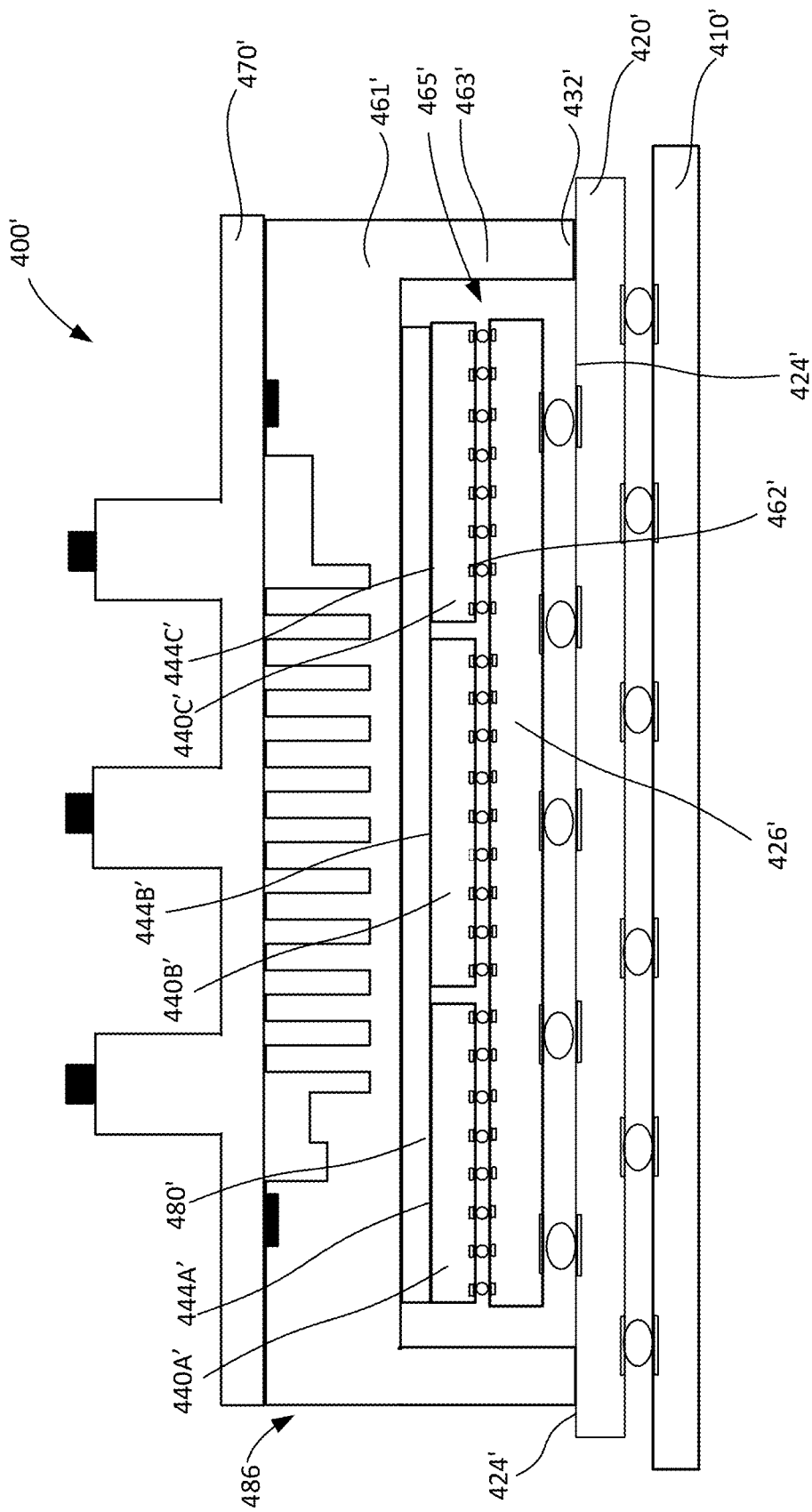
FIG. 11A is a schematic cross-sectional view of an example chip assembly according to an aspect of the disclosure.
Figure 11B:
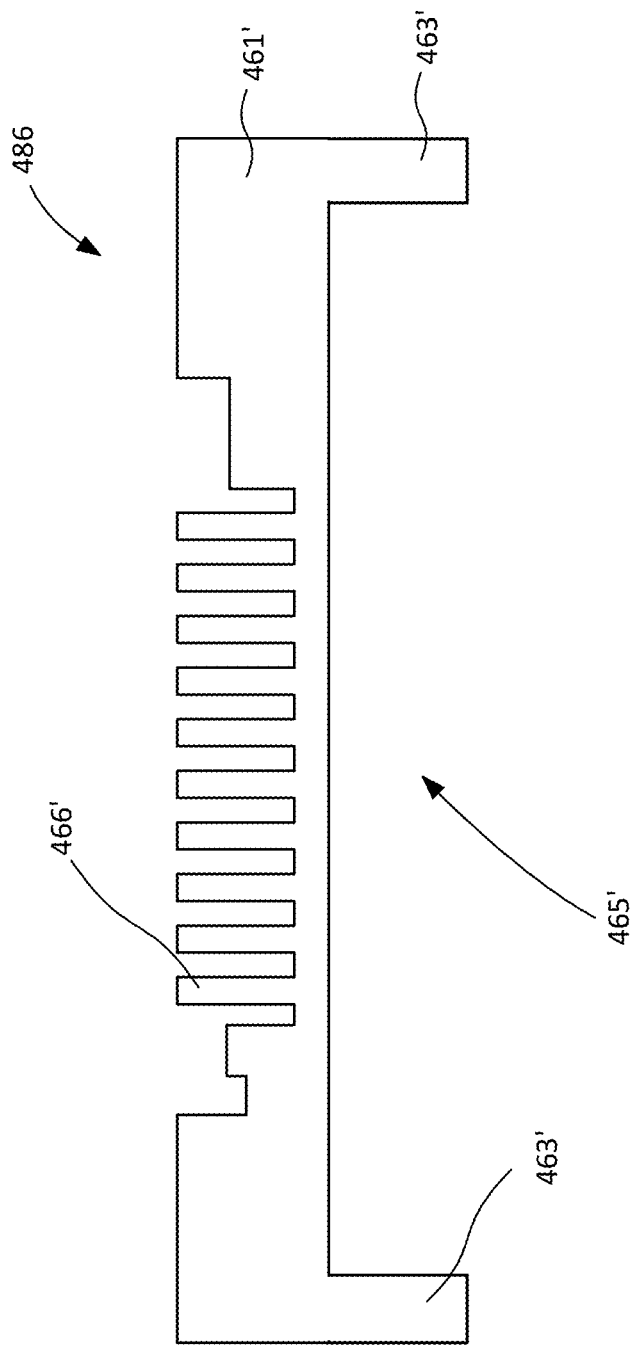
FIG. 11B is a component of the example chip assembly of FIG. 11A.

FIG. 11A illustrates another example assembly 400'. This assembly is otherwise identical to assembly 400, except that the cold plate base and stiffener are formed as a single monolithic cold plate base and stiffener unit. Referring first to FIG. 11B, an example monolithic cold plate and stiffener unit 486 is shown. Monolithic cold plate and stiffener unit 486 includes a main body 461' with fins 466' and rigid stiffener legs 463'. A recess 465' is provided between stiffener legs 463'. With reference back to FIG. 11A, chips 440A', 440B', 440C', can be coupled or attached to interposer 426', such as, for example, a silicon interposer, and substrate 420', all of which can be coupled or attached to a printed circuit board 410'. Monolithic cold plate and stiffener unit 486 can then be attached to top surface 424' of substrate 420'. For example, a TIM 480' can be used to attach monolithic unit 486' to rear surfaces 444A', 444B', and 444C' of chips 440A', 440B', 440C'. The TIM can be any TIM, including a high-K TIM or an ultra-high k TIM. Additionally, an adhesive or the like can be used to attach bottom surface 432' of stiffener legs 463' to top surface 424' of substrate 420'. Chips 440A', 440B', 440C', interposer 426' will be positioned within recess 465'. Once monolithic cold plate and stiffener unit 486 is in place, cold plate lid 470' may then be attached to and overlie monolithic cold plate and stiffener unit 486. In other examples, cold plate lid 470' can be pre-attached to monolithic cold plate and stiffener unit 486, and then the two components may be attached to the rest of the assembly. Similarly, lid 470 can be integrally formed along with the stiffener and cold plate lid to form a monolithic unit comprised of a combination of the lid, stiffener, and cold plate.

Such configuration can provide added warpage benefits due to the additional structural rigidity of stiffener 430' created by the addition of base 460'. This allows for cold plate assembly to be completed at a package level, such that few or no additional thermal process steps are required at the printed circuit board level.

Example Methods of Manufacturing

Various methods aimed at achieving high thermal conductivity and heat distribution within a package, including controlling bond line thickness and the number of times reflow occurs, can be implemented when manufacturing any one of the aforementioned example assemblies, as well as variations thereof.

Figure 12A:
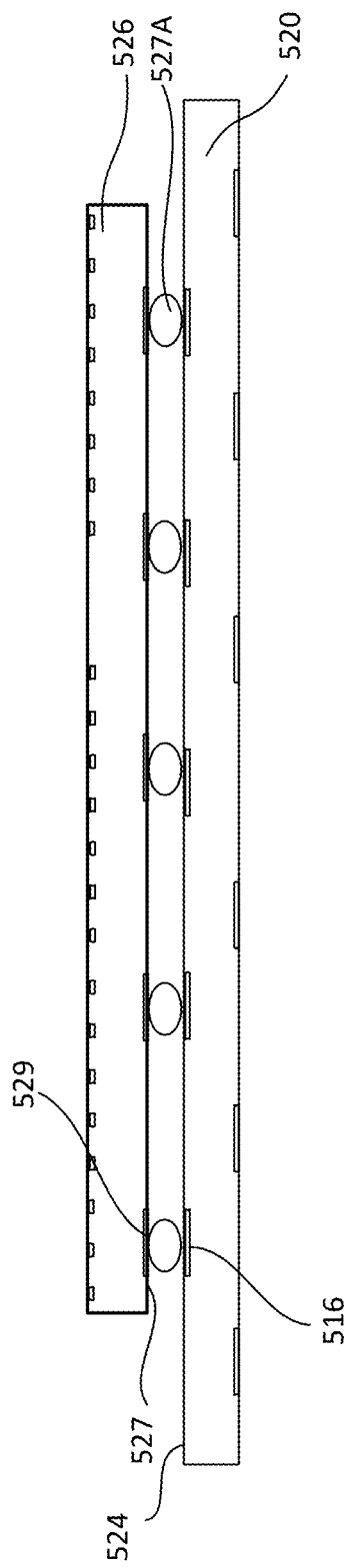
Figure 12B:
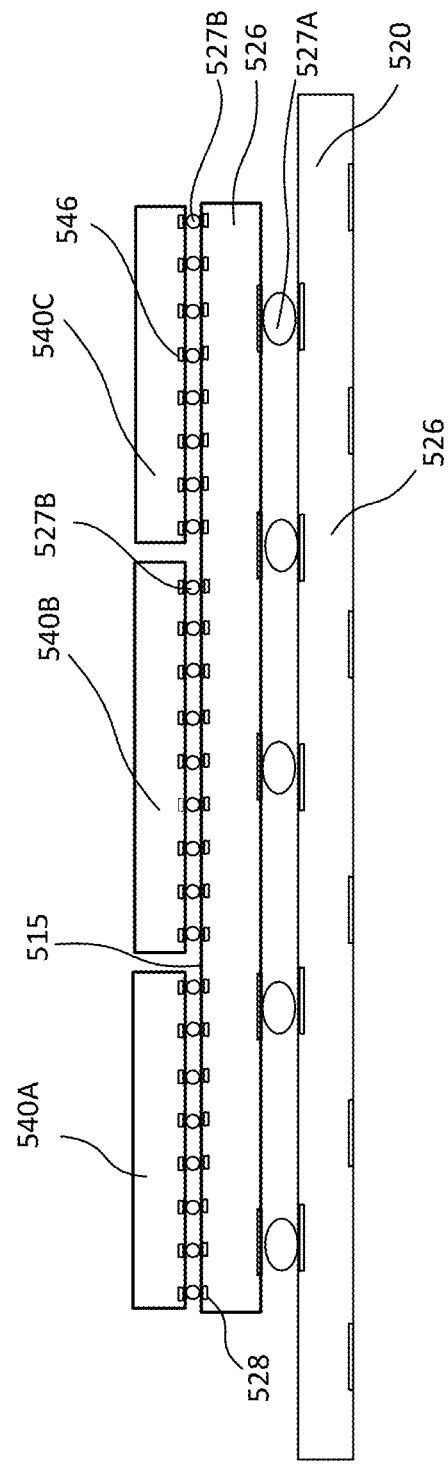

FIGS. 12A-12H illustrate one example method for manufacturing the assembly 100 shown in FIG. 1. As shown in FIG. 12A, an interposer 526 may be joined with substrate 520. Interposer 526 can include contacts 529 at its bottom surface 527 that can be aligned with contacts 516 exposed at top surface 524 of substrate 520. Solder balls 527A may be provided on either substrate 520 or interposer 526. As shown in FIG. 12B, microelectronic elements, such as chips 540A, 540B, 540C may be joined to interposer 526 using solder balls 527B. Chips 540A, 540B, 540C include bond pads 546 that can be aligned with contacts 528 at top surface 515 of interposer 526. Solder balls 527B can be pre-attached to either bond pads 546 of chips 540A, 540B, 540C or contacts 528 of interposer 526. The package can then be reflowed to secure the bond connections between chips 540A, 540B, 540C and interposer 526, as well as interposer 526 and substrate 520. Alternatively, a first reflow process can occur to reflow solder balls 527A and join interposer 526 and substrate 520. A second reflow process may then occur to reflow solder balls 527B to bond chips 540A, 540B, 540C, 526 with interposer 526.

In FIG. 12C, a stiffener 530 may be attached to top surface 524 of substrate 520. An adhesive (not shown) can be used to join stiffener 530 to substrate 520. Stiffener 530 can extend circumferentially around chips 540A, 540B, 540C and interposer 526. The combination of stiffener 530, substrate 520, and interposer 526 can be sputter coated with a combination of metals, such as titanium, NiV, and gold. In one example, three materials with the following thicknesses can be applied as follows: 1000 A Ti, 3500 A NiV, and 1000 A Au. In other examples, one or more of these same or different materials may be applied with the same or different thicknesses. This can help to promote the chemical bond between the package and the TIM material. In other examples, stiffener 530 can be omitted.

The resulting subassembly shown in FIG. 12C is an in-process unit 500-1 that can be manufactured by, for example, an outsourced semiconductor assembly and test (OSAT) market company. This arrangement of first assembling in-process unit 500-1 can allow for an OSAT manufacturer or the like to manufacture and supply a bare die package to a contract manufacturer or the like, who can incorporate in-process unit 500-1 into a specific device or application.

Turning now to FIG. 12D, in-process unit 500-1 can be attached to a printed circuit board 510 or the like. As shown, contacts 518 at bottom surface 522 of substrate 520 can be aligned with contacts 506 exposed at the top surface 508 of printed circuit board 510. Solder balls 527C in a grid array can be used to attach substrate 520 to printed circuit board 510. The package can be reflowed at this stage to create a bonded connection. Solder balls 527C may be comprised of a high melting point solder. In one example, the solder may have a reflow temperature of 260° C., but in other examples the temperature may be higher or lower. Additionally, different types of solder or different bonding materials may be utilized.

Figure 12E:
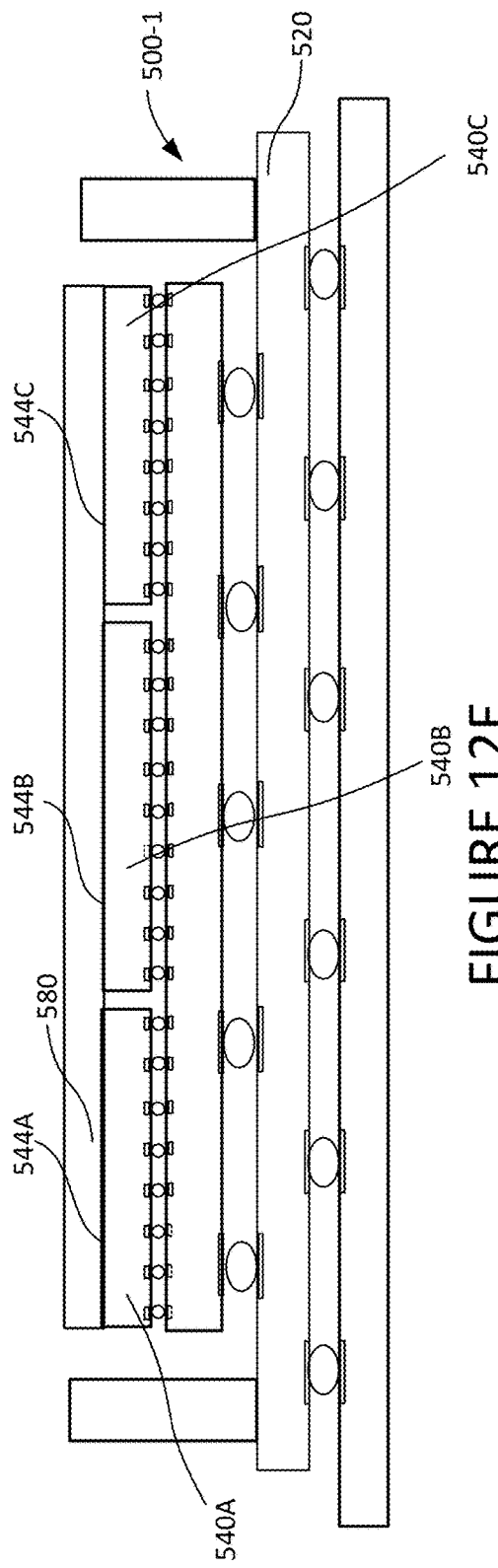

As shown in FIG. 12E, a TIM 580, may be applied to rear surfaces of chips 540A-540B, 540C. TIM can be any high k TIM material disclosed herein, or alternatively any known TIM. TIM may be applied using various methods. In the example where TIM is a paste, TIM may be directly applied to rear surfaces 544A, 544B, 544C of chips, which will later cure and harden. In another example, TIM can be pre-reattached to a cold plate, such as cold plate base 560, such as by reflowing TIM 580 (before secondary reflow to chip). TIM 580 can alternatively be attached to cold plate 550 through an adhesive or similar material that can secure TIM 580 in place prior to reflow.

Figure 12F:
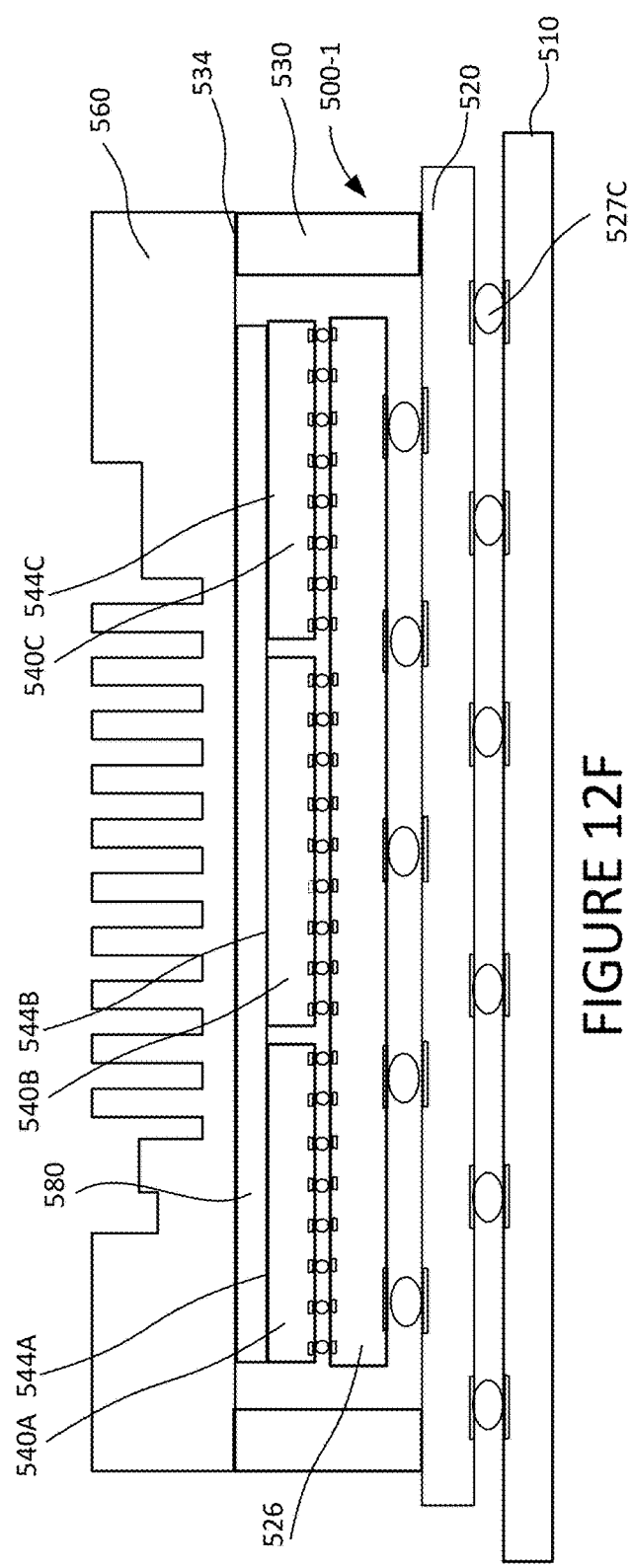

With reference to FIG. 12F, base 560 of cold plate 550 may be attached to rear surfaces 544A, 544B, 544C of chips 540A, 540B, 540C, as well as top surface 534 of stiffener 530. A TIM 580, such as a high-K or ultra-high-K TIM may be positioned between cold plate base 560 and rear surfaces 544A, 544B, 544C. TIM 580 can help to dissipate heat generated by chips 540A, 540B, and 540C. Once base 560 is positioned over rear surfaces and stiffener, the TIM may be reflowed to ensure a connection between cold plate and chips 540A, 540B, 540C. In some examples, a TIM may be selected that has a reflow temperature that is lower than a reflow temperature of the bonding material used to join the in-process unit to the printed circuit board. This can also be beneficial since the bonding material, for example solder balls 527C, between the printed circuit board 510 and the substrate 520 is not reflowed when the TIM is reflowed.

Figure 12G:
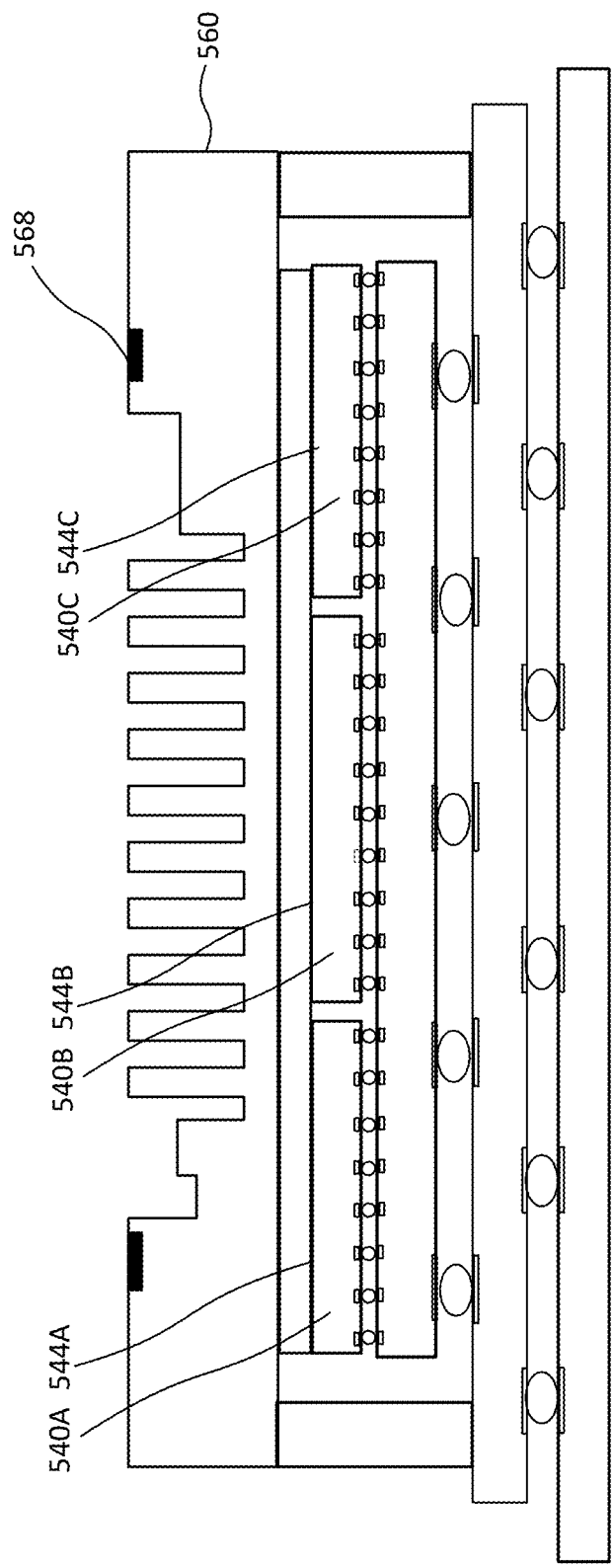
Figure 12H:
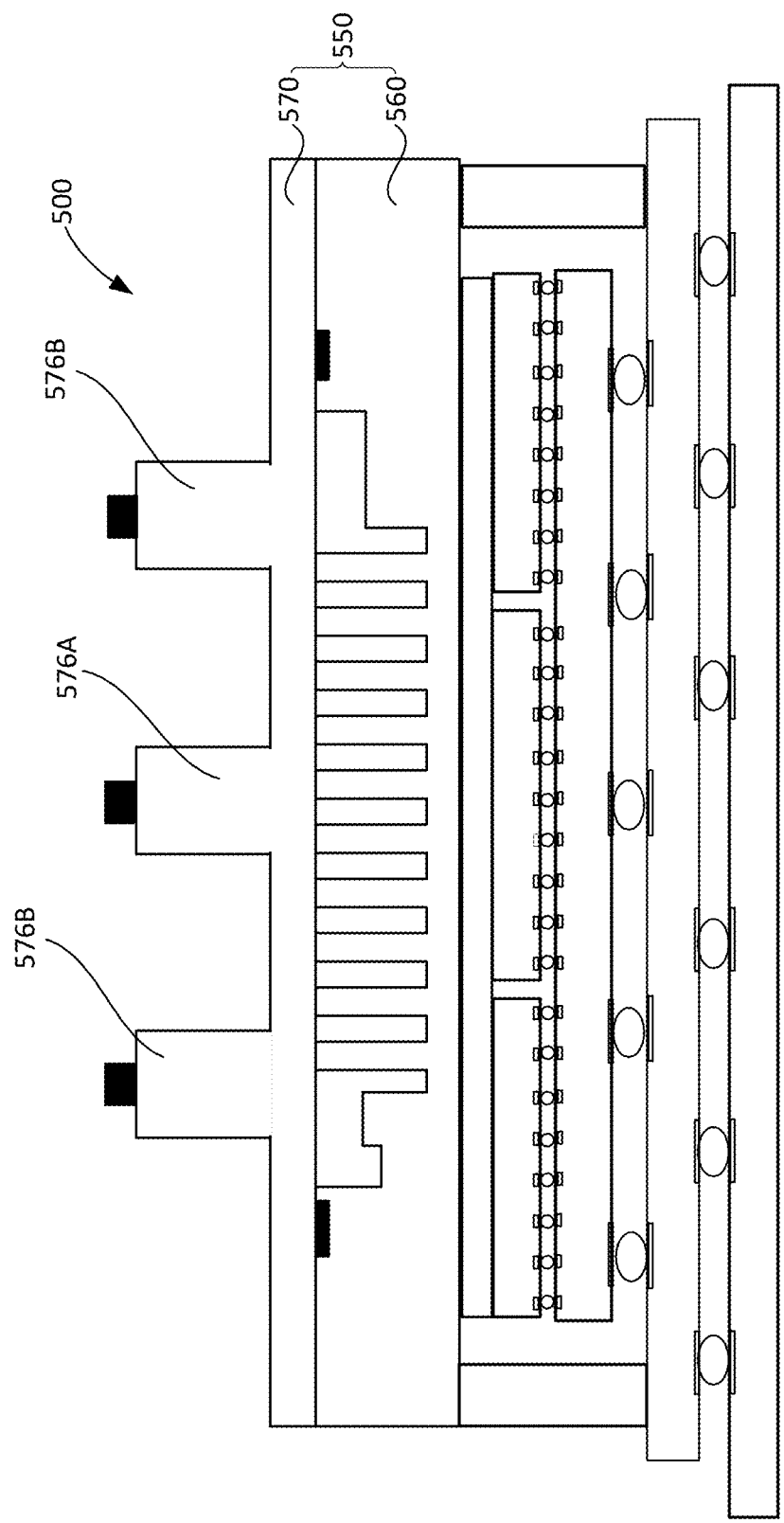
Figures 1, 12H:
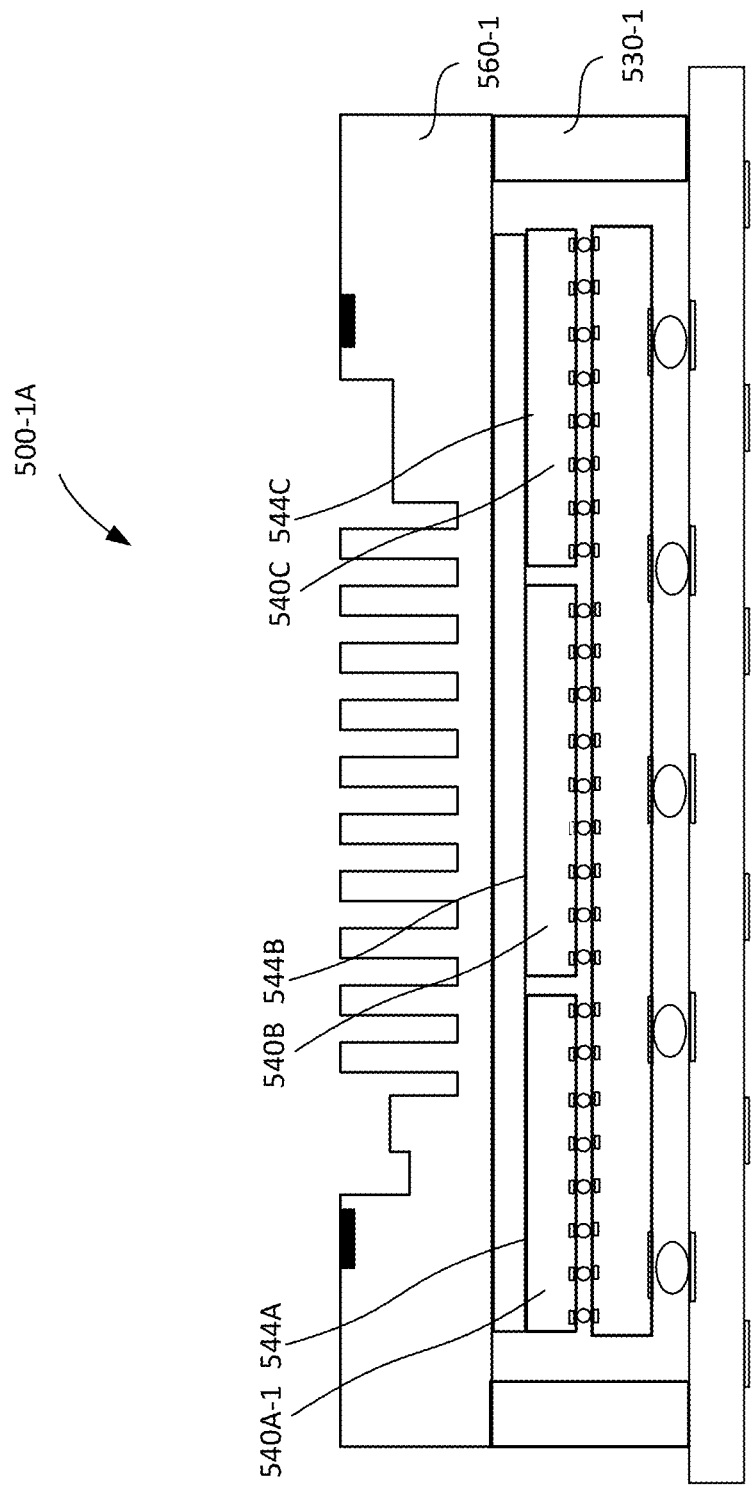

As shown in FIG. 12G, an O-ring 568 can optionally be provided within a recess (not shown) of cold plate base 560 of cold plate 550, so as to accommodate lid 570. FIG. 12H illustrates the final assembly 500. Lid 570, including inlet 576A and outlets 576B, may be attached to base 560 using various forms of attachment. In one example, lid 570 may be screwed together with base 560, but any known means of attachments may be utilized. In another example, lid 570 and base 560 can first be joined together, and then attached to the in-process unit 500-1 as a completed cold plate assembly.

Figure 12I:
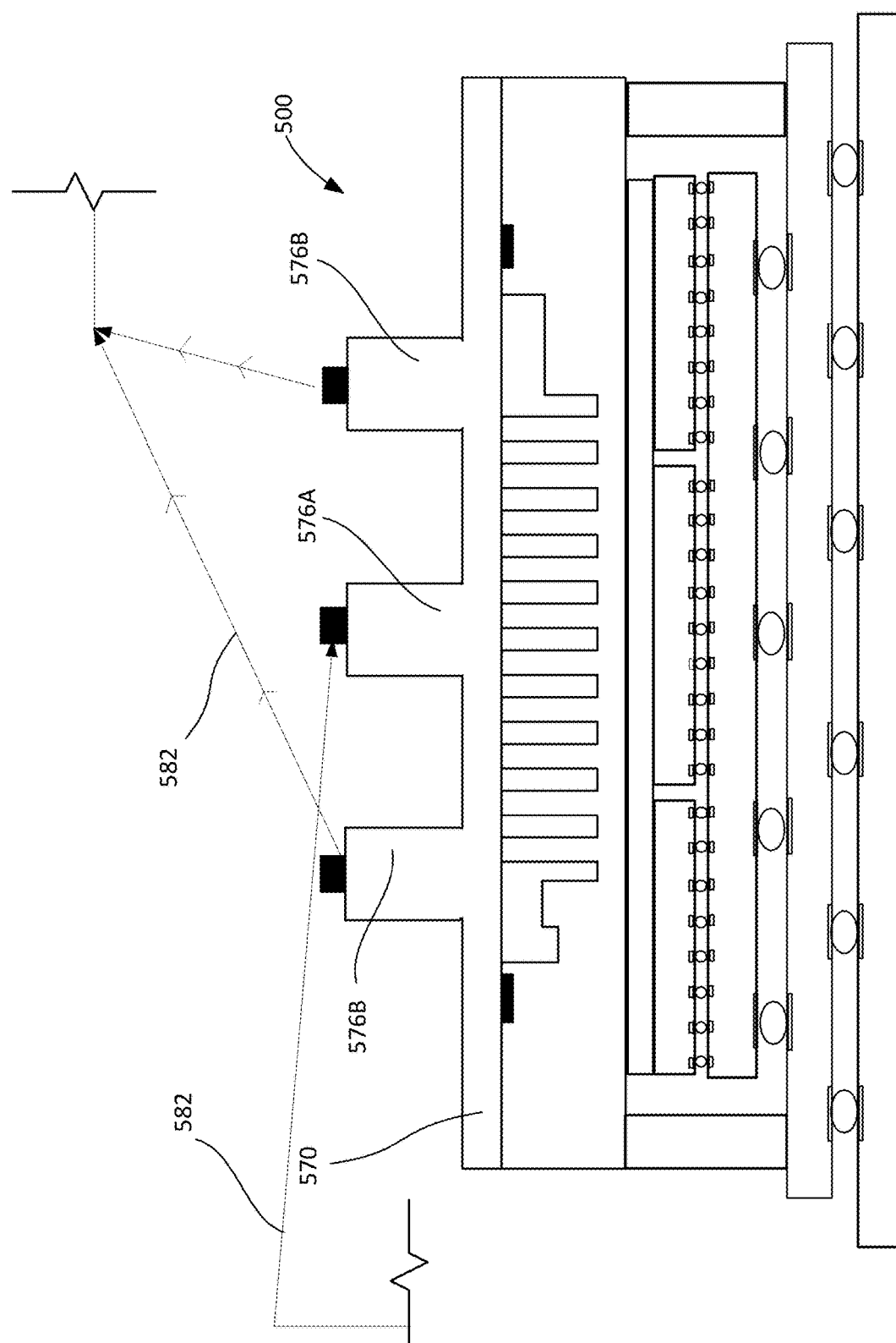
FIG. 12I is an example method and structure for connecting the chip assembly of FIGS. 12A-12H to a piping system.

FIG. 12I illustrates the addition of piping 582 that can allow for cooling of the chip assembly. In this regard, the piping may route cooling fluid only to a single chip assembly 500, or may be joined to one or more other chip assemblies (as will be discussed in later example embodiments shown in FIGS. 19-22). As shown, piping 582 can be directly connected to inlet 576A. Additionally, piping 582 is connected to outlets 576B. During operation, this allows for the flow of water or other liquids through piping 582 into inlet 576A and cold plate 550, and then out of outlets 576B on opposed sides of inlet 576A.

It is to be noted that first preparing the in-process unit 500-1, as discussed above, and then subsequently attaching the cold plate base with a TIM having a lower reflow temperature than the reflow temperature of the bonding material bonding the in-process unit 500-1 to the printed circuit board can allow for the omission of one or more reflow processes. This process prevents the TIM material from having to go through extra reflow steps, which can provide for good reliability.

In another example, the cold plate can alternatively be assembled as part of the in-process unit prior to the in-process unit being mounted and bonded to the printed circuit board. For example, as shown in FIG. 12H-1, cold plate base 560-1 is pre-assembled as part of the in-process unit 500-1A. Thereafter, in-process unit 500-1A can be mounted to a printed circuit board and the lid (not shown) may be joined to the base 560. In such example, the TIM used to join the cold plate base 560-1 to the rear surfaces 544A, 544B, 544C of chips 540A-1, 540B-1, 540C-1 and stiffener 530-1 may be one that is not impacted by the reflow process for joining the in-process unit 500-1A to the board. For example, a TIM that has higher reflow temperature than the bonding material used to bond the chip to the board may be selected.

Figure 13A:
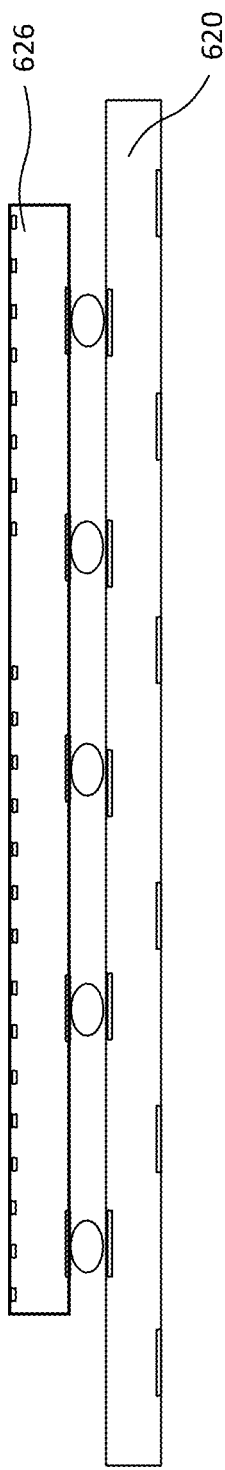
FIGS. 13A-13H are an example method of manufacturing the chip assembly of FIG. 4.
Figure 13B:
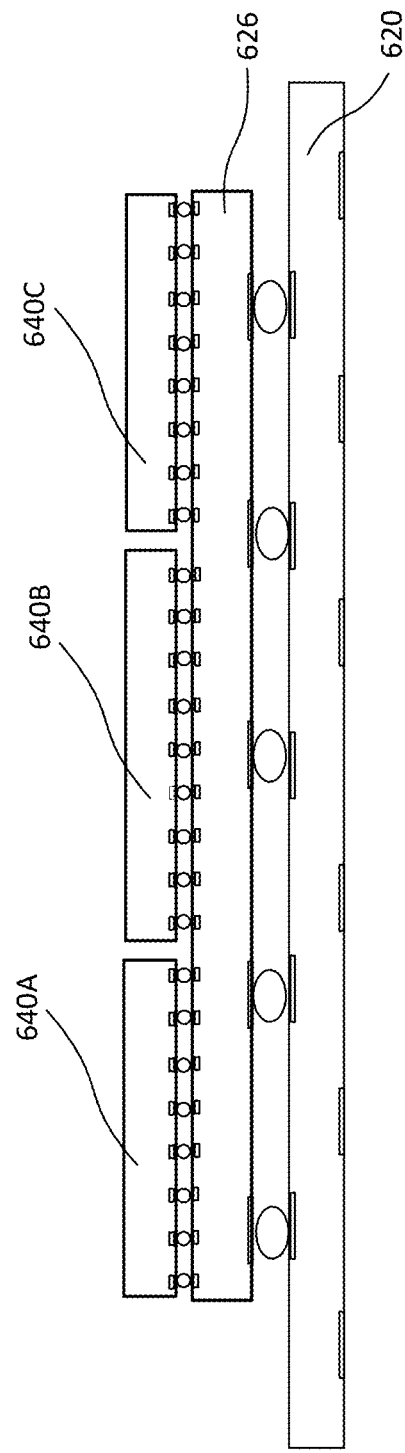

Referring to FIGS. 13A-13H, a method of manufacturing a chip assembly, such as chip assembly 200 (FIG. 4) is shown. The method of manufacture is otherwise identical to the method discussed in FIGS. 12A-12I, except for the addition of a spring. As in the prior example, FIGS. 13A-13B illustrate assembly of chips 640A, 640B, 640C to interposer 626, and the assembly of the chips 640A, 640B, 640C and interposer 626 to substrate 620. As previously mentioned, reflow to allow for joinder of chips 640A, 640B, 640C, interposer 626, and substrate 620 can occur in either one step (once chips, interposer, and substrate are aligned with one another) or two steps (first solder reflow interposer to substrate, and then reflow interposer to chips). Additionally, chips may instead first be attached to interposer 626, and then the chips 640A, 640B, 640C together with interposer 626 may be attached to substrate 620

Figure 13C:
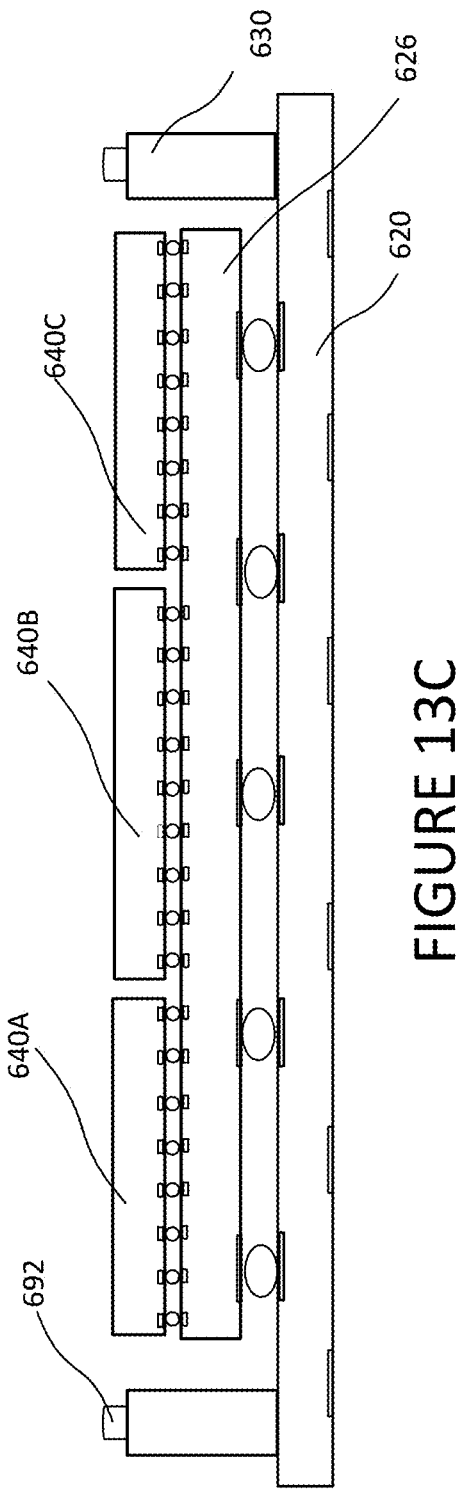
Figure 13D:
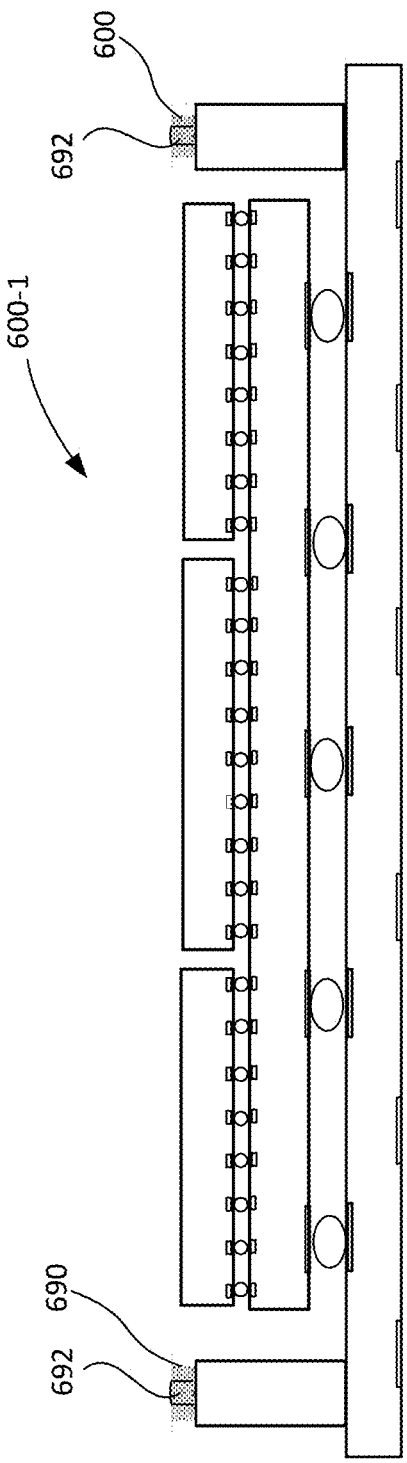

Referring to FIG. 13C, a stiffener 630 may be provided on a top surface of substrate 620, as well as around the chips 640A, 640B, 640C and interposer 626. Posts 692 can be integrally formed with stiffener 630 or subsequently added to the top surface of stiffener 630. (See, e.g., FIG. 5.) As shown in FIG. 13D, a biasing mechanism, such as springs 690, may be added to posts 692. This results in an in-process unit 600-1.

Figure 13E:
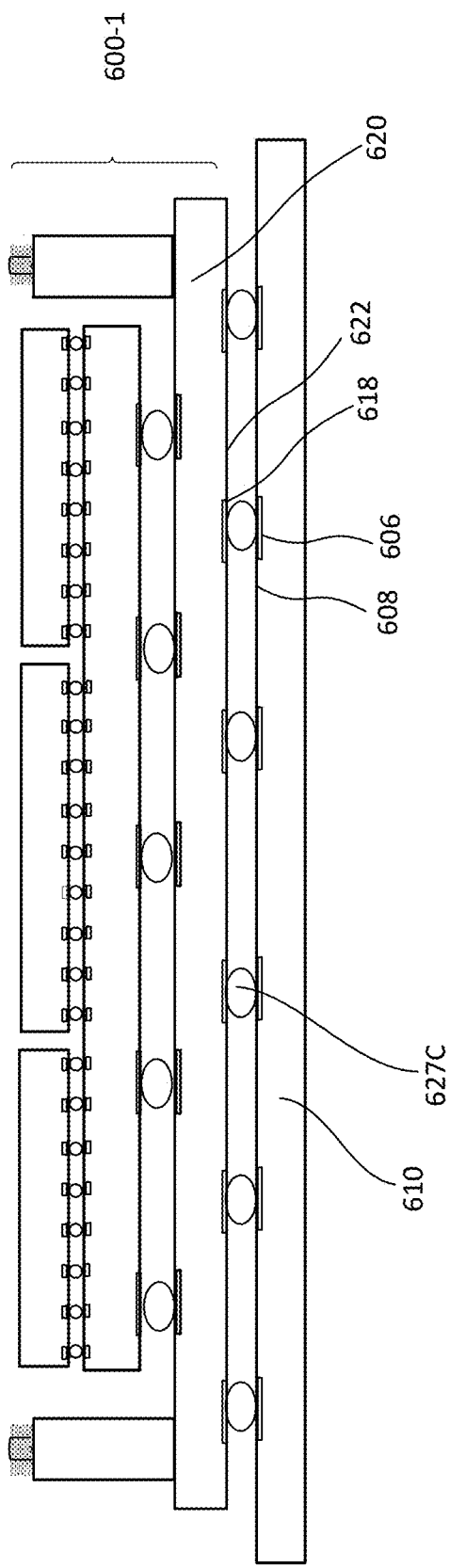

Turning now to FIG. 13E, in-process unit 600-1 can be attached to a printed circuit board 610 or the like. As shown, contacts 618 at bottom surface 622 of substrate 620 can be aligned with contacts 606 at the top surface 608 of printed circuit board 610. Solder balls 627C arranged in a grid array can be used to attach substrate 620 to printed circuit board 610. The package and solder can be reflowed to form the bonded connection.

Figure 13F:
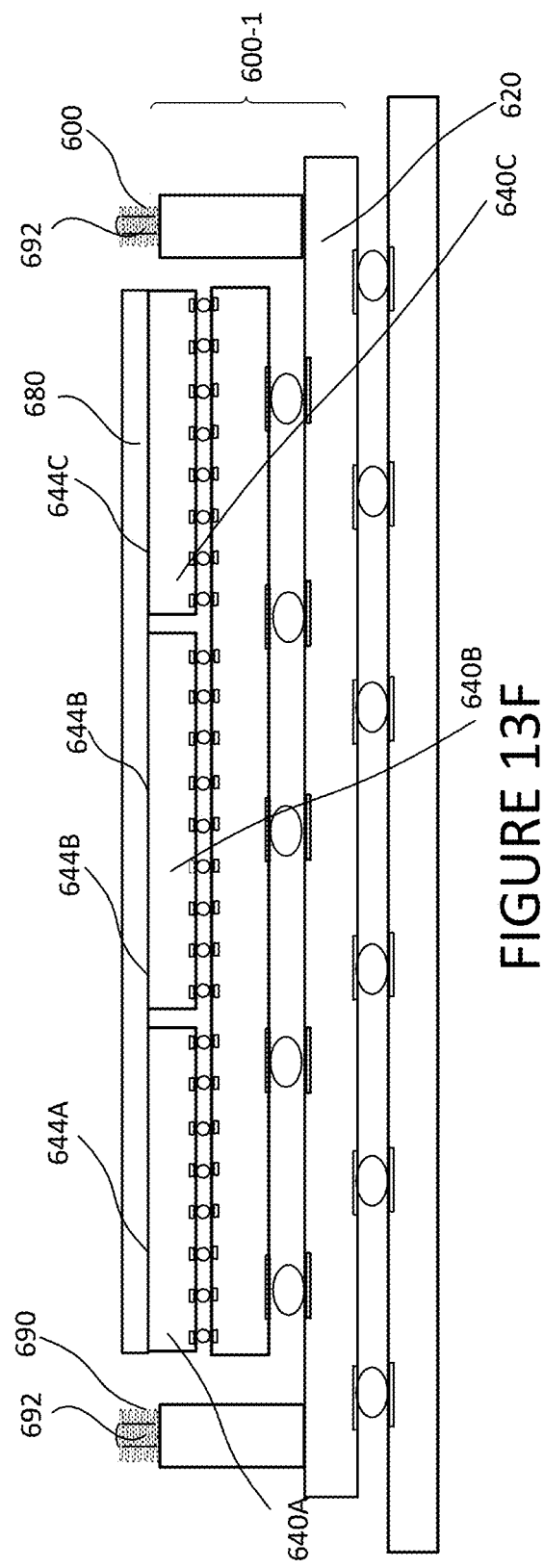

As shown in FIG. 13F, TIM 680 may be applied to rear surfaces 644A, 644B, 644C of respective chips 640A, 640B, 640C. TIM 680 can be any TIM material disclosed herein or any known TIM. TIM may be applied using various methods. In the example where high k TIM is a paste, TIM may be deposited directly onto rear surfaces of chips 640A, 640B, 640C, which will later cure and harden.

Figure 13G:
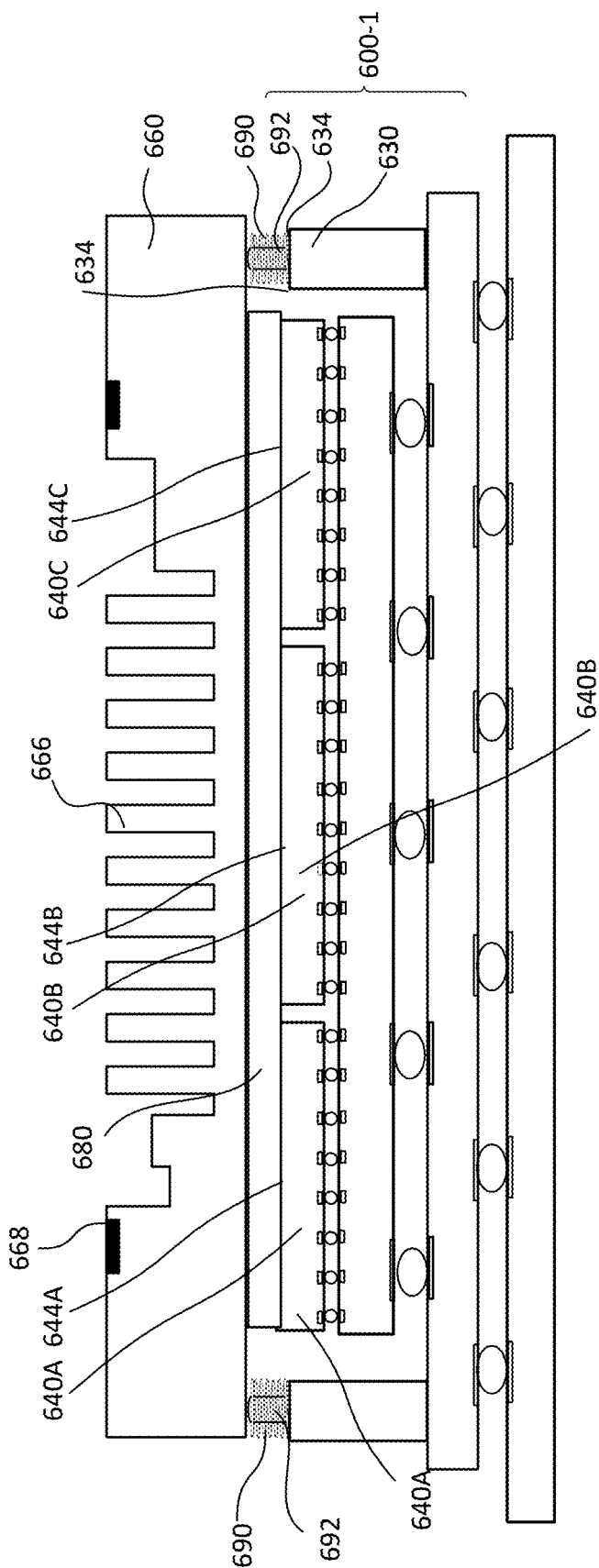

With reference to FIG. 13G, base 660 of cold plate, including fins 666 may be attached to the in-process unit 600-1 and printed circuit board. In particular, base 660 may be attached to rear surfaces 644A, 644B, 644C of chips 640A, 640B, 640C, as well as top surface 634 of stiffener 630, including springs 690. In this example, TIM 580 may be positioned between cold plate base 660 and rear surfaces 644A, 644B, 644C. TIM will help to dissipate heat generated by chips 640A, 640B, and 640C. Once base 660 is positioned over one or more rear surfaces 644A, 644B, 644C and stiffener 630, the TIM may be reflowed to ensure a connection between cold plate 650 and chips 640A, 640B, 640C. Springs 690 can help to ensure a compression force against stiffener 630 and substrate 620 by the weight of base 660 and lid 670. O-ring 668 can also be provided within a recess (not shown) in base 660.

Figure 13H:
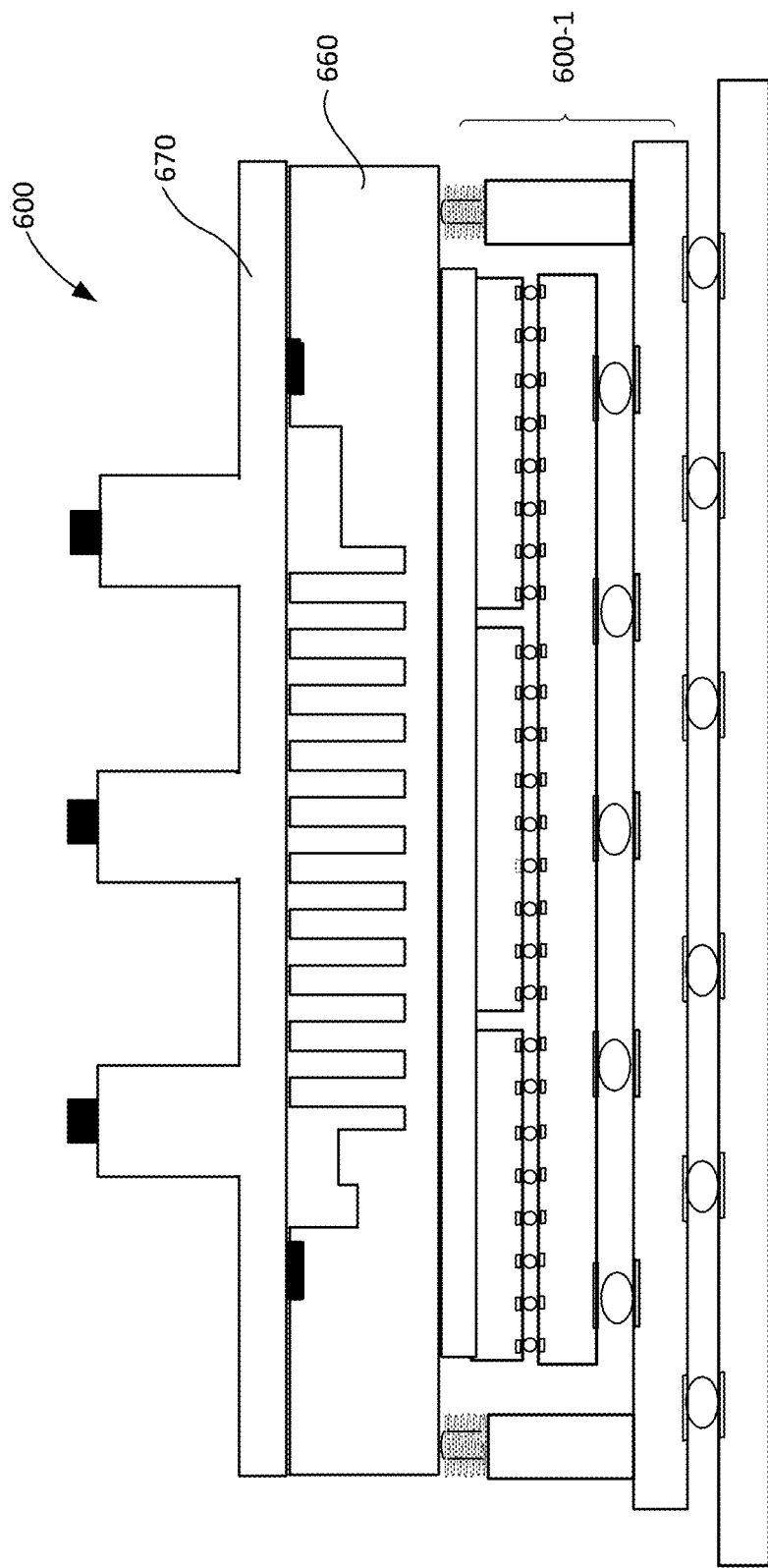

FIG. 13H illustrates the final assembly 600. Lid 670 may be attached to base 660 using various forms of attachment. In one example, lid 670 may be screwed together with base 660, but in other examples, an adhesive or other bonding material can be utilized. Loop and piping can be further added to the assembly 600, as disclosed herein.

In one example method of assembly, the in-process unit 600-1, as shown in FIG. 13D, can be prepared by one manufacturer, such as an OSAT manufacturer or the like. In process unit 600-1 can then be further packaged by a second contactor or the like who will then perform the remaining steps in FIGS. 13E-13H. Alternatively, all of the steps in FIGS. 13A-13H can be formed by one entity. In still other examples, chips may first be joined to interposer 626, and then the combination of interposer and chips 640A-640C may be joined to substrate 620.

Methods of Attaching Tim Material

Figure 14A:
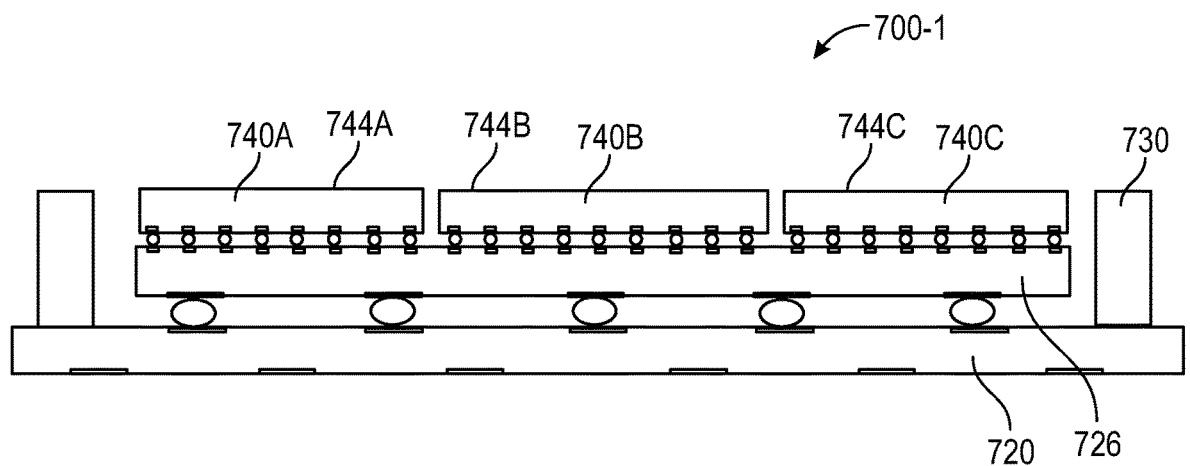
FIG. 14A is a schematic cross-sectional view of an example in-process unit according to aspects of the disclosure.

FIGS. 14A-18 illustrate various methods of attaching TIM material to form assemblies described herein at the server tray level, as well as variations thereof. FIG. 14A illustrates an in-process unit 700-1, which is identical to the in-process unit shown in FIG. 12C. As previously discussed, in-process unit 700-1 can include a substrate 720, interposer 726, and chips 740A, 740B, 740C attached to interposer 726. Stiffener ring 730 can extend circumferentially around chips 740A-740C and interposer 726. In other examples, as previously discussed, in-process units can include different features. For example, interposer 726 and/or stiffener 730 may be omitted. Omission of interposer 726 will allow for direct connection of chips 740A, 740B, 740C to substrate 720.

After formation of in-process unit 700-1, package metallization can be performed. In process unit 700-1 can be sputter coated with a combination of metals, including, for example, titanium NIV, and gold. This will help to promote a chemical bond between the in-process unit 700-1 and the TIM 780 (as will be discussed in more detail below).

Figure 14B:
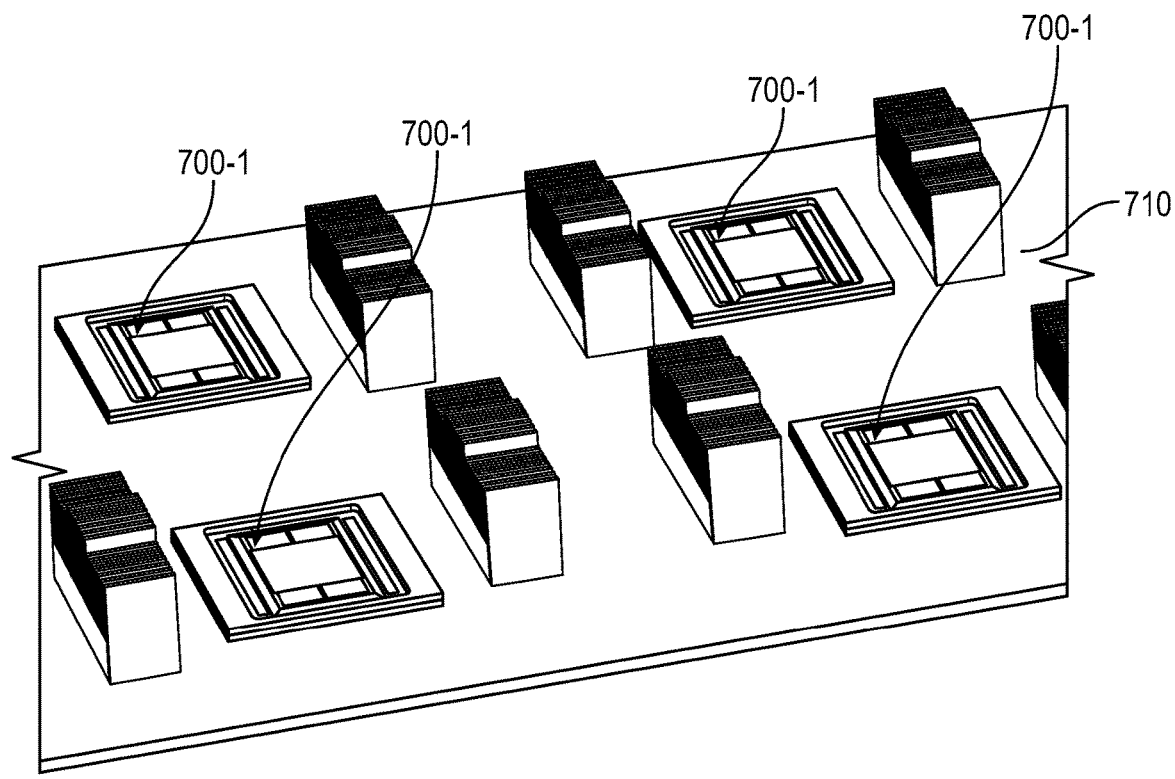
FIG. 14B is a perspective view of a plurality of in-process units attached to an example server tray according to aspects of the disclosure.

Multiple in-process units 700-1 can be applied to a printed circuit board, such as a server tray 710. In one example, as shown in FIG. 14B, after metallization, each in-process unit 700-1 may be reballed for solder, and then reflowed to attach and bond each in-process unit 700-1 to server tray 710.

Figure 14C:
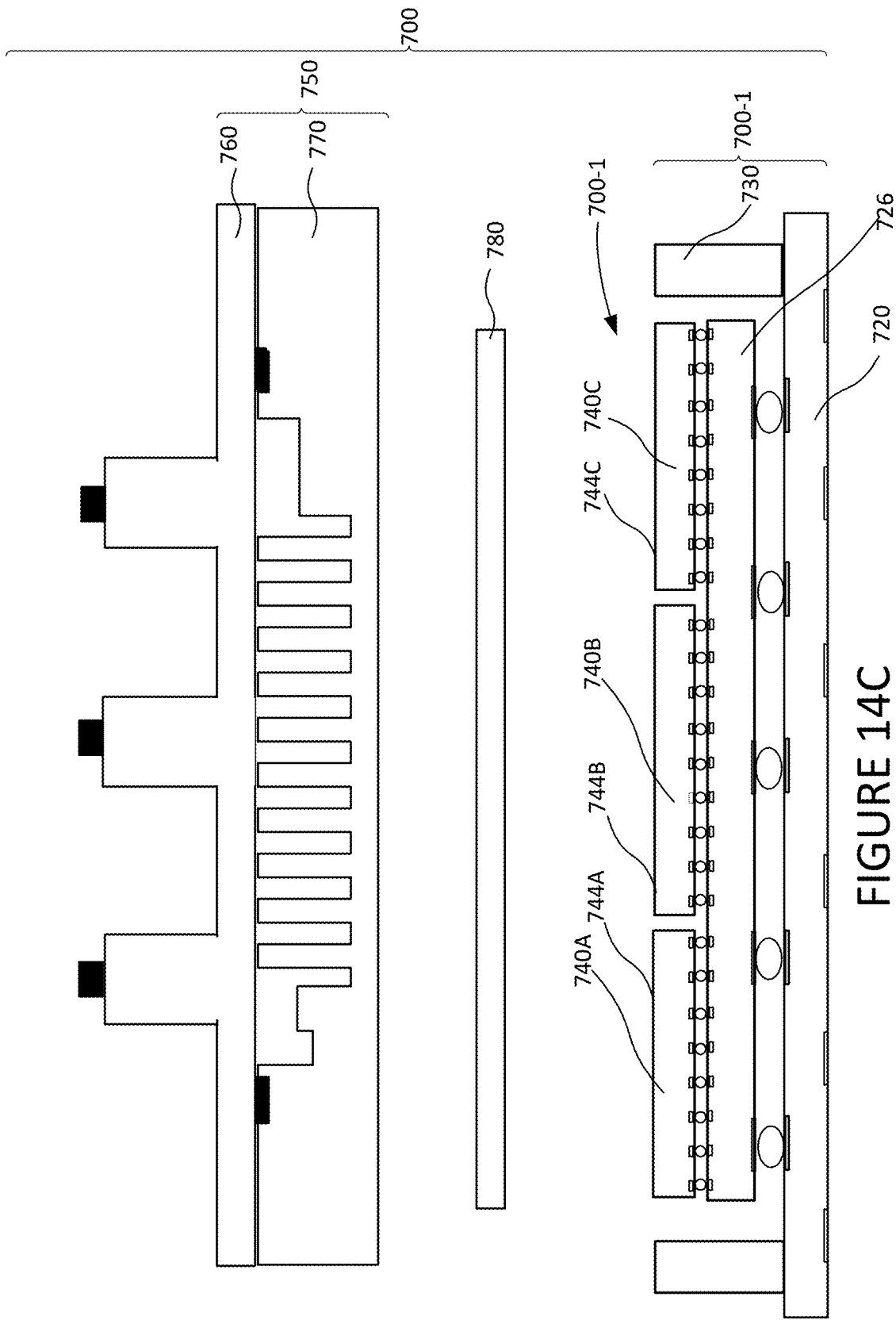
FIG. 14C is an exploded view of an example chip assembly according to aspects of the disclosure.

The next phase of the process, as previously discussed, is to attach the cold plates to each of the respective in-process units 700-1. FIG. 14C illustrates an exploded view of an example completed assembly 700 to facilitate the discussion. In one example, TIM 780, such as a high k TIM disclosed herein, may be directly applied to rear surfaces 744A, 744B, 744C of chips 740A, 740B, 740C, and then cold plate 750 (which in this example can include cold plate base 760 and cold plate lid 770) can be attached to in-process unit 700-1. In another example, TIM 780 can instead be pre-reattached to cold plate base 760 by reflowing TIM 780 (before secondary reflow to chip) or alternatively, attaching TIM 780 to cold plate base 760 through an adhesive or similar material that can secure TIM 780 in place prior to reflow. Other methods can also be implemented. Some example methods of attachment will be discussed in more detail below.

Figure 15:
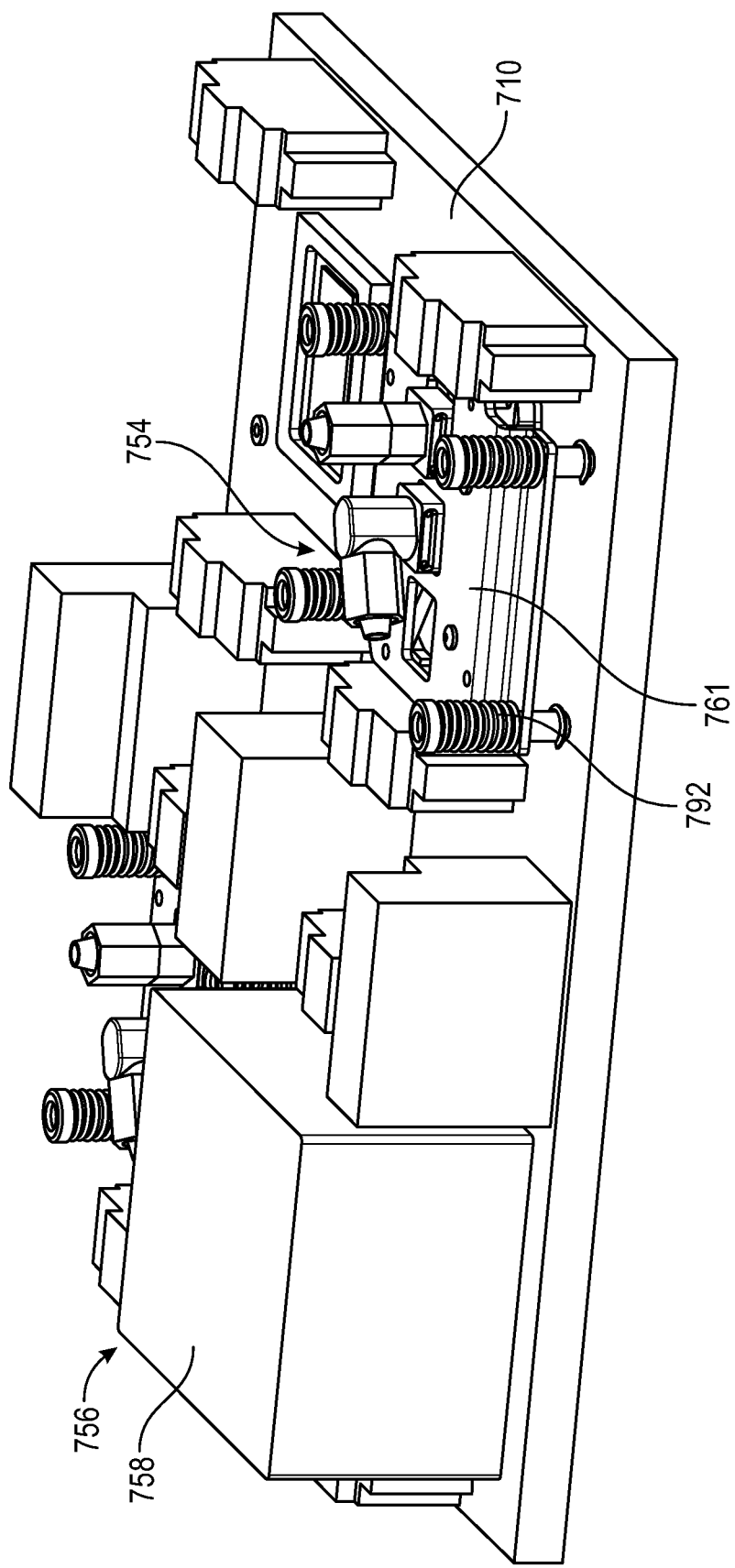
FIG. 15 is a perspective view of a server tray utilizing different example compression components according to aspects of the disclosure.
Figure 16A:
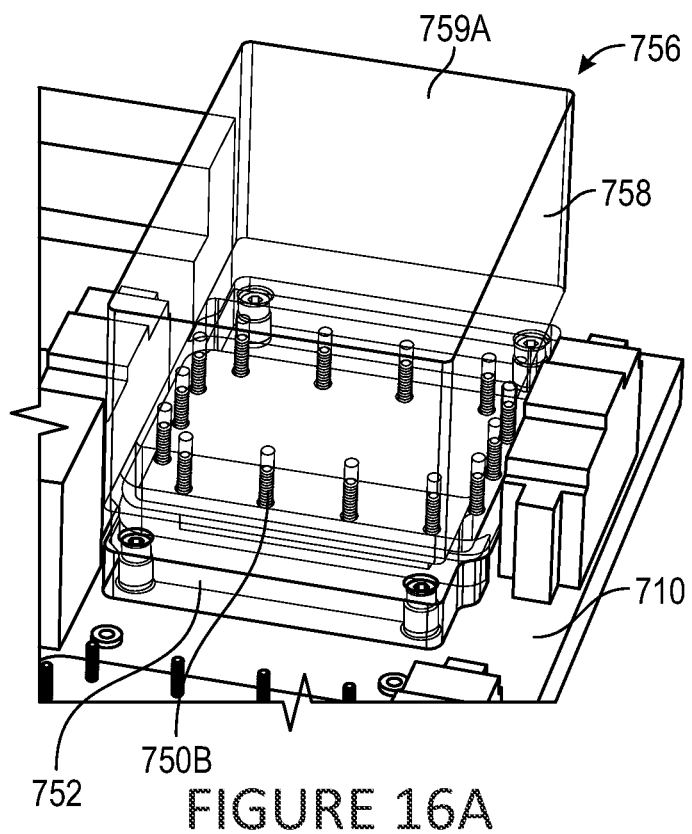
FIGS. 16A-16B and 17A-17B illustrate example compression components according to aspects of the disclosure.
Figure 16B:
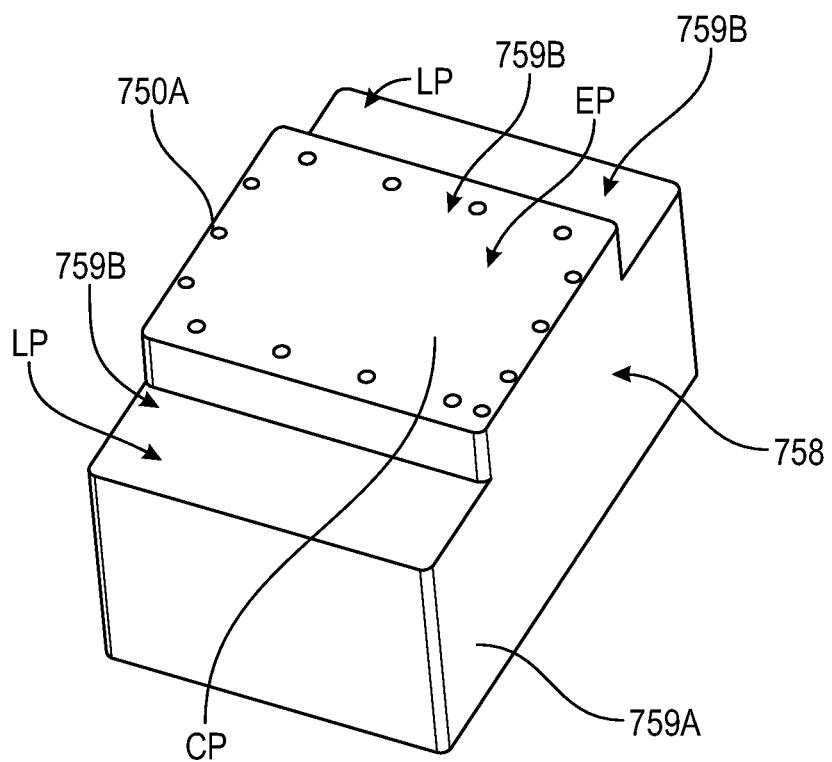
Figure 17A:
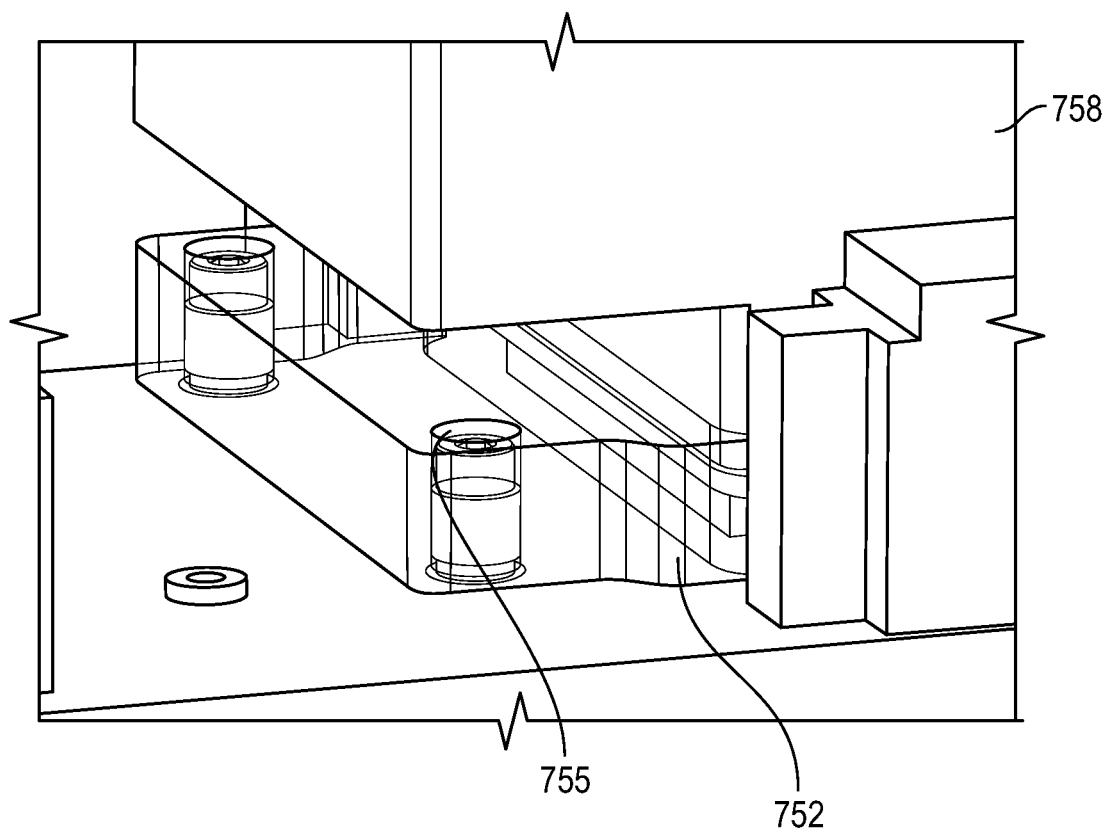
Figure 17B:
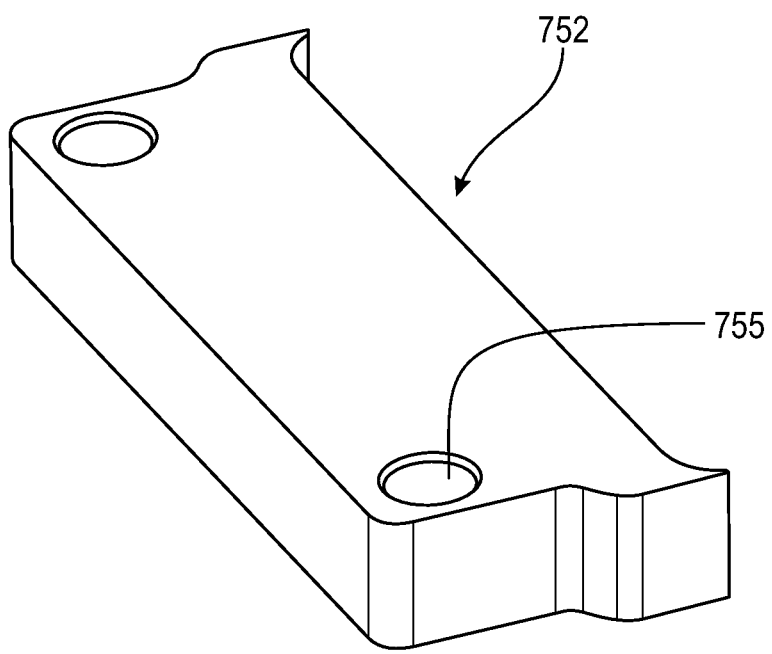

TIM can be provided on one or more of the rear surfaces 744A. 744B, 744C of respective chips 740A, 740B, 740C using different methods. FIG. 15 illustrates server tray 710 showing two example compression methods and example structures (754,756) for attaching a cold plate to the in-process unit 700-1.

In one example 756, a weight 758 may be applied over the in-process unit 700-1 (or any unit undergoing reflow), which will allow for the weight of gravity to provide a compressive force onto TIM 780 (FIG. 14C) during reflow. As shown in the enlarged views of FIG. 16A, which shows weight 758 in transparent form for illustration and discussion purposes, and FIG. 16B, weight 758 may be a solid monolithic block of material. Weight 758 may alternatively be formed from multiple portions joined together and/or include portions that are not solid. The weight can take on a variety of shapes, sizes and configurations. In one example, weight 758 includes a top surface 759A, which in this example is shown as a continuously planar surface, but in other examples, the top surface 759A may vary. An opposed bottom surface 759B of weight 758 can further include an extended portion EP centrally located along the bottom surface 759B. The extended portion EP may extend beyond two lower portions LP. The extended portion EP may be substantially planar so as to allow for a uniform force or pressure to be applied to the in-process unit 700-1. In other examples, the extended portion EP may be omitted, such that the resulting bottom surface of weight 758 may be a continuous and substantially planar surface. In still other examples, the extended portion EP may not extend across an entire rear surface of the in-process unit 700-1 and may instead by configured so that it overlies only portions of the in-process unit. The weight 758 can be comprised of a variety of materials, but in one example, weight 758 is formed from stainless steel. Weight 758 can be any designated or desired amount of weight, but in one example, the weight is 5 kg. In other examples, the weight may be greater than or less than 5 kg. Weight 758 may include recesses 750A configured to receive bores or studs 750B that may be provided on and extend away from the cold plate. The bores or studs 750B can guide weight 758 to ensure proper placement of weight 758 over the in-process unit 700-1. Additionally, as better seen in FIGS. 17A and 17B, a fixture 752 can also be provided directly adjacent the base of weight 758 and in-process unit 700-1. The fixture 752 can include recesses 755 adapted to receive spacers or bolts on the tray 710.

The weight may be removable or mechanically attached to the circuit board. For example, the weight may be directly attached to the circuit board with a mechanical fastener (not shown), such as screws or bolts. Additionally or alternatively, the weight may be coupled or attached to a secondary fixture that can control movement and positioning of the weight. In such an example, the secondary fixture can position the weight to overlie the chip assembly and then apply pressure to the weight and the chip assembly during the reflow process.

At the conclusion of the reflow process, the weight may be removed.

Utilizing a weight 758 to secure the high k TIM to rear surfaces 744A, 744B, 744C of the chips 740A-740C can help provide even load distribution, large thermal mass, and consistent load during reflow. Weight 758 can then be removed at the conclusion of reflow.

Figure 18:
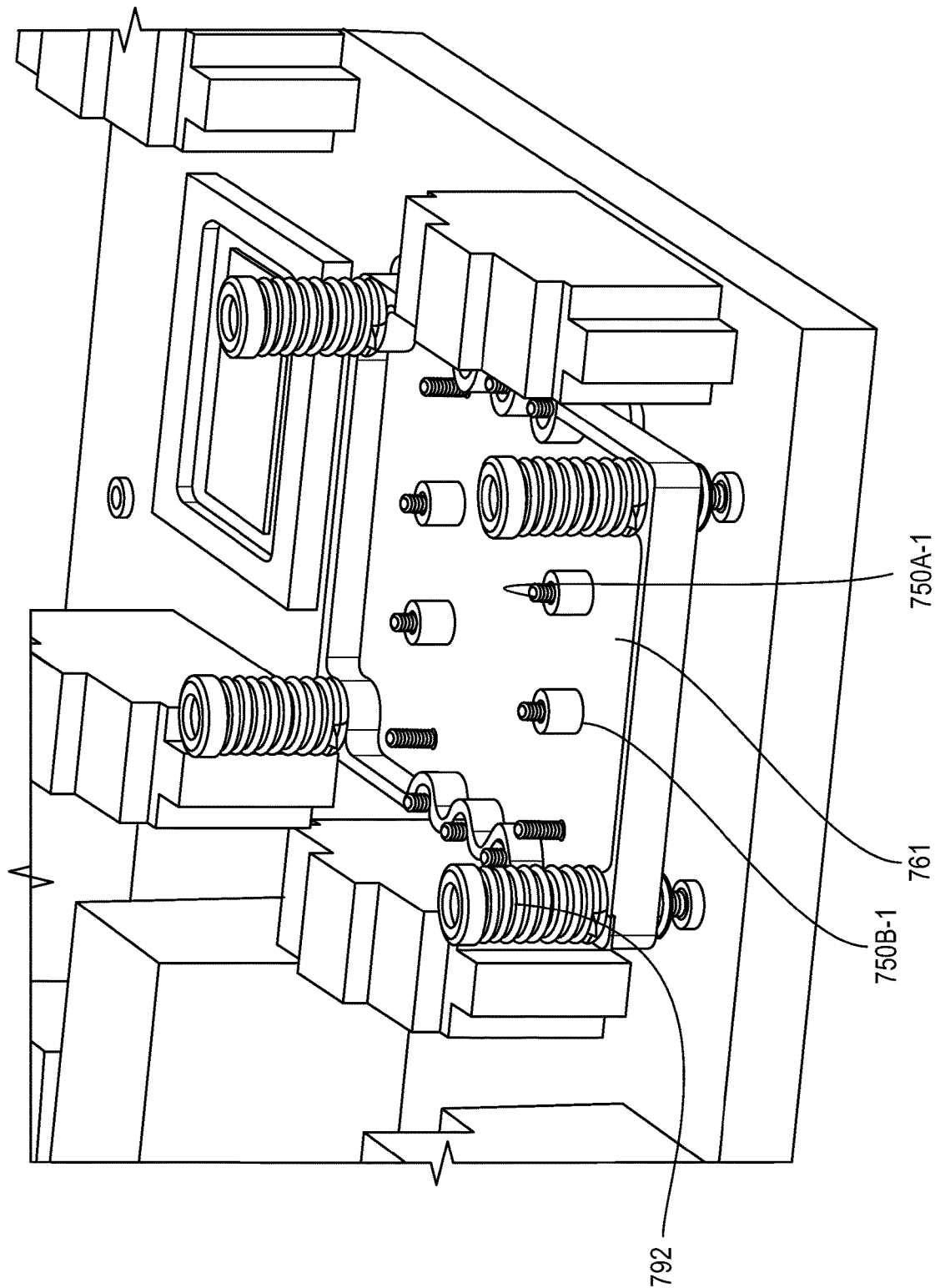
FIG. 18 illustrates another example compression component according to aspects of the disclosure.

In another example 754, with reference to FIGS. 15 and 18, a compression plate 761 with spring connections 792 can be used to help provide a compressive force during reflow. As best shown in the enlarged view of FIG. 18, a compression plate 761 is a plate that overlies and exerts a force on an in-process unit, such as in-process unit 700-1. Compression plate 761 may be a rigid plate that is machined to provide a desired thread offset. Compression plate 761 may take on a variety of shapes and sizes provided compression plate 761 can apply a compressive force onto the in-process unit 700-1. Four spring assemblies may be positioned at each of the four corners of the compression plate 761. Springs 792 can help to accommodate differences in force. Compression plate 761 may similarly include apertures 750B-1 configured to receive bores or posts 750A-1 that will place compression plate 761 into the proper position overlying the in-process chip assembly, and also prevent compression plate 761 from moving in a lateral direction.

Example Tray Level Cooling Loops

Figure 19:
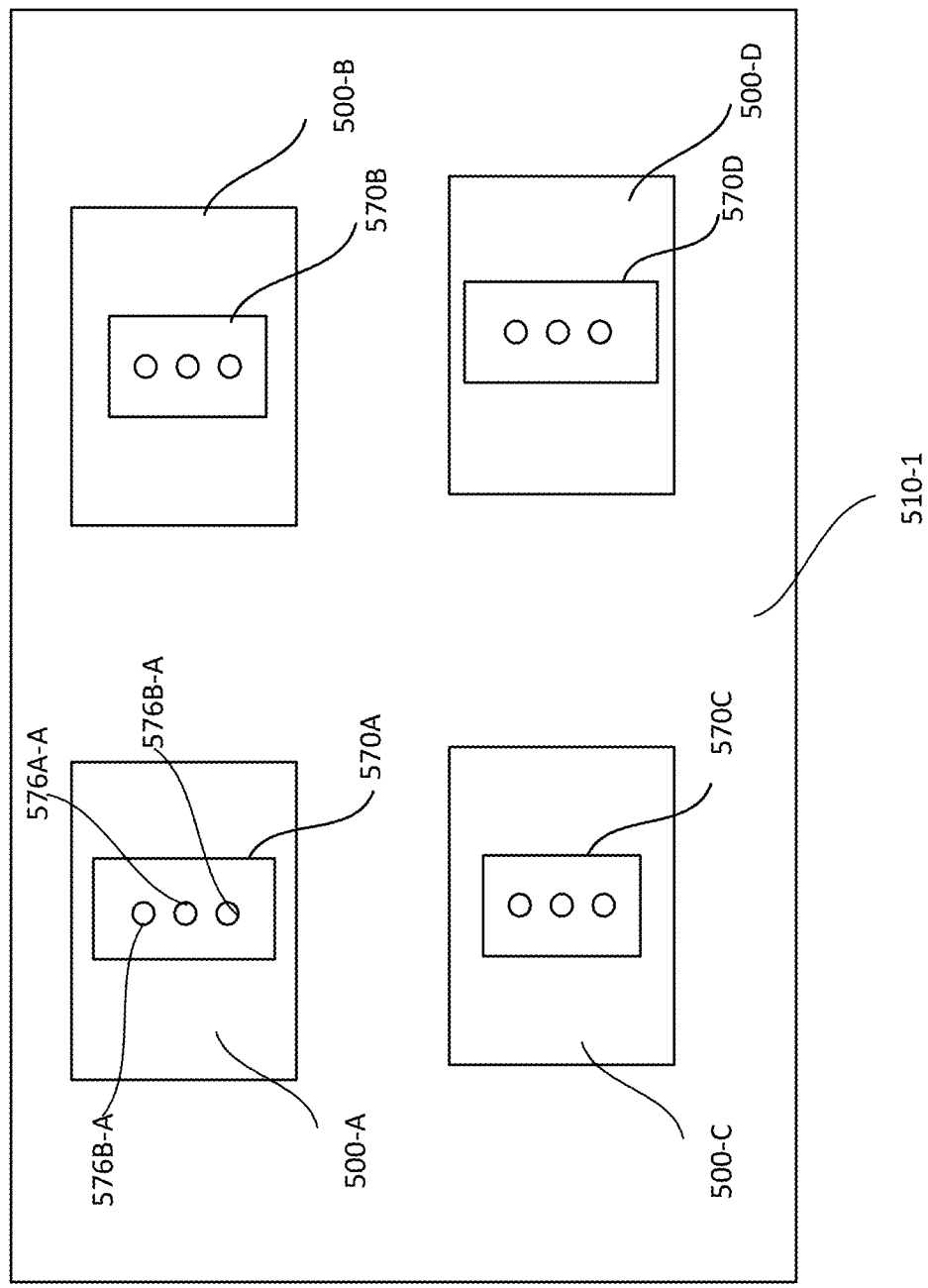
FIG. 19 is a schematic top plan view of the chip assembly of FIG. 12I.
Figure 20:
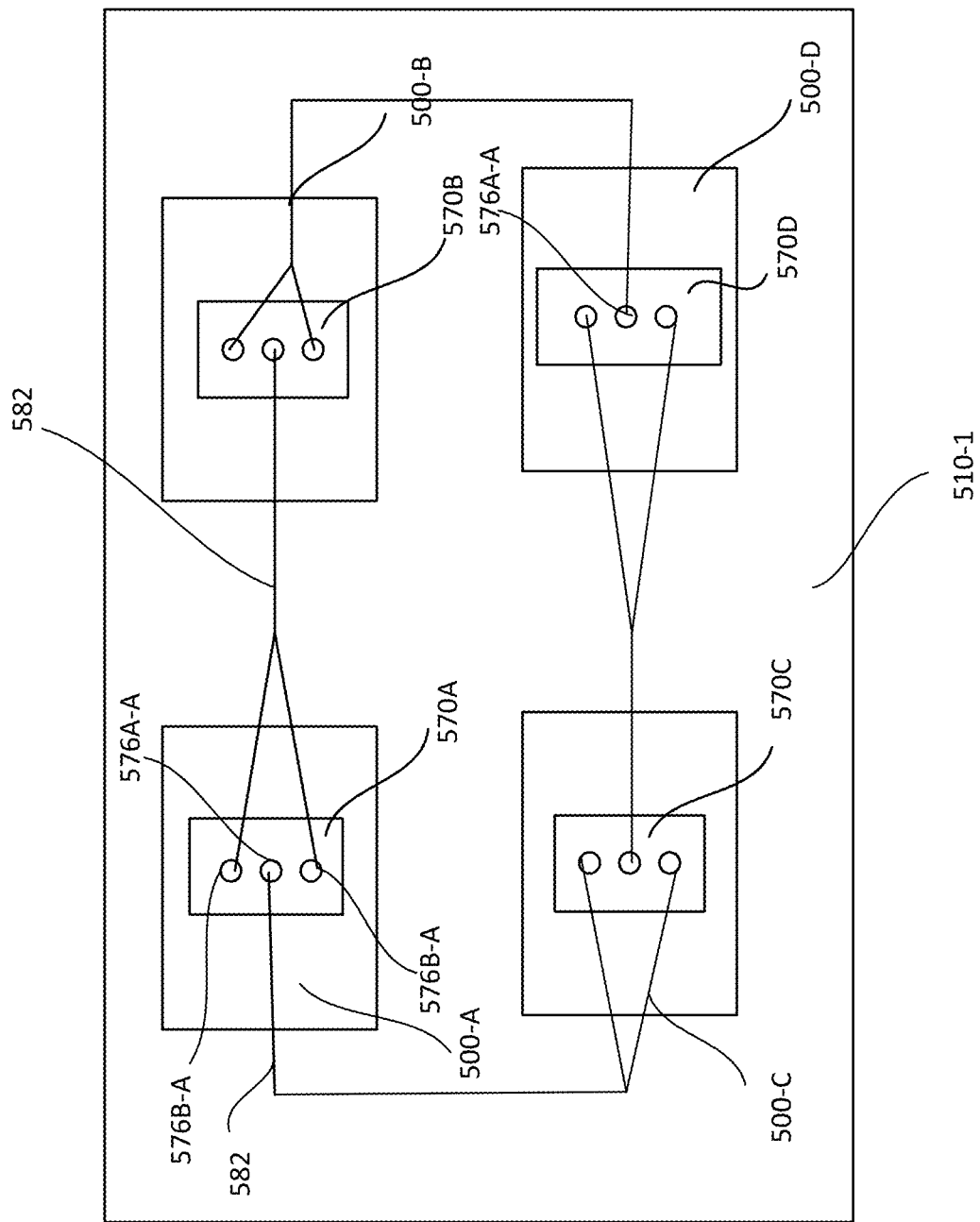
FIG. 20 is a schematic top plan view showing example cooling loop connections.

With reference to FIG. 19 (as well as reference back to FIGS. 12A-12I), a schematic top view of four chip assemblies 500-A, 500-B, 500-C, 500-D mounted on a printed circuit board, such as server tray 510-1, is shown. The configuration of assemblies 500-A, 500-B, 500-C, 500-D can be identical to the chip assembly 500 shown in FIG. 12H, except that the printed circuit board is instead a larger circuit board, such as server tray 510-1, and is configured to accommodate multiple rows and columns of chips assemblies 500-A, 500-B, 500-C, 500-D. As shown, each cold plate lid 570A, 570B, 570C, 570D includes an inlet and a pair of outlets. For example, cold plate lid 570A includes inlet 576-A-A and outlets 576B-A on opposite sides of inlet 576-A-A. In this example, only four chip assemblies are shown, but any number of chip assemblies may be used and may be arranged on server tray 510-1.

When configuring the chip assemblies 500-A, 500-B, 500-C, 500-D, in one example, the cold plate base of each of the chip assemblies 500-A, 500-B, 500-C, 500-D may first be bonded (not shown) to the respective chip assemblies or in-process units that are attached to the server tray 510-1. In one example, final assembly of the cold plate lids can occur sequentially. For example, cold plate lid 570A can first be attached to the cold plate base (not shown) within assembly 500-A. Cold plate lid 570B can then be attached to the cold plate base (not shown) of assembly 500-B; cold plate lid 570C can then be attached to the respective cold plate base (not shown) within assembly 500-C; and finally, cold plate lid 570D can then be attached to its respective cold plate base (not shown) within assembly 500-D. The order of assembly can, of course, vary. Alternatively, two or more of the cold plate lids 570A, 570B, 570C, 570D can be attached at the same time. In still other examples, the cold plate lids 570A, 570B, 570C, 570D can be attached in any order.

Figure 21:
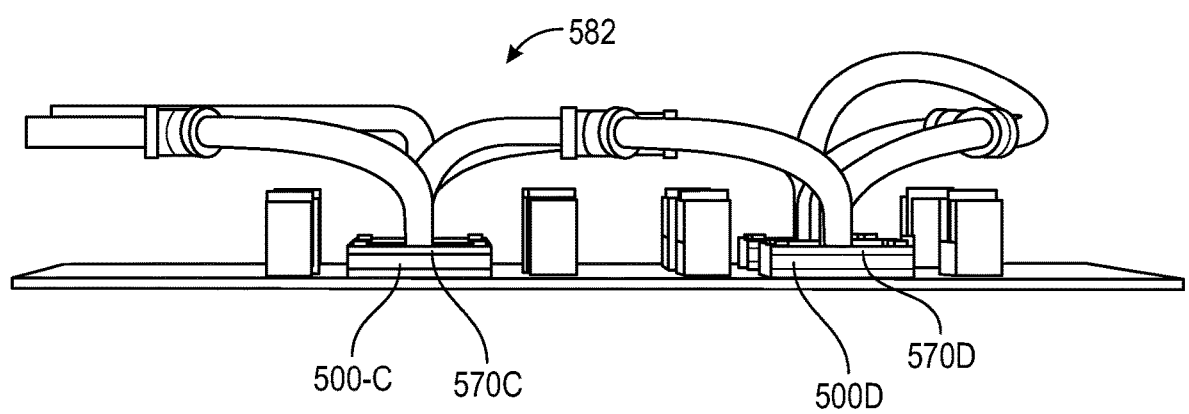
FIG. 21 is a side plan view of example components shown in FIG. 20.

Once the respective cold plate lids are attached, they can be connected together in a plumbing and cooling loop. With reference to the schematic view of FIG. 20, cold plate lids 570A, 570B, 570C, 570D can be connected together via a continuous piping loop or cooling loop 582, which allows for fluid, such as water, to flow through the cold plate system. For example, with reference to assembly 500-A, loop 582 is first connected to inlet 576A-A, which will allow fluid, such as water, to flow into the cold plate of assembly 570A and then exit assembly 570A through outlets 576B-A on opposed sides of inlet 576A-A. This same pattern of loops 582 will continue through each remaining assembly 500-B, 500-C, and 500-D. An example three-dimensional side view of loops 582 overlying assemblies 500-C and 500-D is illustrated in FIG. 21.

Figure 22:
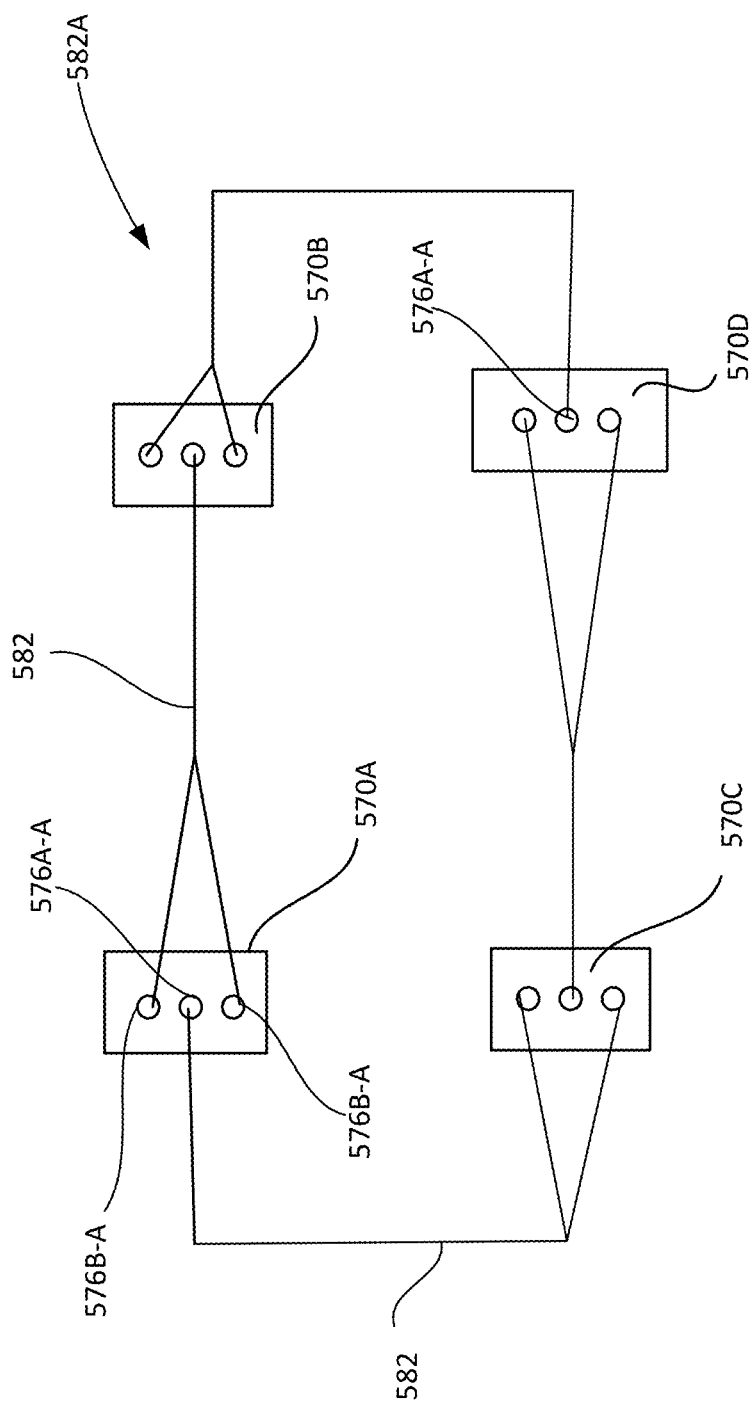
FIG. 22 is a schematic top plan view of example cold plates joined together in an example cooling loop according to aspects of the disclosure.

In another example shown in FIG. 22, prior to attaching cold plate lids 570A, 570B, 570C, 570D to their respective cold plate bases, the cooling loop 582 can first be attached to each of the cold plate lids 570A, 570B, 570C, 570D. This allows for formation of a cooling loop unit 582A, comprising cold plate lids 570A, 570B, 570C, 570D and cooling loop 582, that can then be attached to the respective cold plate bases 560. Once the entire pre-connected loop assembly 582 is formed, pre-connected loop and the cold plate lids 570A, 570B, 570C, 570D can be directly attached to respective cold plate bases to complete the respective chip assemblies.

In still another example, instead of first attaching cold plate bases to TIM and rear surfaces of chips, cold plate bases and cold plate lids 570A, 570B, 570C, 570D can first be joined together, along with a pre-assembled cold plate loop 582. Once assembled, the combination cold plate base, cold plate lid, and cold plate loop can be directly attached to the rear of chips 540A-540D as a single unit.

Additional three-dimensional (3D) views and examples of cooling loop assemblies are shown in FIGS. 23A-23C, 24A-24B, and 25. These figures illustrate components of a system prior to reflow and attachment of the cold plate lid to the in-process unit. In particular, the assembly illustrates components of the cold plate and cooling loop assembly, as well as the compression device prior to soldering of the cold plate base to the assembly. In each example, the example in-process units, such as previously discussed herein, are shown already being soldered to a circuit board (see, e.g., FIG. 12D), such as a server tray assembly. FIGS. 23A-25 illustrate example methods of assembly where the cold plate base will be assembled and attached to the in-process unit and circuit board. In some examples, the cold plate base may be bonded to the in-process unit and circuit board using a high thermally conductive material prior to attachment of the cold plate lid and cooling loop. Alternatively, the cold plate base may be attached to either or both the cold plate lid and/or cooling loop, prior to being bonded to the in-process unit and circuit board. For ease of discussion, the same reference numerals will be used to discuss the same components throughout each of FIGS. 23A-23C, 24A-24B, and 25.

FIG. 23A provides an example exploded view showing components of a system prior to reflow and attachment of the cold plate to the in-process unit. In this example, each cold plate base is first bonded (not shown) to the in-process unit, including chip, and circuit board, with the use of any thermally conductive material, including a solder; thereafter, the cold plate lid may be assembled to the cold plate base and chips; and the cooling loop may then be assembled to each respective cold plate lids.

As previously discussed herein, a cold plate base may first be bonded to an in-process unit. For example, a high thermally conductive material, such as solder or the like, can be used to attach each cold plate base 860 to each of the respective in-process units 800-A, 800-B, 800-C, 800-D, which can result from direct attachment of the cold plate base 860 to the rear surfaces of chips (not shown) of each in-process unit 800-A, 800-B, 800-C, 800-D. Bonding can occur using any desirable material. In one example, a high thermally conductive material or ultra-high thermally conductive material, such as those discussed or to be discussed herein, may be utilized. Thereafter, the rest of the cold plate assembly can be mounted to the base. For example, each cold plate lid 870 may be attached to base 860 overlying each respective in-process unit 800-A through 800-D, along with a compression plate assembly 867, which further includes compression plate 861, springs 892, and openings 863 to accommodate connections to the cooling loop 882). Thereafter, a cooling loop 882 may be attached. As shown, the cooling loop 882 can include a flexible hose 882A and an interconnection and sealing pipe and fitting 883, such as British Standard Pipe Parallel ("BSPP") thread fittings with an o-ring face seal. Enlarged view of an example fitting 883 is also shown. Other fittings, configurations, and the like can be utilized in connection with this manufacturing process.

Figure 23B:
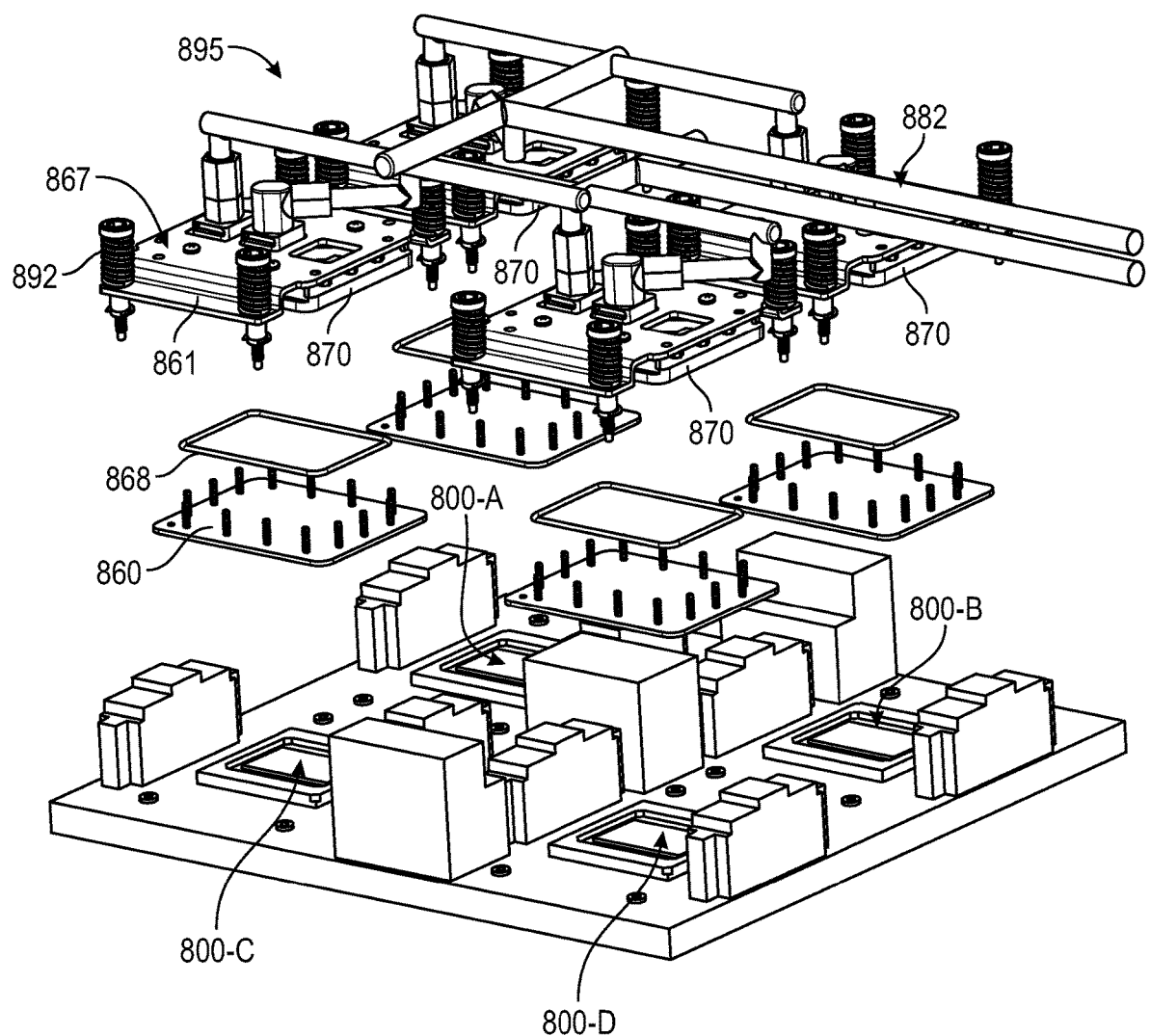
FIG. 23B is an exploded view of example components of an example cooling assembly prior to being bonded with an example chip package, according to aspects of the disclosure.
Figure 23C:
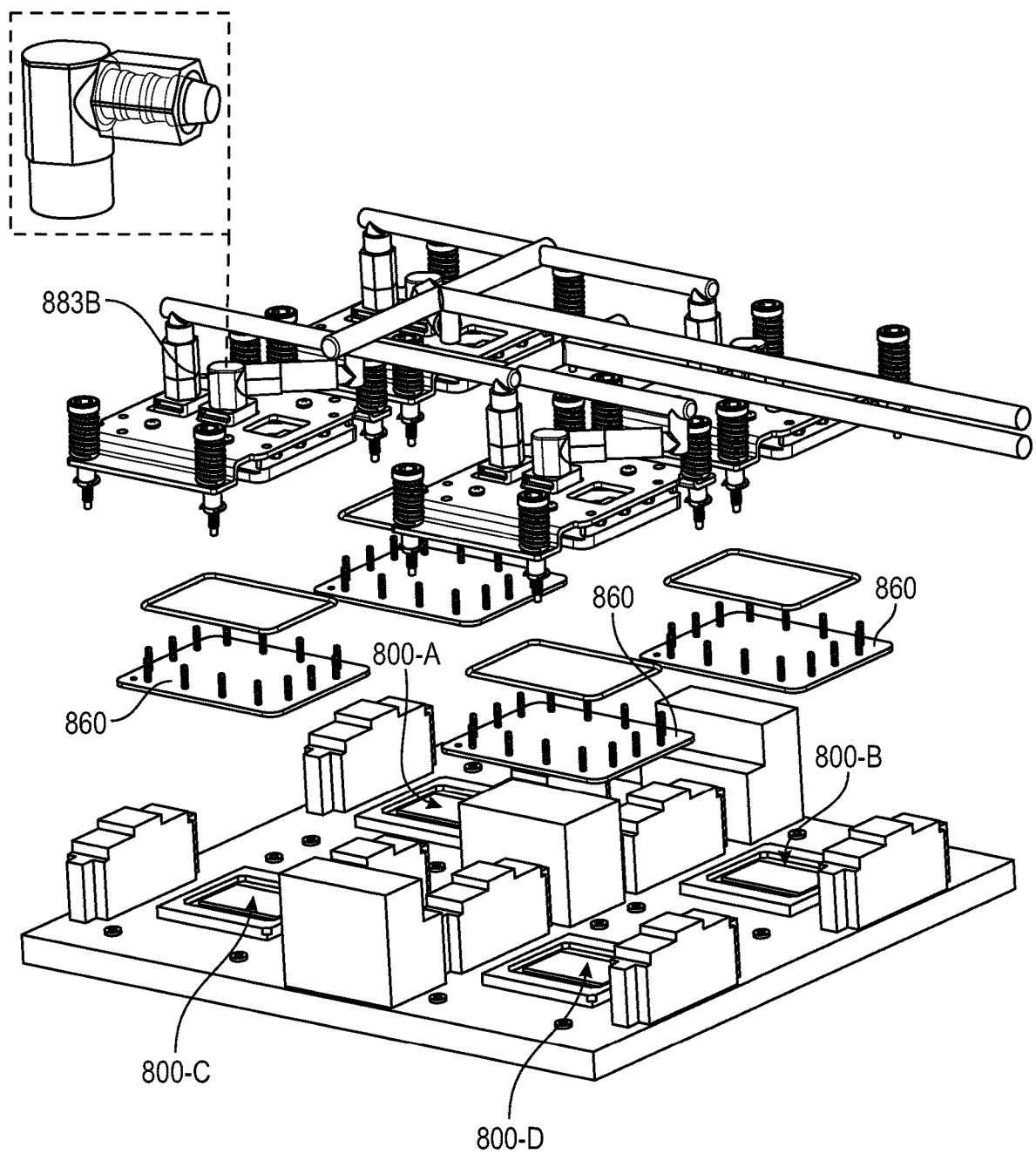
FIG. 23C is an exploded view of example components of an example cooling assembly prior to being bonded with an example chip package, according to aspects of the disclosure.

FIG. 23B is identical to FIG. 23A, except for the method and order of assembling the components. FIG. 23B provides for another example where a cold plate base 860 is first bonded (not shown) to each of the respective in-process units 800-A, 800-B, 800-C, 800-D, and then respective cold plate lids 870, cooling loop 882, and compression plate assembly 867 (which includes compression plate 861 and springs 892) are attached thereafter. In this example, however, cooling loop 882 can first be pre-attached directly to the inlets and outlets of cold plate lids 870 to form a subassembly 895 that includes lid 870, cooling loop assembly 882, and compression plate assembly 867. Subassembly 895 can then be directly attached to each cold plate base 860, which is already attached to the respective in-process units 800-A, 800-B, 800-C, 800-D. Alternatively, in an otherwise identical configuration to FIGS. 23A and 23B, FIG. 23C illustrates an example which utilizes a barb fitting 883B, instead of a BSPP fitting. The remaining components can be identical to the prior example, as shown by the similar numbering. In still other examples, different types of fittings may be utilized to form a connection between the cooling loop and the inlets and outlets of the cold plate.

Figure 23D:
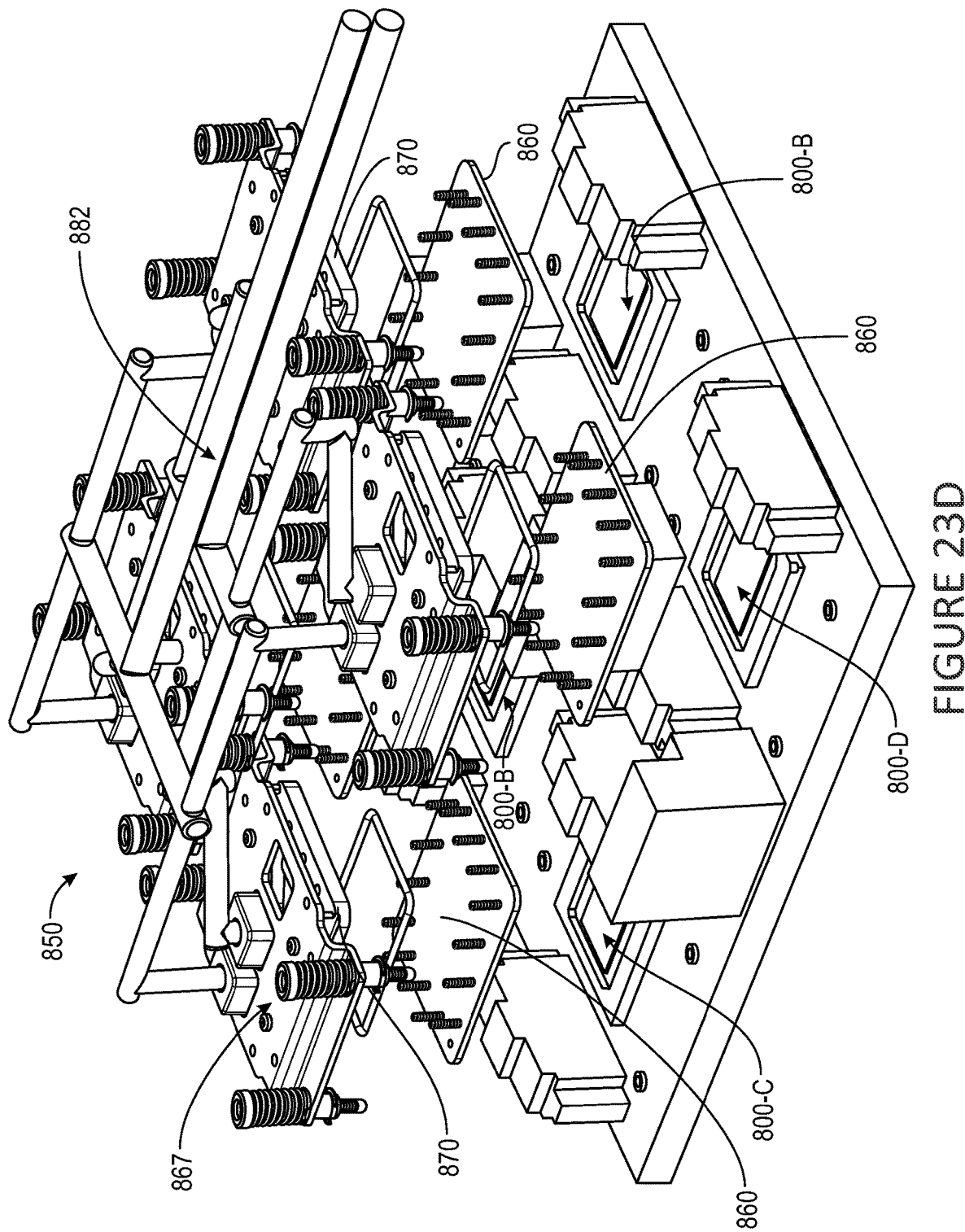
FIG. 23D is an exploded view of example components of an example cooling assembly prior to being bonded with an example chip package, according to aspects of the disclosure.

FIG. 23D is another example where each cold plate bases 860 is first bonded to the in-process units 800-A, 800-B, 800-C, 800-D. A subassembly, including cold plate lid 870, compression assembly 867, and cooling loop 882 may be first and separately attached together as a modular unit or subassembly 850, which is then attached as a completed subassembly 850 to cold plate base 860. This example is otherwise similar to FIG. 23C to the extent that the lid 870 and cooling loop 882 are pre-assembled together prior to attachment to cold plate base 860. However, in this example, cooling loop 882 is brazed to cold plate lid 870 (along with compression assembly 867), and then joined to cold plate base 860. In other examples, cooling loop 882 may be attached to cold plate lid 870 using various alternative methods and configurations.

Figure 24A:
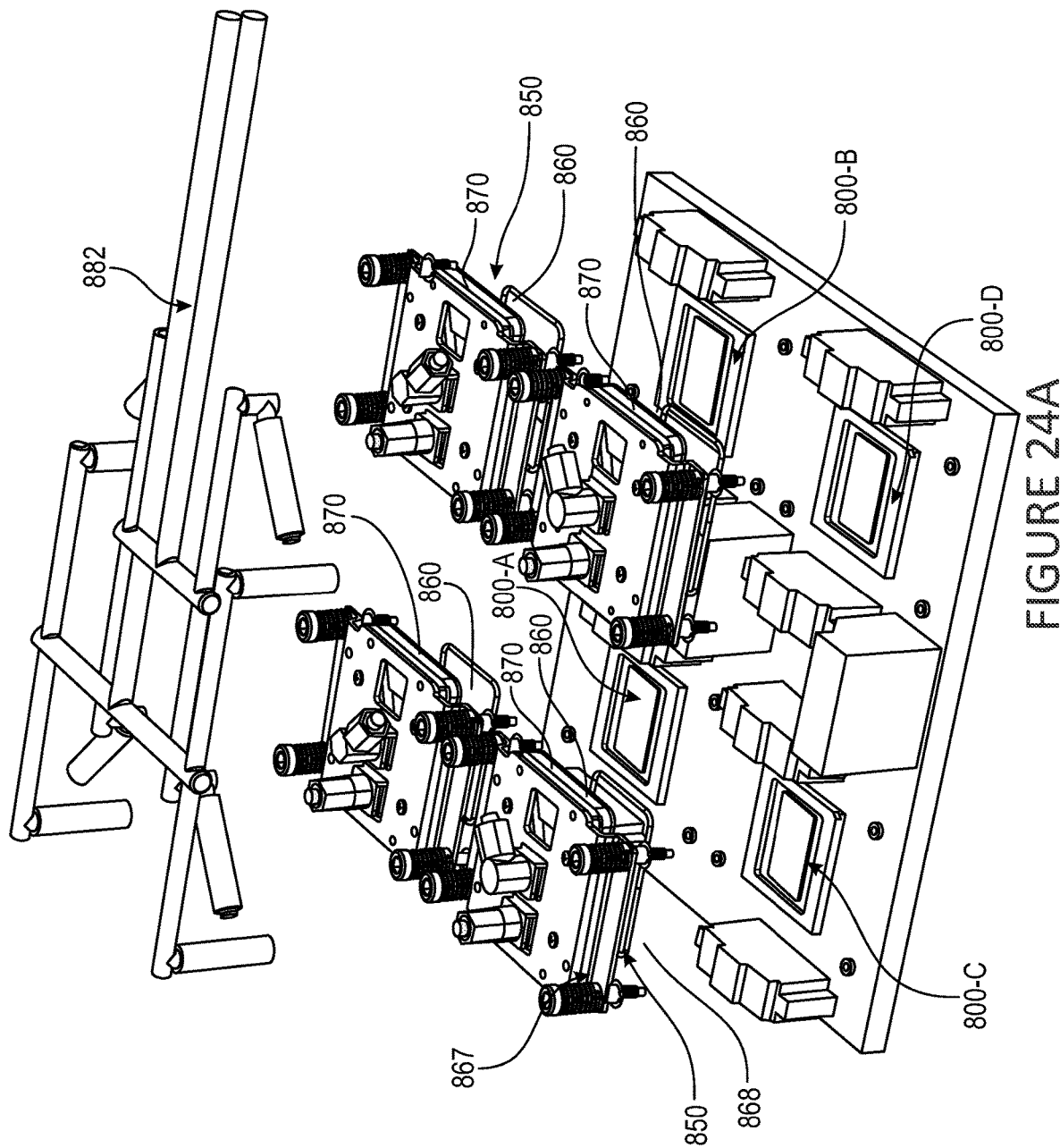
FIG. 24A is an exploded view of example components of an example cooling assembly prior to being bonded with an example chip package, according to aspects of the disclosure.

FIG. 24A illustrates an example where the cold plate lid 870, cold plate base 860, and compression assembly 867 are first joined together as a subassembly 850. As in the previous examples, this can optionally include assembly of o-ring 868. Each subassembly 850 can then be bonded to the in-process unit 800-C and tray 810 using a thermally conductive interface material, including the use of solder to solder the subassembly 850 to each of the in-process units 800-A, 800-B, 800-C, 800-D. In one example, as previously discussed, each base 860 of each subassembly 850 can be bonded to the respective in-process units 800-A, 800-B, 800-C, 800-D using a high thermally conductive interface material, as previously discussed herein. Thereafter, cooling and plumbing loop 882 may be attached to lid 870. In other examples, the cold plate may be a single unitary cold plate that is not separately formed with both a lid and base.

FIG. 24B is identical to the example of FIG. 24A, except that in the subassembly 850B, an o-ring is not utilized in connection with the joinder of the cold plate base 860 and lid 870. Instead, the cold plate base 860, cold plate lid 870, and compression assembly 867 are brazed together without the use of an o-ring. Once joined together, each subassembly 850 can then be joined to each respective in-process unit 800-A, 800-B, 8000-C, 800-D, as previously discussed. Cooling loop 882 can then be joined to subassembly 850.

Figure 25:
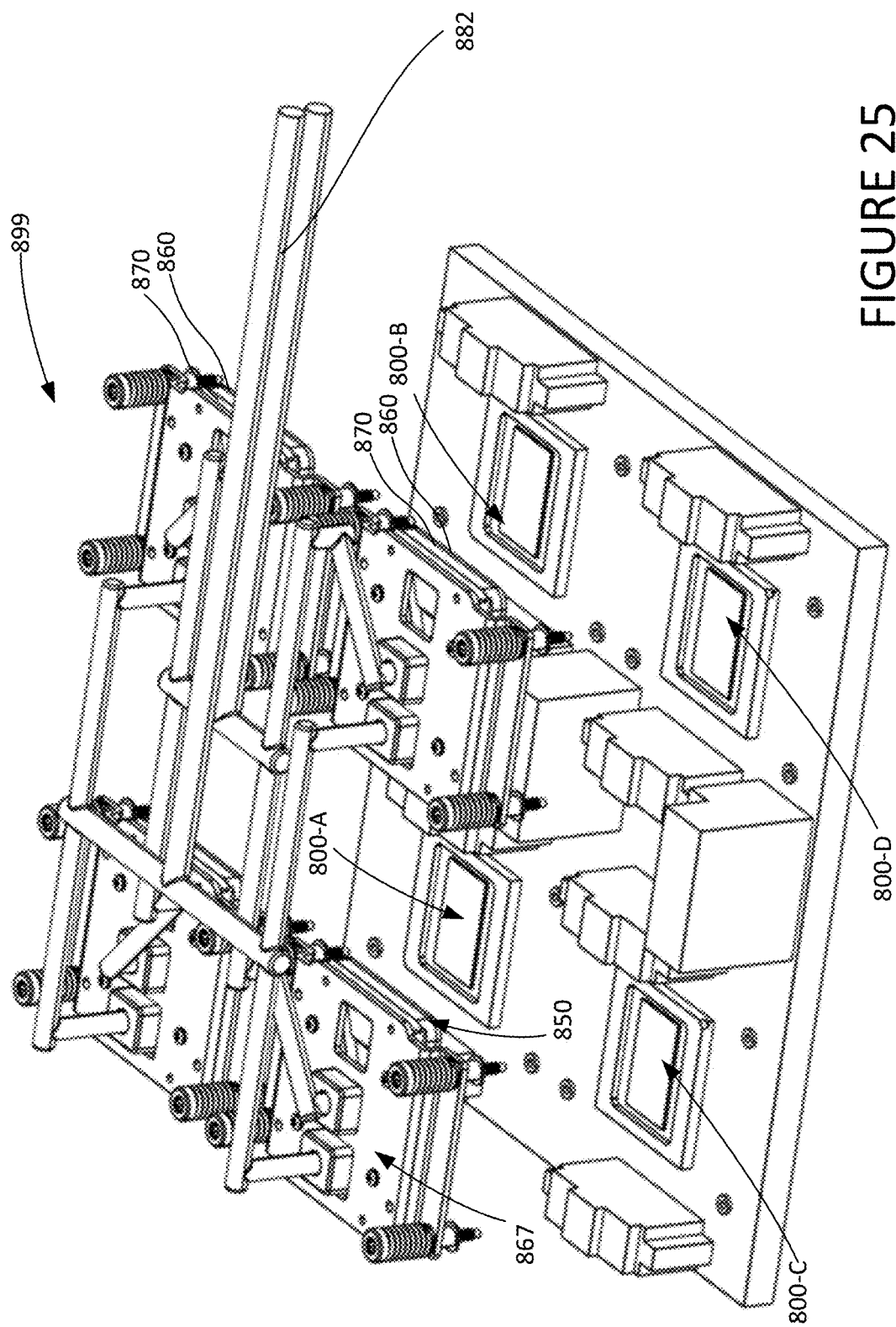
FIG. 25 is a view of example components of an example cooling assembly prior to being bonded with an example chip package, according to aspects of the disclosure.

FIG. 25 illustrates an example exploded view where the entire cooling loop 882, cold plate assembly 850 (including cold plate lid 870 and cold plate base 860), and compression plate assembly 867 are pre-attached together to form a completed cooling unit 899. In this example, cooling loop 882 is brazed to the cold plate lid so as to form a completed cooling unit 899, although other forms of connection are contemplated within the scope of this disclosure. Then, the cooling loop 882 and each of the cold plate bases may be attached and bonded to each of the respective in-process units 800-A, 800-B, 800-D, 800-C, 800-D.

It is to be appreciated that in these examples, differing types of in-process units and components may be attached to the circuit board 810.

Example Materials Comprising the Cold Plate

As an alternative to the methods and structures described above and to be described below, or in addition to the methods and structures described above or to be discussed below, forming the cold plate from select materials can improve heat distribution. For example, selecting an ultra-high thermally conductive (k) material to comprise the cold plate can provide optimal results. In some examples, an ultra-high thermally conductive (k) material with a coefficient of thermal expansion ("CTE") that matches the silicon in the semiconductor chips can be used to manufacture the cold plate or portions of the cold plate. In other examples, selection of a material having a thermal conductivity greater than copper (394 W/mK at 20 C) can help to provide optimal heat distribution. For example, silver diamond (AgD) (900 W/mK), which has a significantly greater thermal conductivity than the thermal conductivity of copper (394 W/mK), is one example of an ultra-high thermally conductive (k) material. In other examples, other ultra-high thermally conductive materials having a thermal conductivity greater than copper (394 W/mK) can be utilized. The selection of an ultra-high thermally conductive material to comprise the cold plate, alone or in combination with TIM and/or the structures, such as those disclosed herein, can help to provide optimal heat distribution in a chip assembly.

For ease of discussion, reference will be made to the example chip assembly of FIG. 1, in which cold plate 150 is attached to chips 140A, 140B, 140C through TIM 180. But it is to be appreciated that the selection of materials for the components is not limited to the structure of FIG. 1 or any one of the other figures disclosed herein. For example, a cold plate may be a monolithic cold plate base and lid combined together; cold plate base may not include fins, and fewer than three chips or more than three chips can be utilized within a chip package.

In one example, cold plate base 160 is formed from an ultra-high k thermally conductive material that has a CTE matching at least one of the semiconductor chips 140A, 140B, 140C. The high k material enables greater thermal performance through heat spreading. This same material can be used to manufacture fins 166 of base 160 of cold plate. To attach base 160 of cold plate 150 to chips 140A-140C, as previously discussed, base 160 of cold plate 150 can be attached to the rear of chips 140A, 140B, 140C with a TIM, such as grease, solder, or other materials.

In another example, cold plate base 160 may be comprised of an ultra-high thermally conductive material. In some examples, the ultra-high thermally conductive material may have a thermal conductivity greater than copper (394 W/mK at 20° C.). Such materials can comprise AgD or any other ultra-high k material or combinations of materials. Fins 166 and lid 170 may be formed of a different material having a lower thermal conductivity than the ultra-high thermally conductive material forming cold plate base 160. In some examples, the fins 166 may be soldered, plated, or 3D printed onto base 160. To attach cold plate base 160 to chips 140A-140C, as previously discussed, base 160 of cold plate 150 can be attached to the rear of chips 140A, 140B, 140C with a TIM, such as grease, solder, or other materials.

In another example, cold plate base 160 and fins 166 are formed from the same ultra-high k thermally conductive material. In some examples, the ultra-high thermally conductive material may have a thermal conductivity greater than copper (394 W/mK at 20° C.). Such materials can comprise AgD or any other ultra-high k material or combinations of materials. For example, base 160 and fins 166 may be an integral unit. Lid 170 may instead be formed from a different material. To attach cold plate base 160 to chips 140A-140C, as previously discussed, cold plate base 160 can be attached to the rear of chips 140A, 140B, 140C with a TIM, such as grease, solder, or other materials.

Simulations were conducted in which TIM thickness used to attach cold plate to chips 140A-140C was varied, as well as the materials forming the cold plate base and cold plate fins. Optimal results were achieved using an ultra-high k or thermally conductive cold plate base formed from silver diamond, bonded to chips 140A, 140B, 140C with a TIM 180 having a thickness of 200 microns. Such configuration can support a chip heat flux of 7.2 W/mm$^2$ at 95 degree Celsius junction temperature. Other examples and combinations using silver diamond as the material forming at least a portion of the cold plate are shown in the chart of FIG. 26.

FIG. 26 shows a comparison between using copper (high K) as the base plate, as compared to silver diamond (ultra-high K), which has a thermal conductivity significantly greater than copper in combination with different TIM materials and thicknesses and thermal conductivities. As shown, a heat distribution device having a cold plate base and cold plate fins formed from silver diamond can achieve the greatest heat flux of 7.2 W/mm$^2$. Additional examples and variations are also contemplated within the scope of the disclosure. Further, it is to be appreciated that in certain applications, it may be sufficient to vary the materials forming the cold plate base, fins, and lid, without the use of an ultra-high thermally conductive material, and simply rely on, for example, high-k materials, such as copper, to form the base.

Figure 27:
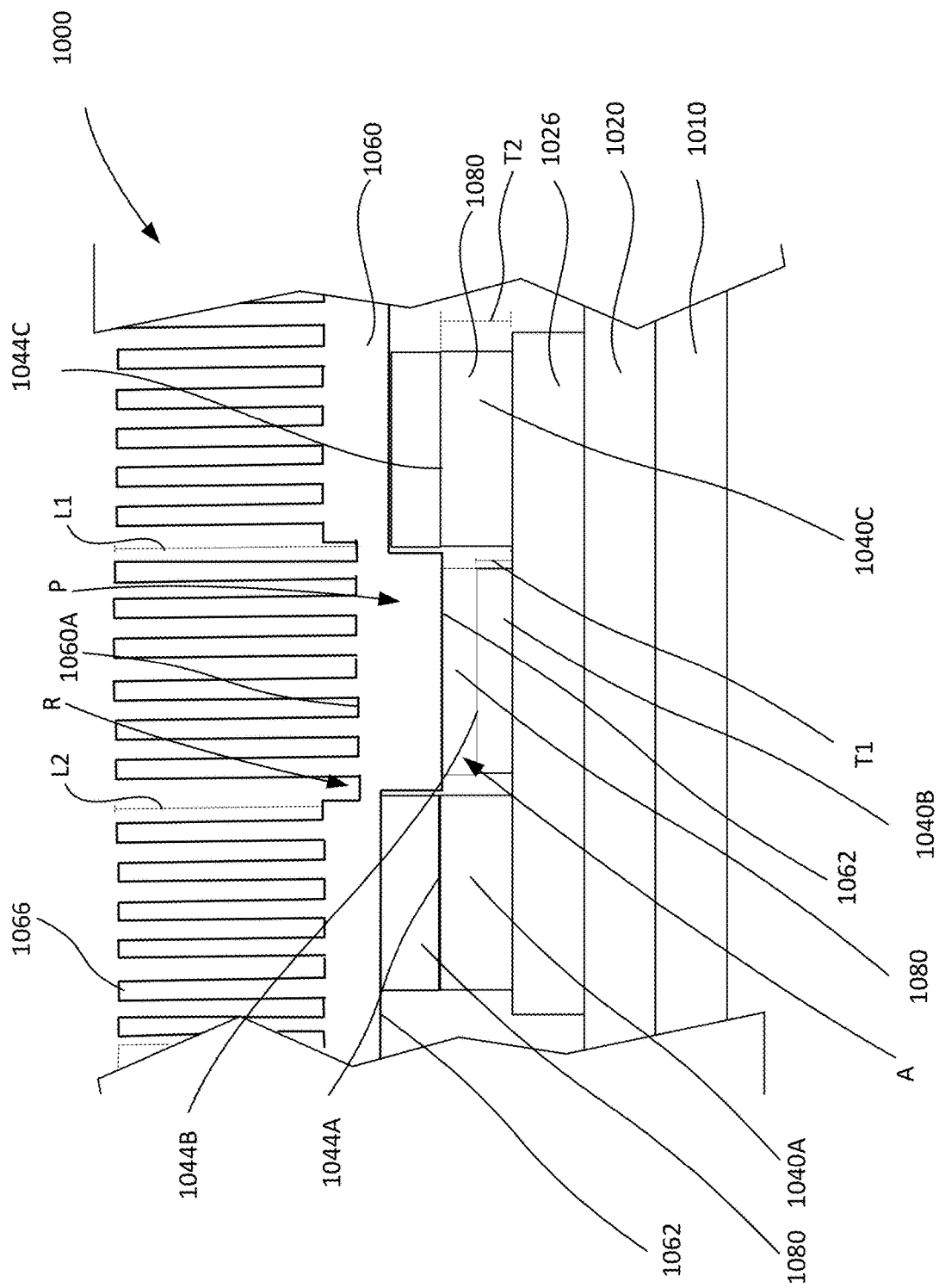
FIG. 27 is an example schematic subassembly according to aspects of the disclosure.

Modification of Cold Plate Structure and/or Chip Thickness to Control Heat Distribution Die thinning and modification of the cold plate and cold plate fins can provide for greater control over heat distribution. FIG. 27 illustrates a schematic view of a portion of a package 1000. Package 1000 can include a printed circuit board 1010, substrate 1020, silicon interposer 1026, three chips 1040A, 1040B, 1040C, and a cold plate base 1060 joined to the respective rear surfaces 1044A, 1044B, 1044C of chips 1040A, 1040B, 1040C by a TIM 1080. The package can further include a stiffener, as further discussed. In this example, three chips are shown adjacent one another. A central chip 1040B is positioned between at least two directly adjacent chips 1040A, 1040C positioned on opposed sides of the central chip 1040B. Central chip 1040B may be thinned, such that chip 1040B has a thickness T1 that is less than the thickness of one or more directly adjacent chips. In this example, central chip 1040B has at thickness T1 that is less than the thickness T2 of both directly adjacent chips 1040A, 1040C. This creates a difference in height between chips 1040A, 1040C and chip 1040B, as well as a recessed area A directly above chip 1040B. Die thinning can be accomplished by grinding, etching, milling or any known methods of die thinning. Die thinning reduces the thermal resistance within silicon of chip 1040B. In some examples, central chip 1040B may be an ASIC chip and the directly adjacent chips 1040A, 1040B may have the same or different function. In other examples, central chip 1040B is another type of chip.

To accommodate the change in thickness of chip 1040B due to die thinning, the structure of cold plate base 560 can be modified. As shown, bottom surface 1062 of base 1060 is not planar, but includes a step or protrusion P that extends into the recessed area A above chip 1040B so as to fill the open space created by the thinning of die 1040B. Cold plate base 1060 therefore includes at least one protrusion P. Additionally, fins 1066 have a length L1 that is greater than a length L2 of the fins 1066 in cold plate base 1060 that overlie chips 1040A and 1040C. In such example, the elongated fins may have a length L1 between 0.5 mm and 5 mm, which can be optimized based on the cooling requirements of the chip, but in other examples, length L1 can vary. In the example shown, the elongated fins extend upwardly from a recessed portion R of the top surface 1060A of base 1060. Base 1060 can be joined to rear surfaces of chips 1040A, 1040B, 1040C by a thermally conductive interface material 1080, including a low melting point metal, as previously discussed herein.

Figure 28:
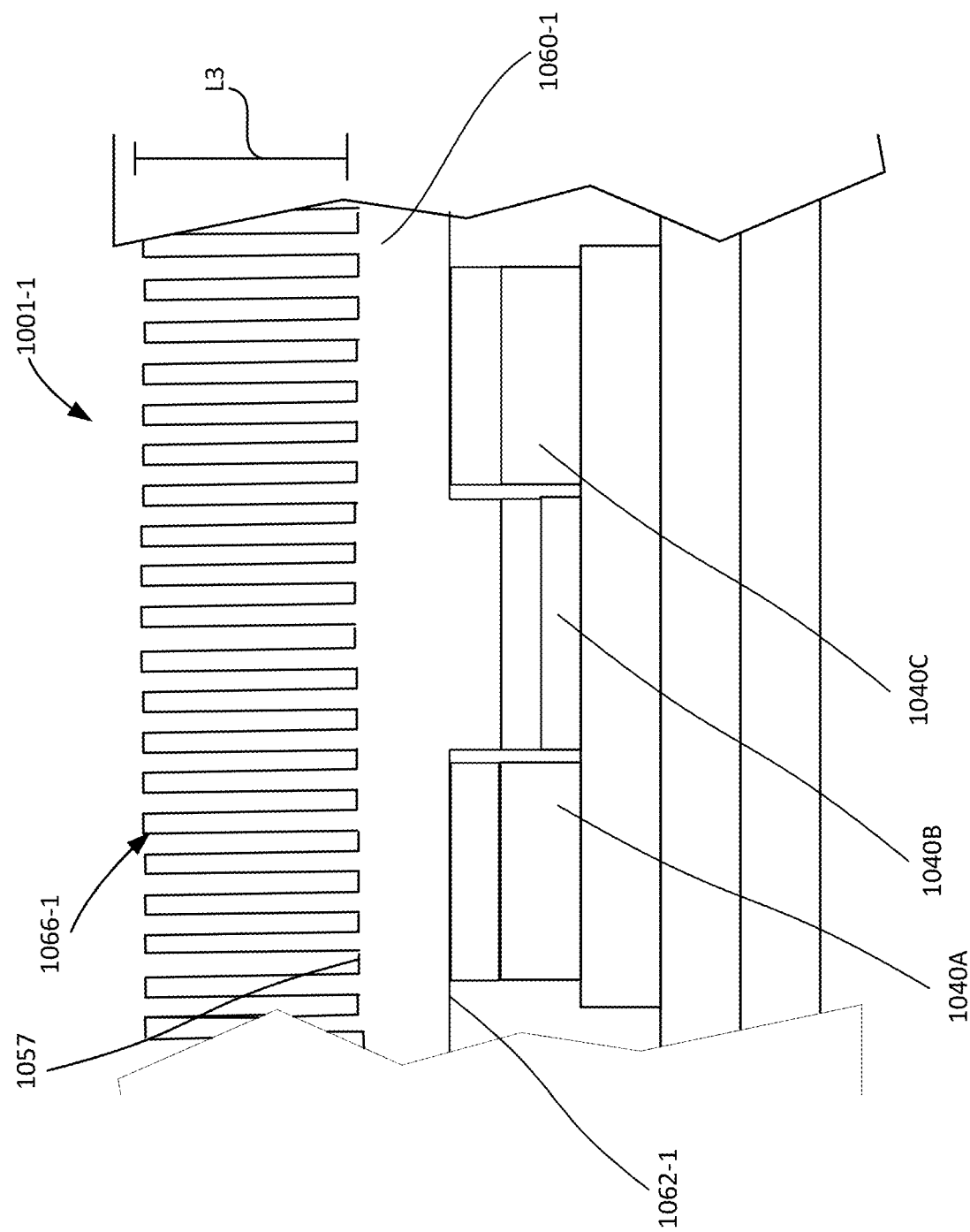
FIG. 28 is an example schematic subassembly according to aspects of the disclosure.

FIG. 28 is another example chip assembly 1001-1 similar to FIG. 27, except that the structure of example fins 1066-1 of cold plate base 1060-1 differs. As shown, chip 1040B is positioned between chips 1040A, 1040C. Chip 1040B has been thinned so that the overall thickness of chip 1040B is less than the thickness of directly adjacent chips 1040A, 1040C. All of the fins 1066-1 of cold plate base 1060-1 have a substantially equal length L3, as all fins 1066-1 extend from a continuously planar interior surface 1057 of cold plate base 1060-1. Bottom surface 1062-1 of cold plate base 1060-1 will have a similar stepped profile, as bottom surface 1062 of cold plate base 1060-1 of FIG. 27.

Figure 29:
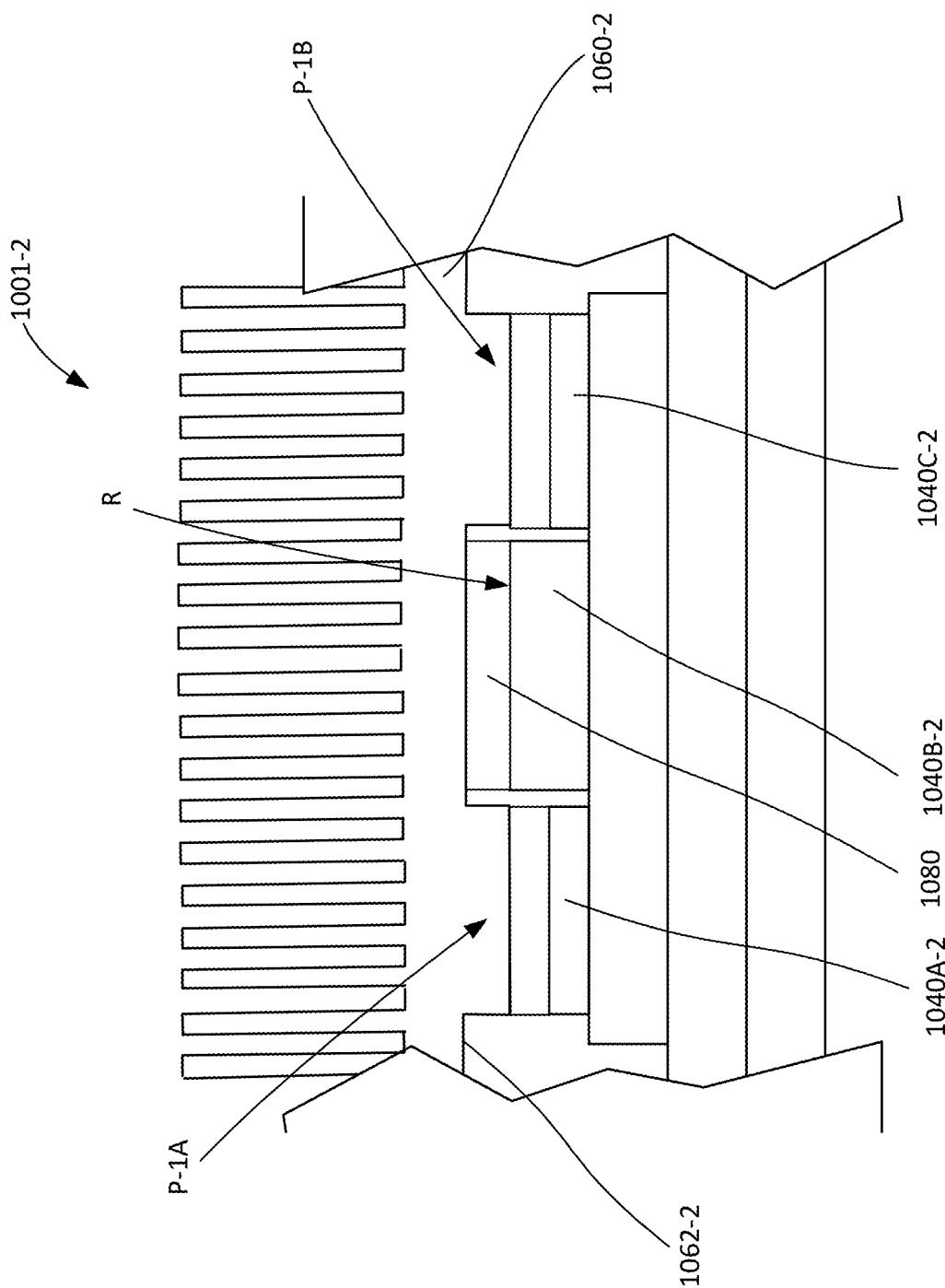
FIG. 29 is an example schematic assembly according to aspects of the disclosure.

FIG. 29 illustrates another example chip assembly 1001-2 that is similar to FIG. 28, except that bottom surface 1062-2 of cold plate base 1060-2 includes a recessed portion R, which creates two protrusions P-1A and P-1B. In this example, instead of the middle chip 1040B-2 having a thickness that is less than the thickness of the two adjacent chips, middle chip 1040B-2 instead has a thickness that is greater than the two adjacent and outermost chips 1040A-2, 1040C-2. Cold plate 1060-2 accommodates the change in thickness of the chips by including a recessed portion R in a central portion of bottom surface 1062-2. This allows for chip 1040B-2 to extend into recessed portion R, and for protrusions P-1A and P-1B to overlie thinned chips 1040A-12 and 1040C-2. Cold plate base 1060-2 may be attached to chips 1040A-2, 1040B-2, 1040C-2 through use of a TIM 1080.

Figure 30:
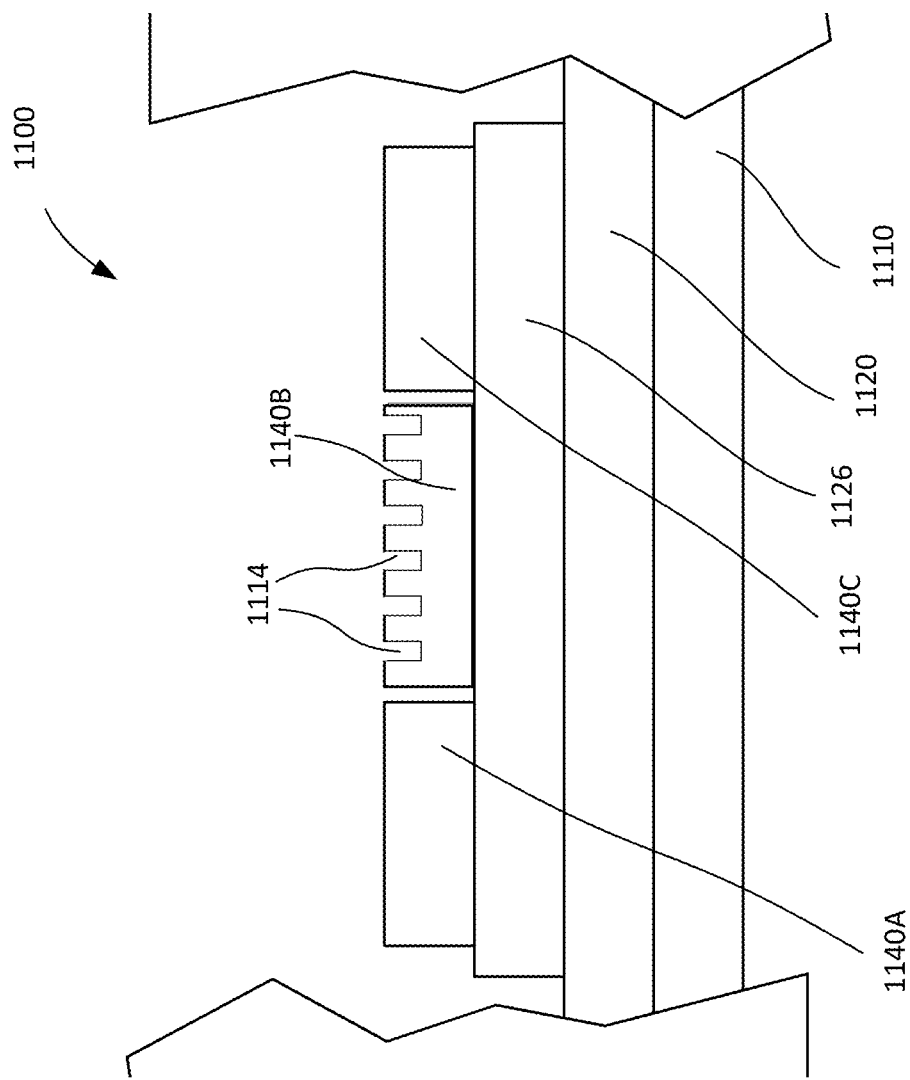
FIG. 30 is an example schematic subassembly according to aspects of the disclosure.

FIG. 30 illustrates an example subassembly 1100 of a chip package including substrate 1120, an interposer 1126, and chips 1140A, 1140B, 1140C mounted on a printed circuit board 1110. Instead of thinning the overall height of chip 1140B, chip 1140B includes cavities 1114 directly within chip 1140B. Cavities 1114 can be formed using any known methods, including milling, etching, and the like.

Figure 31:
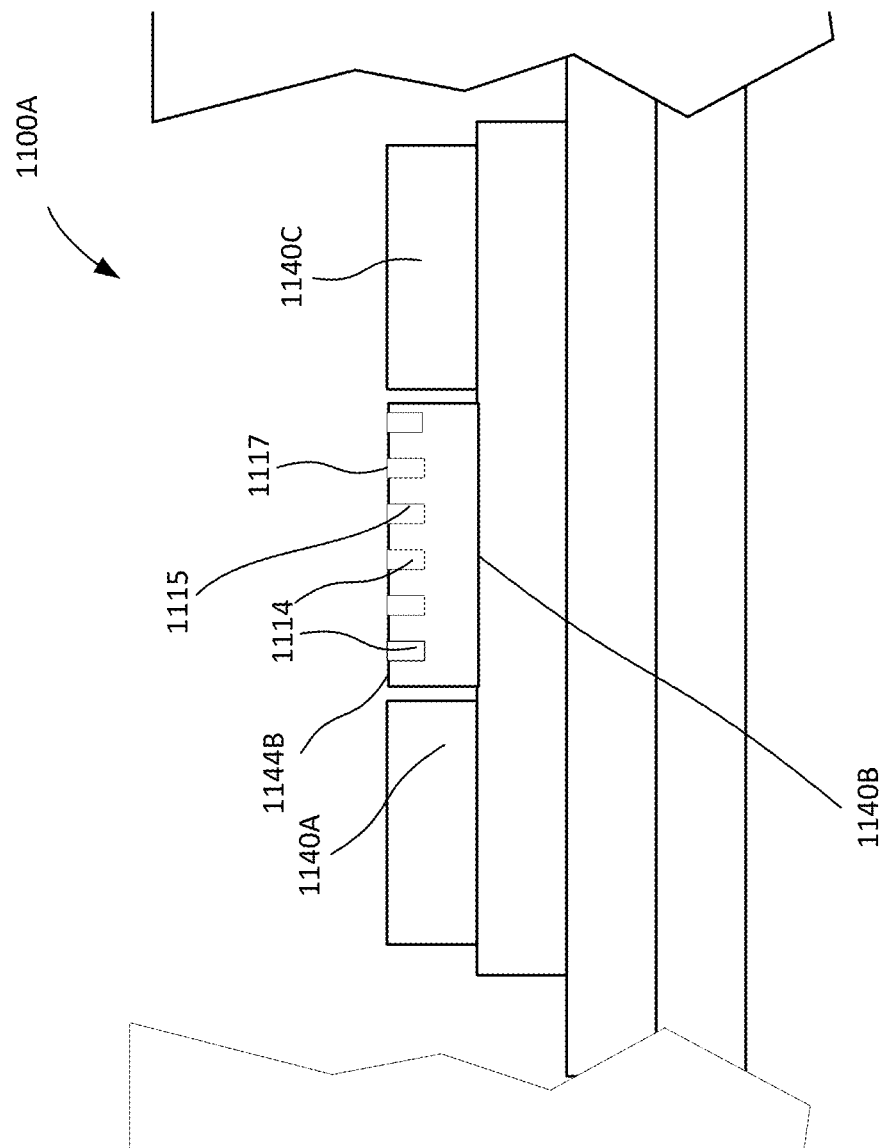
FIG. 31 is an example schematic assembly according to aspects of the disclosure.

In one example, to better distribute heat from the chip, cavities 1114 can be filled with a conductive material for heat distribution, such as the assembly 1100A shown in FIG. 31. In some examples, a high or ultra-high thermally conductive material 1115 can fill the cavities 1114. An example of such material can include copper, but other materials may also be utilized. The high or ultra-high thermally conductive material 1115 may have a top surface 1117 that is aligned or flush with the rear surface 1144B of chip 1140B. In other examples, top surface 1117 of material 1115 may be recessed below rear surface 1144B of chip 1140B, or extend beyond rear surface 1144B of chip 1140B, as discussed below.

Figure 32:
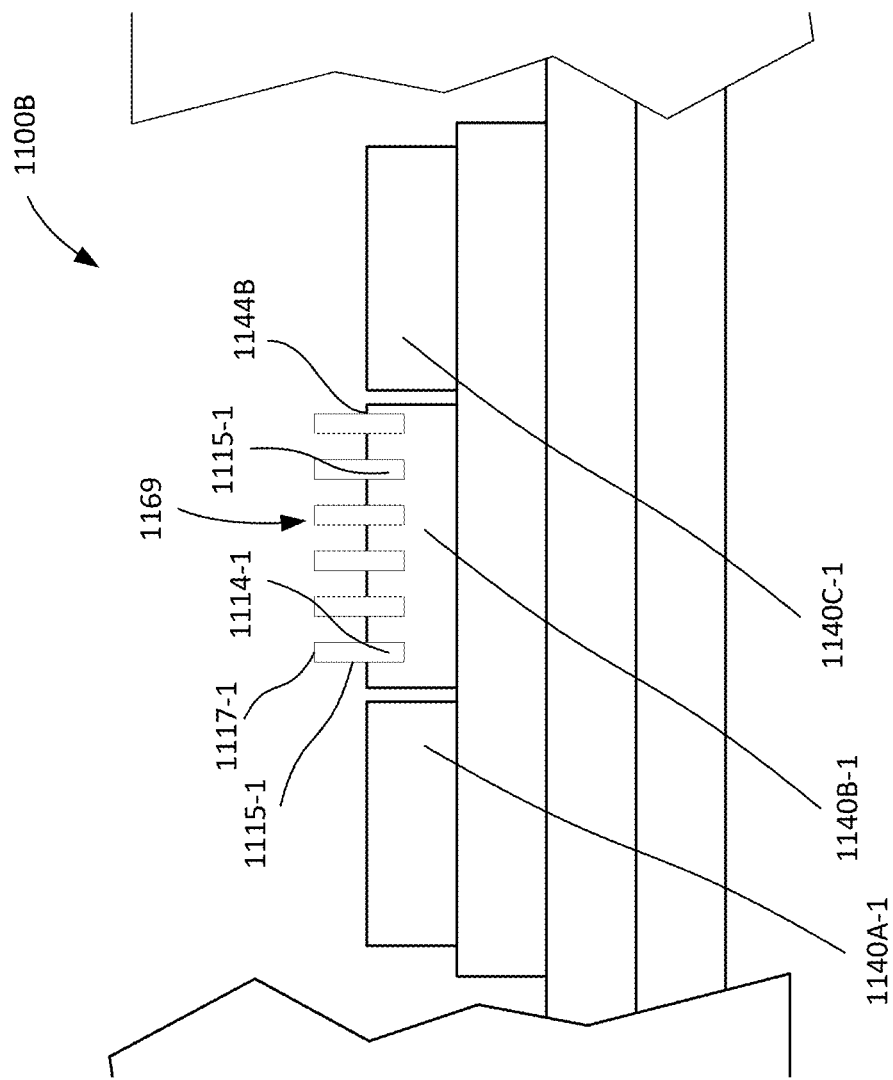
FIG. 32 is an example schematic assembly according to aspects of the disclosure.

In another example chip assembly 1100B shown in FIG. 32, top surface 1117-1 of material 1115-1 extends beyond rear surface 1144B of chip 1140B-1 to form protrusions or chip fins 1169. Chip fins 1169 can help to distribute heat away from chip 1140B-1 and the overall chip assembly 1100B. A high or ultra-high thermally conductive material 1115-1 can be deposited into cavities 1114-1. Chip fins 1169 can be formed in various ways. In one example, the fins can be formed by a subtractive process, such as etching/laser followed by an additive process like plating, physical vapor deposition and printing and the like. Other methods of manufacture may also be utilized.

Figure 33:
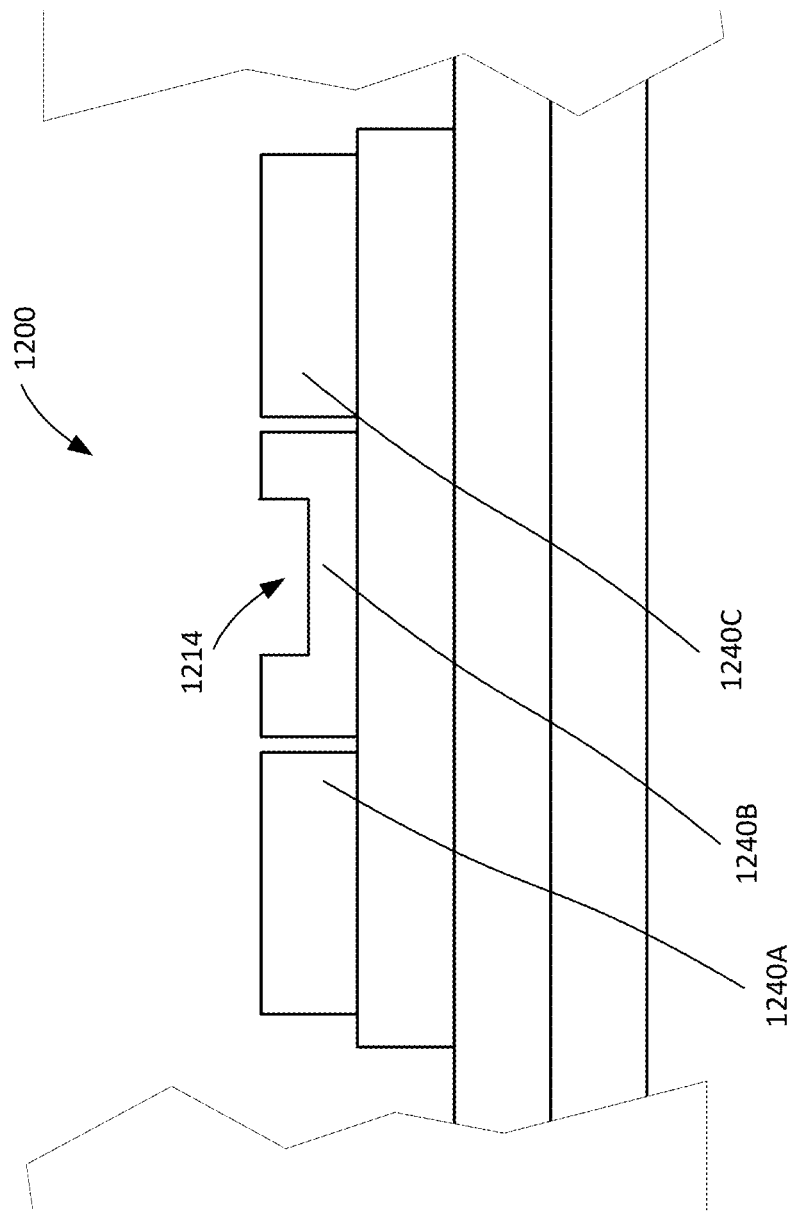
FIG. 33 is an example schematic assembly according to aspects of the disclosure.

FIG. 33 provides another example chip subassembly 1200, which is similar in structure to the prior example subassembly of FIG. 30, except that instead of multiple cavities, a single and central cavity 1214 is provided at the central portion of chip 1240B. This is intended to address the amount of heat generated at the center of chip 1240B, which is typically highest at the center of the chip. Additionally, the location of chip 1240B between two directly adjacent chips 1240A, 1240C, makes it even more difficult to dissipate heat at the center of chip 1240B. Thinning of chip 1240B can help to decrease the amount of heat generated.

Figure 34:
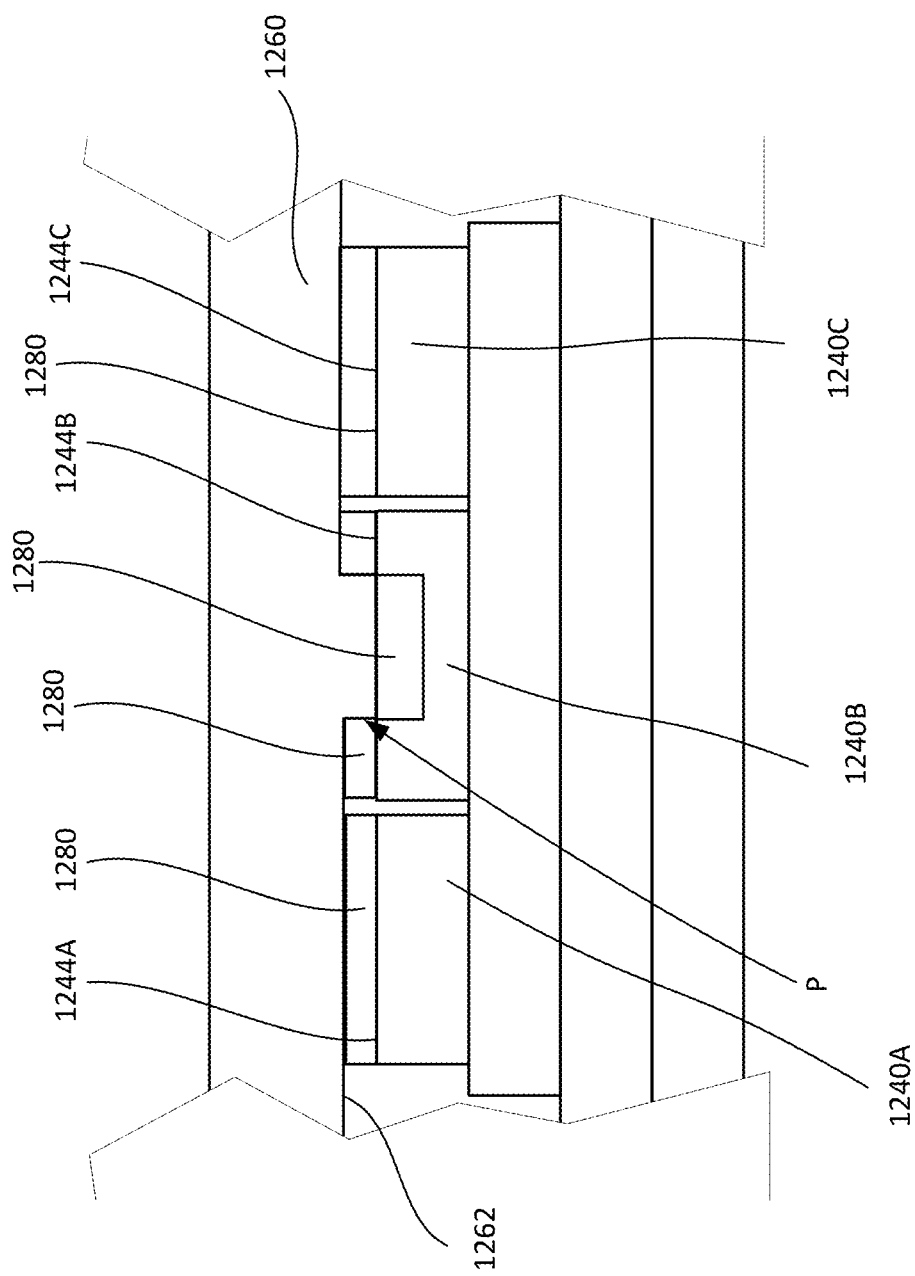
FIG. 34 is an example schematic assembly according to aspects of the disclosure.

In this example, instead of filling cavity 1214 with thermally conductive material, a cold plate base 1260 can be attached and bonded to rear surfaces 1244A, 1244B, 1244C of chips 1240A, 1240B, 1240C with a TIM 1280. As shown in FIG. 34, base 1260 can include a stepped and non-planar bottom surface 1262. The stepped or protrusion P of base 1260 can protrude directly into cavity 1214. It is to be appreciated that although base 1260 does not include fins, fins can be provided in other examples. Similarly, any one of the cold plates described herein can omit fins. Further, central cavity 1214 can instead be filled with a thermally conductive material, such as, for example, a high or ultra-high thermally conductive material.

Structural Arrangement and Select Materials for Optimal Heat Distribution and Warpage Control Enhanced heat distribution within a chip assembly, in combination with enhanced warpage control, may be further achieved by coordinating the selection of the material or combination of materials forming the heat distribution device and the selection of the material or combination of materials forming the stiffener. In an example chip assembly that includes a heat distribution device overlying at least a portion of the stiffener, the thermal conductivity of the material forming the heat distribution device may be higher than the thermal conductivity of the material forming the stiffener, but the coefficient of thermal expansion of the material forming the heat distribution device may be lower than the coefficient of thermal expansion of the material forming the stiffener. This combination can allow for use of a high thermally conductive material as the heat spreader, even though the material may have a comparatively low coefficient of thermal expansion ("CTE"). To compensate for the low CTE of the high thermally conductive material, a stiffener formed of a material with a higher CTE can be used. For example, an ultra-high thermally conductive material, such as silver diamond (e.g., AgD) previously discussed herein or any form of silver diamond, may be selected as the material forming the heat distribution device, whereas copper (e.g., Cu-OFE) or any form of copper may be selected as the material forming the stiffener. In other examples, different combinations of materials may be selected, as discussed below. The arrangement of the components within the assembly, combined with the selection of materials can optimize heat distribution and warp control of the substrate and microelectronic device.

Figure 35:
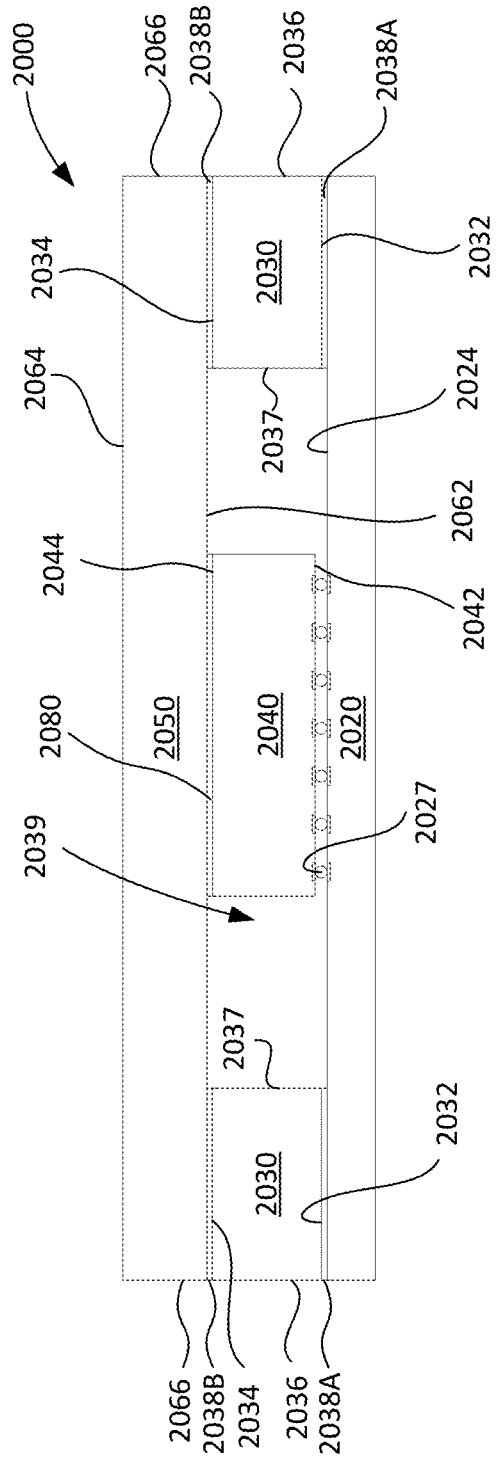
FIG. 35 is an example schematic assembly according to aspects of the disclosure.

Turning to FIG. 35, an example microelectronic device assembly 2000 is illustrated. The assembly may include at least a substrate 2020 supporting the assembly 2000, a stiffener element 2030, at least one microelectronic element or chip 2040, and a heat distribution device 2050. Chip 2040 can be a semiconductor chip and may be arranged so that the active front surface 2042 faces toward and can be joined or bonded in a ball grid array to substrate 2020. Although only a single chip is shown in the figure, multiple chips may be present within assembly 2000. Substrate 2020 may be a traditional single layer or multi-layer substrate formed from a non-conductive dielectric material, such as glass epoxy, silicon, polyimide, polytetrafluorethylene, fiberglass-epoxy laminate. Bonding material, such as solder balls 2027, may be used to electrically interconnect chip 2040 with substrate 2020.

A stiffener element may extend around chip 2040 and overlie substrate 2020. An adhesive 2038A may join the bottom surface 2032 of stiffener element 2030 to top surface 2024 of substrate 220. As previously discussed, an example stiffener element 2030 can be a stiffener ring that extends circumferentially around chip 2040. Stiffener element 2030 may be circular, rectangular, or any other desired shape. As shown, stiffener element 2030 can include a bottom surface 2032, an opposed top surface 2034, an outer edge surface 2036 extending between the bottom and top surfaces 2032, 2034, an opposed interior edge surface 2037 extending between the bottom and top surfaces 2032, 2034, and an aperture 2039 extending through the top and bottom surfaces 2034, 2032. Aperture 2039 may be generally central with respect to an outer perimeter of stiffener 2030, though in other examples the position of aperture 2039 may be adjusted. For example, the size and shape and position of aperture 2039 may be adapted based on circuitry of the underlying substrate 2020 to be exposed through aperture 2039 or the arrangement of chip within aperture 2039.

Heat distribution device 2050 may extend over at least portions of stiffener 2030 and chip 2040. In this example, heat distribution device 2050 is a single monolithic element having a planar bottom surface 2062 and a planar top surface 2064. Example heat distribution devices 2050 can include a cold plate or heat spreader, and may further include thermally conductive fins or other features (not shown). An adhesive 2038B can be used to attach heat distribution device 2050 to stiffener element 2030. As shown, a second adhesive 2038B joins bottom surface 2062 of heat distribution device 2050 to top surface 2034 of stiffener 2030. Heat distribution device 2050 may include a bottom surface 2062, a top surface 2064, and outermost edge surfaces 2066 extending between the bottom and top surfaces 2062, 2064. In this example, both outermost edges 2066 of heat distribution device 2050 are aligned with the outermost edges 2036 of stiffener element 2030. In other examples, including those to be described below, one or both edges 2066 are not aligned with outermost edges 2036.

A thermal interface material ("TIM") with at least a high thermal conductivity ("k") may be used to join heat distribution device 2050 directly to chip 2040. In this example, bottom surface 2062 of cold plate 2050 is directly joined to rear surfaces 2044 of chip 2040 through use of TIM 2080. TIM 2080 may be a high k TIM, which can also be a low melting temperature metal, including metal or graphite, such as Nano Ag or Indium, but other high k TIM materials may be implemented. The methods and structures disclosed herein can also be utilized with a low k TIM, with reduced levels of thermal conductivity.

TIM 2080 may be provided in any desired form, such as liquid, solid, semi-solid, and the like. For example, a TIM can be applied in liquid form, which will later cure and remain as a soft elastomer. In other examples, TIM can be a grease, film, or solder.

In some examples, the first adhesive 2038A joining bottom surface of stiffener 2030 to substrate 2020 may be different than the second adhesive 2038B joining stiffener 2030 to heat distribution device 2050. For example, the first adhesive 2038A can optionally possess characteristics that differ from the second adhesive 2038B. As will be discussed below, selection of the adhesive, alone or in combination with the selection of material forming stiffener element 2030 can further help to compensate for a CTE mismatch in the overall system, including any CTE mismatch between the heat distribution device 2050 and the substrate 2020 and/or stiffener element 2030.

The first adhesive 2038A may have a higher resistance to elastic deformation and a higher modulus of elasticity than the modulus of elasticity of a second adhesive 2038B. In some examples, first adhesive 2038A may have a modulus of elasticity ranging from 10 MPa to 100 MPa. In other examples, the modulus of elasticity of first adhesive 2038A can be less than 10 MPa or greater than 100 MPa. First adhesive 2038A may be in the form of a paste, but can also take on other forms. The second adhesive 2030B may differ and have a second modulus of elasticity ranging from 0.1 MPa to 10 MPa. In other examples, the modulus of elasticity of second adhesive 2038B can be less than 0.1 MPa or greater than 10 MPa. The second adhesive may be in form of a liquid or film, but in other examples, the second adhesive can take on other forms. Thus, while there is a slight overlap in the exemplary ranges of the modulus of elasticity of the first and second adhesives 2038A and 2038B, in examples where the modulus of elasticity of the first and second adhesives is intended to differ, an exemplary embodiment will be one where the modulus of elasticity of the first adhesive 2038A is selected that is greater than the modulus of elasticity of the second adhesive 2038B. In other examples, the same or similar modulus of elasticity may be selected for the first and second adhesives 2038A and 2038B, so as to rely on the properties selected for the stiffener 2030 and heat distribution device 2050, alone or in combination with other components of the package, to minimize warping of the chip package.

The differing adhesives can further help to achieve enhanced warpage control and compensate for a CTE mismatch between a stiffener and heat spreader and/or substrate or other components within the assembly. In some examples, as long as the first modulus of elasticity is greater than the second modulus of elasticity, the selected modulus of elasticity can be within or outside of the example ranges noted above. In this example, having the first adhesive in the form of a paste, as compared to a second adhesive in the form of liquid, this combination can further assist with CTE mismatch in the assembly, depending on the materials selected for the stiffener and heat spreader. In other examples, the second adhesive 2038B may have a greater modulus of elasticity than the first adhesive 2038A. In still other examples, depending on the materials selected for the heat spreader 2050 and stiffener element 2030, the first and second adhesives 2038A and 2038B may be the same or substantially the same, or have respective modulus of elasticities that do not significantly differ.

The first and second adhesives may be dielectric or insulating adhesives. For example, the first and second adhesives may be epoxies, or other types of materials. The selective adhesives may be thermally conductive or non-conductive, and have high reliability to both thermal cycling and mechanical shock and vibration.

To allow for enhanced heat distribution within the assembly, as well as enhanced warpage control to prevent warpage of the chip and/or substrate and other mechanical failure, the materials forming the heat distribution device 2050 and the stiffener element 2030 can additionally or alternatively be coordinated to compensate for one another. The heat distribution device 2050 (and TIM 2080) can control heat distribution within assembly 2000, thereby making a heat distribution device formed from a high thermally conductive material desirable. The stiffener element 2030 can control warpage of substrate 2020 and components within the assembly making a stiffener element 2030 formed from a material having a high CTE desirable. Additionally, stiffener element 2030, in combination with first adhesive 2038A having a higher modulus of elasticity than the modulus of elasticity of the second adhesive 2038B, can further provide greater warpage control of substrate 2020 and components within the assembly. In one example, the material or combination of materials forming heat distribution device 2050 can differ from the material or combination of materials forming stiffener 2030. For example, the thermal conductivity of the material forming the heat distribution device 2050 may be higher than the thermal conductivity of the material forming stiffener element 2030, but the CTE of the material forming heat distribution device 2050 may be lower than the CTE of the material forming stiffener element 2030. In some examples, the thermal conductivity of the material forming heat distribution device 2050 can be at least 50 percent greater than the thermal conductivity of the material forming stiffener element 2030. Additionally, the CTE of the material forming stiffener 2030 may be at least 50 percent greater than the CTE of the material forming heat distribution device 2050. In still other examples, the CTE of stiffener element may be at least two times greater than the CTE of the heat distribution device 2050.

The below Table 1 lists the CTE and thermal conductivity of several common materials.

TABLE 1

| Material | CTE at 20° C. [ppm/K] | Thermal Conductivity at 20° C. [W/mK] |
|---|---|---|
| Aluminum | 23.6 | 237 |
| Copper-OFE | 17.7 | 394 |
| Al-Diamond (ALCD) | 7.5 | 485 + _45 |
| Cu-Diamond (CUCD) | 6.7 | 470 |
| Ag-Diamond (AgD) | 6.5 | 900 |

Materials identified on this chart indicate that a stiffener element 2030 formed from copper, which will help to control warpage, can be paired with a heat distribution device 2050 formed from silver diamond (e.g., AgD) the combination of which will help to achieve the highest thermally conductive assembly 2000. Further, in combination with a first adhesive 2038A which joins the stiffener element to the substrate, and the second adhesive 2038B which joins the stiffener element to the heat distribution device 2050, stiffener 2030 can also help to compensate for CTE mismatch of the heat distribution device and stiffener element and the substrate 2020. As noted from Table 1 above, silver diamond has one of the highest thermal conductivities at 900 Wm/K, but the lowest CTE of 6.5 ppm/K. While silver diamond is highly effective at distributing or transferring heat, its ability to control warpage is low. Thus, while it may be desirable to select silver diamond due to its high thermally conductive properties, depending on the application and structure of the assembly, use of silver diamond alone could result in possible warpage of the substrate and other mechanical failures within the assembly. Selection of a material that has a greater CTE than silver diamond in at least the structures disclosed herein can better help to control warpage. In one example, a Copper material (e.g., Cu, CuOFE) with a CTE of 17.7 ppm/K and a thermal conductivity of 394 W/mK can be selected. The high CTE of copper can offset the low CTE of silver diamond. Further, copper possesses one of the highest thermal conductivities of the remaining components on the chart and has the added advantage of distributing heat within the chip assembly 2000. Thus, the combination of a copper stiffener element 2030 and silver diamond heat distribution device 2050 can help to achieve optimal thermal conductivity and warpage control in a chip package. Other combinations of material are also contemplated within the scope of this disclosure, examples of which are discussed in more detail below.

With reference to FIG. 36, results from testing chip assemblies are shown in a chart. The chart illustrates how use of a silver diamond heat distribution device and a copper stiffener can achieve optimal results, as compared to a monolithic heat distribution device. The monolithic heat distribution device may be formed from a single material and combine the structure of the heat distribution device and stiffener into one integral heat distribution device within the assembly. The chart highlights the resulting warpage of a substrate due to CTE mismatch between the substrate and the heat distribution device/stiffener. In particular, the chart shows warpage results of a substrate A1 in a chip assembly attached to a heat distribution device A2 formed entirely of either copper or silver diamond. Similarly, the warpage results of a substrate B1 within an assembly B, in which a heat distribution device B2 is formed of silver diamond, and a separate stiffener B3 is formed from copper are shown.

At room temperature of 20° C., the warpage of a substrate A1 in assembly A that results from use of an "u-shaped" all copper heat distribution device A2 is approximately 120 microns. The warpage of a substrate A1 in assembly A that results from use of a "u-shaped" all silver diamond heat distribution device A2 is approximately 201 microns. The warpage of a substrate B1 in assembly B that results from use of a combined planar silver diamond heat distribution device B2, in combination with a copper stiffener B3, and first and second adhesives B1A and B1B is approximately 133 microns. In this simulation, first adhesive 2038A has a modulus of elasticity that is greater than the modulus of elasticity of the second adhesive 2038B. Similar results at a high temperature of 260° C. show the similarity in warpage of the substrate B2 in an assembly B utilizing a silver diamond heat distribution device B2 and copper stiffener B3, as compared to warpage of a substrate A1 in an assembly A utilizing an all copper and "u-shaped" heat distribution device.

These test results reveal several improvements that result from the use of such a combined silver diamond heat distribution device and copper stiffener. The combined silver diamond heat distribution device 2050 with copper stiffener 2030 demonstrates warpage properties that are similar to an all copper heat distribution device. This is advantageous because the enhanced warpage control is possible with the silver diamond/Copper combination, while still allowing for the greatly enhanced thermally conductive properties of the silver diamond heat distribution device. Further, as a pure metal, copper already possesses one of the highest thermally conductive properties, making copper a desirable material to further assist with thermal conductivity in the assembly.

Cost can be reduced by use of the combination silver diamond heat distribution device and copper stiffener. Silver diamond is an expensive material. Using copper as the material forming stiffener element 2030, in place of a traditional "u-shaped" all silver diamond heat distribution device (such as heat distribution device A1; FIG. 36), allows for a reduction in the material volume of silver diamond necessary to form the components. This in turn, minimizes the overall cost.

Ease of manufacturing is also realized by the silver diamond and copper combination. By using a planar heat distribution device 2050, instead of a "u-shaped" heat distribution device, it is easier to attach heat distribution device 2050 to chip 2040. Better bond line thickness control of the TIM 2080 between chip 2040 and heat distribution device 2050 can be achieved. For example, consistent bond line thickness of 75 and 100 microns can be obtained.

Additional combinations of materials can be considered to achieve both enhanced warpage control and thermal conductivity. Optimal results can be obtained by considering combinations of materials, in which thermal conductivity of the materials is at least the same or greater than copper. For example, while silver diamond may be preferred due to its internal properties of being one of the highest thermally conductive materials, it may be possible to obtain optimal warpage and thermal conductivity by selection of a copper material for stiffener, and a Copper Diamond or Aluminum Diamond material for the heat distribution devices. In still other examples, different materials can be selected for the stiffener to compensate for differences in thermal expansion of the package. For example, when it is desired to offset a low CTE of the material forming the heat spreader and to help maintain warpage control of the substrate and overall package, a stiffener can be selected with a high CTE that can either match or exceed the CTE of the material forming the heat spreader. The material forming the stiffener can help to compensate for a low CTE of the material forming the heat spreader. Additionally, the stiffener, in combination with the first and second adhesives, can help make up for CTE mismatch. Other combinations of materials achieving similar results can also be obtained based on aspects of the disclosure, including metal alloys or combinations of other materials not listed here.

Another example structure, according to aspects of the disclosure, is configured to achieve optimal heat distribution and warpage control. As shown in FIG. 37, microelectronic device assembly 2100 includes a substrate 2120 supporting the assembly 2100, a stiffener element 2130, at least one microelectronic element or chip 2140, and a heat distribution device 2150. A first adhesive 2138A joins a bottom surface 2132 of stiffener 2130 to the top surface 2124 of substrate 2120. A second adhesive 2138B joins a top surface 2134 of stiffener 2130 to the bottom surface 2162 of heat distribution device 2150.

The components in assembly 2100 possess the same characteristics as assembly 2000 in FIG. 35, differing only in the configuration of the heat distribution device 2150, relative to the other components in the assembly. As shown, outermost edges 2166 of heat distribution device 2150 are laterally spaced a distance 2168A and 2168B away from edge 2136 of stiffener element 2130. In this example, distance 2168A and 2168B are the same, but in other examples the distances 2168A and 2168B may differ. In still another example, only one edge 2166 of the heat distribution device 2150 may be laterally spaced away from the outer edge 2136 of stiffener 2130 and the other edge 2166 of the heat distribution device may be aligned with edge 2136 of stiffener element 2130.

Turning to FIG. 38 according to aspects of the disclosure, an example microelectronic device assembly 2200 includes a substrate 2220 supporting the assembly 2200, a stiffener element 2230, at least one microelectronic element or chip 2240, a TIM 2280, and a heat distribution device 2250. A first adhesive 2238A can join a bottom surface 2232 of stiffener 2230 to the top surface 2224 of substrate 2220. A second adhesive 2238B can join and bond a top surface 2234 of stiffener 2230 to the bottom surface 2262 of heat distribution device 2250. As in the previous embodiment, the components in assembly 2200 possess the same characteristics as assembly 2000 in FIG. 35, differing only in the height of chip 2240 and the configuration of the heat distribution device 2250, relative to the other components in the assembly. As shown, chip 2240 may be thinned by grinding, etching, milling or any known methods of die thinning. As a result, chip 2240 has a height H10 that is less than a height H12 of stiffener 2230. To compensate for this difference in height, heat distribution device 2250 may include a central portion 2282 that extends away from primary bottom surface 2262 of heat distribution device. The central portion 2282 is sized to completely cover and extend across rear surface 2244 of chip 2240, but in other examples, only a portion of bottom surface 2262 may be covered. Edges 2266 of heat distribution device 2250 may be aligned with edge 2236 of stiffener 2230. In other examples, one or more heat distribution devices 22250 may be laterally offset from edge 2236 of stiffener element 2230.

FIGS. 39-40 provide another example microelectronic device assembly 2300 according to aspects of the disclosure. The device assembly includes a substrate 2320 supporting the assembly 2300, a stiffener element 2330, at least one microelectronic element or chip 2340 and a heat distribution device 2350. The chip 2340 may have a rear surface 2344. A first adhesive 2338A can join a bottom surface 2332 of stiffener 2130 to the top surface 2324 of substrate 2120. A second adhesive 2338B can join a top surface 2334 of stiffener 2330 to the bottom surface 2362 of heat distribution device 2350.

The components in assembly 2300 possess the same characteristics as assembly 2000 in FIG. 35, differing only in the configuration of the heat distribution device 2350, relative to the other components in the assembly.

Heat distribution device 2350 includes a top surface 2364, a bottom surface 2362, and an interior peripheral edge 2372 extending between the top surface 2364 and bottom surface 2362. Interior peripheral edge extends around an aperture 2339A. Another aperture 2339B extends through the top and bottom surfaces 2364, 2362 and is defined by interior peripheral edge 2372. Interior peripheral edge 2372 of heat distribution device 2350 extends beyond interior edge 2337 of stiffener element 2330, such that in a top plan view, such as shown in FIG. 39, only microelectronic element 2340 and substrate 2320 are visible through aperture 2339. Stiffener element 2330 is not visible from a top plan view. Further, aperture 2339A and aperture 2339B are aligned with one another.

Enhanced heat distribution, in combination with enhanced warpage control, may be further achieved by coordinating the selection of the material or combination of materials forming the heat distribution device, in combination with the selection of the material or combination of materials forming the stiffener in any of the additional chip assemblies disclosed in FIGS. 37-40, as well as any of the assemblies previously disclosed herein. As discussed, the thermal conductivity of the material forming any one of the heat distribution devices in these examples may be higher than the thermal conductivity of the material forming the stiffener, but the coefficient of thermal expansion of the material forming the heat distribution device may be lower than the coefficient of thermal expansion of the material forming stiffener. This can allow for optimal heat distribution and warpage control in the package. In one example, optimal results can be achieved by use of a silver diamond material to form heat distribution device and a copper material to form the stiffener, but other combinations are available according to aspects of the disclosure.

To summarize the foregoing, according to a first aspect of the disclosure, a method of manufacturing a chip assembly comprises joining an in-process unit to a printed circuit board, the in-process unit comprising: a substrate having an active surface, a passive surface, and contacts exposed at the active surface; an interposer electrically connected to the substrate; a plurality of semiconductor chips overlying the substrate and electrically connected to the substrate through the interposer, and a stiffener overlying the substrate and having an aperture extending therethrough, the plurality of semiconductor chips being positioned within the aperture; reflowing a bonding material disposed between and electrically connecting the in-process unit with the printed circuit board, the bonding material having a first reflow temperature; and then joining a heat distribution device to the plurality of semiconductor chips using a thermal interface material ("TIM") having a second reflow temperature that is lower than the first reflow temperature; and/or wherein the heat distribution device comprises a cold plate having a base and a lid coupled to the base, the method further comprising joining the base of the cold plate to rear surfaces of the plurality of semiconductor chips prior to coupling the lid to the base; and/or joining the base of the cold plate to a top surface of the stiffener; and/or the heat distribution device comprises a cold plate having a base and a lid coupled to the base, the method further comprising joining the base and the lid together, and then joining the base to rear surfaces of the plurality of semiconductor chips; and/or the reflowing the bonding material comprises reflowing the bonding material disposed between the substrate and the printed circuit board, wherein the heat distribution device includes a base, a plurality of thermally conductive fins extending from at least a portion of the base, and a lid, wherein the base is comprised of a material having a thermal conductivity greater than 394 W/m², and wherein at least one of the lid and the plurality of thermally conductive fins is comprised of a material having a thermal conductivity of 394 W/m² or less; and/or prior to joining the heat distribution device to rear surfaces of the plurality of semiconductor chips, the TIM is provided on one of rear surfaces of the semiconductor chips or a bottom surface of the heat distribution device; and/or the heat distribution device further comprises a plurality of thermally conductive fins, wherein a first fin length of at least some of the plurality of thermally conductive fins is greater than a second fin length of remaining fins of the plurality of thermally conductive fins, wherein a first height of at least one of the plurality of semiconductor chips is less than a second height of others of the plurality of semiconductor chips, and wherein the method further comprises positioning the at least some of the plurality of thermally conductive fins have a first fin length to overlie the at least one of the plurality of semiconductor chips having a first height; and/or during the reflowing a compression device applies pressure to the heat distribution device; and/or the compression device is a weight configured to overlie the heat distribution device during manufacture of the chip assembly, the method further comprising applying the weight to a top surface of the heat distribution device; and/or the compression device includes a rigid plate and springs at opposed ends of the rigid plate, the method further comprising positioning the rigid plate over a rear surface of the heat distribution device and securing the rigid plate to the printed circuit board; and/or the heat distribution device further includes an inlet and an outlet, and wherein the method further includes providing fluid connections to connect the inlets and outlets to a fluid source so as to enable introduction and ejection of fluid into and out of the heat distribution device; and/or providing an in-process unit further comprises providing a plurality of in-process units, and wherein providing a heat distribution device further comprises providing a plurality of heat distribution devices, the method further comprising bonding the plurality of in-process units to the printed circuit board by reflowing a bonding material that joins contacts of each of the substrates within the plurality of in-process units with contacts of the printed circuit board; joining each of the plurality of heat distribution devices to a respective one of the plurality of semiconductor chips of the plurality of in-process units by reflowing a high thermally conductive thermal interface material ("TIM"), each of the plurality of heat distribution devices comprising a plurality of thermally conductive fins, an inlet, and an outlet; and joining the inlets and outlets of the plurality of heat distribution devices to one another so that the inlet and outlet of one heat distribution device of the plurality of in-process units are in fluid connection with the inlet and outlet of another heat distribution device of the plurality of heat distribution devices; and/or the TIM is solder.

According to a second aspect of the disclosure, a microelectronic assembly comprises: a substrate having an active surface, a passive surface, and contacts exposed at the active surface; a plurality of semiconductor chips overlying the substrate; a heat distribution device, the heat distribution device including a base, thermally conductive fins extending upwardly from the base, and a lid overlying and at least partially enclosing the plurality of thermally conductive fins within the base, wherein at least the base is formed from a first material having a first thermal conductivity greater than 394 W/m², and wherein at least one of the lid and the plurality of thermally conductive fins is formed from a second material having a second thermal conductivity of less than 394 W/m² or less; a thermal interface material ("TIM") disposed between the heat distribution device and the plurality of semiconductor chips, wherein the coefficients of thermal expansion of at least one of the plurality of semiconductor chips and the base are substantially similar or identical; and a printed circuit board electrically connected to the substrate; and/or the plurality of thermally conductive fins are formed from the second material; and/or the lid is formed from the second material; and/or both the lid and the plurality of thermally conductive fins are formed from the second material; and/or the base and the plurality of thermally conductive fins are formed from the first material; and/or the first material is silver diamond; and/or a thickness of the TIM is 200 microns or less.

According to a third aspect of the disclosure, a microelectronic device assembly comprises: a substrate; and a plurality of microelectronic elements connected to the substrate, the plurality of microelectronic elements having an active surface facing toward the substrate and a passive surface facing away from the substrate, wherein one or more cavities extend through at least one surface of the plurality of microelectronic elements, and wherein the one or more cavities are filled with a thermally conductive material to dissipate heat from the plurality of microelectronic elements; and/or the thermally conductive material is flush with or positioned below the at least one surface of the at least one of the plurality of microelectronic elements; and/or the thermally conductive material extends beyond the at least one surface of the plurality of microelectronic elements; and/or the assembly further comprises a heat distribution device having a base and a lid, wherein the base further includes a plurality of thermally conductive fins, and wherein a first material forming the heat distribution device is different than a second material forming the plurality of thermally conductive fins.

According to a fourth aspect of the disclosure, a chip assembly comprises: a substrate; a plurality of semiconductor chips electrically connected to the substrate, each of the plurality of semiconductor chips having an active surface facing toward the substrate and a passive surface facing away from the substrate; and, a heat distribution device joined to the plurality of semiconductor chips, the heat distribution device including a plurality of thermally conductive fins, wherein a first fin length of at least some of the plurality of thermally conductive fins is greater than a second fin length of remaining fins of the plurality of thermally conductive fins, wherein a first height of at least one of the plurality of semiconductor chips is less than a second height of the others of the plurality of semiconductor chips, and wherein the at least some of the plurality of thermally conductive fins have a first fin length overlying the plurality of semiconductor chips having the first height; and/or wherein the heat distribution device includes a base overlying the plurality of semiconductor chips, and the plurality of thermally conductive fins extend away from the base; and/or at least some of the outermost tips of the plurality of thermally conductive fins are aligned with one another; and/or the base of the heat distribution device extends across rear surfaces of the plurality of semiconductor chips; and/or a printed circuit board is electrically connected to the plurality of semiconductor chips; and/or the plurality of semiconductor chips includes the at least one of the plurality of semiconductor chips and two directly adjacent chips positioned on opposed sides of the at least one of the plurality of semiconductor chips, and wherein a bottom surface of the base includes a protrusion that extends adjacent a top surface of the at least one chip to accommodate a differing height of the at least one of the plurality of semiconductor chips.

According to a fifth aspect of the disclosure, a method of assembling a cooling loop assembly to an in-process unit comprises: joining a plurality of in-process units to a circuit board, each in-process unit including: a substrate; at least one microelectronic element electrically connected to the substrate, the microelectronic element having an active front surface facing toward the substrate and an opposed rear surface facing away from the substrate; joining a corresponding plurality of heat distribution devices to the plurality of in-process units, each of the corresponding plurality of heat distribution devices including an inlet and an outlet; and bonding a cooling loop assembly to the inlet and outlet of each of the plurality of heat distribution devices, the cooling loop assembly including a network of fluid lines connected to each inlet and each outlet; and/or joining the corresponding plurality of heat distribution devices to the plurality of in-process units prior to the bonding of the cooling loop assembly to each of the heat distribution devices; and/or each of the corresponding plurality of heat distribution devices comprises a base and a lid, the inlet and outlet of each of the heat distribution devices extending from the lid; and/or joining the base of each of the corresponding plurality of heat distribution devices to the corresponding one of the plurality of in-process units prior to joining the lid of each of the corresponding plurality of the heat distribution devices to the base and prior to the bonding of the cooling loop assembly; and/or attaching a bottom surface of the base of each of the corresponding plurality of heat distribution devices to a rear surface of the at least one microelectronic element of each of the plurality of in-process units; and/or using a thermal interface material to join the bottom surface of the base to the rear surface of the at least one microelectronic element of each of the plurality of in-process units; and/or the plurality of in-process units each further include a stiffener overlying the substrate and extending around at least a portion of the at least one microelectronic element of each of the plurality of in-process units, and wherein the joining of each of the corresponding heat distribution devices comprises joining a bottom surface of the base of the heat distribution device to the stiffener; and/or prior to joining the lid to the base, the cooling loop assembly is joined to the inlet and outlet of each corresponding heat distribution device of the corresponding plurality of heat distribution devices; and/or joining the cooling loop assembly to the inlets and outlets by one of a British Standard Pipe Parallel thread fitting, a barb, or brazing; and/or prior to the joining of the cooling loop assembly to the corresponding heat distribution device, the corresponding heat distribution device is attached to the in-process unit; and/or the in-process unit further comprises an interposer electrically connected to the substrate, and the method further comprises electrically connecting the at least one microelectronic element to the substrate through the interposer; and/or the at least one microelectronic element of at least one in-process unit of the plurality of in-process units comprises a plurality of microelectronic elements, and wherein at least one of the plurality of microelectronic elements has been thinned so as to have a different height than at least one other of the plurality of microelectronic elements, and wherein a shape of each of the corresponding heat distribution devices is configured to accommodate the different height of the thinned microelectronic element.

According to the sixth aspect of the disclosure, a microelectronic device assembly comprises: a substrate; a microelectronic element electrically connected to the substrate, the microelectronic element having an active surface facing toward the substrate and a rear surface facing away from the substrate, a stiffener element overlying the substrate and extending around the microelectronic element, the stiffener element comprised of a first material having a first coefficient of thermal expansion ("CTE"); and a heat distribution device overlying the rear surface of the microelectronic element and a surface of the stiffener element facing toward the heat distribution device, the heat distribution device comprised of a second material having a second CTE; and wherein the first material is different than the second material, wherein the first CTE of the first material of the stiffener element is greater than the second CTE of the second material of the heat distribution device; and/or the stiffener element is joined to the substrate with a first adhesive, and the stiffener element is joined to the heat distribution device with a second adhesive, wherein the first adhesive has a first modulus of elasticity that is different than a second modulus of elasticity of the second adhesive; and/or the first modulus of elasticity of the first adhesive is greater than the second modulus of elasticity of the second adhesive; and/or the first modulus of elasticity ranges from 10 MPa to 100 MPa, and the second modulus of elasticity ranges from 0.10 MPa to 10 MPa; and/or the first CTE of the first material is at least 50 percent greater than the second CTE of the second material of the heat distribution device; and/or the first CTE is at least 17 ppm/WK at 20° C.; and/or the first material of the stiffener element further comprises a first thermal conductivity, and wherein the second material of the heat distribution device further comprises a second thermal conductivity, and wherein the second thermal conductivity of the second material is less than the first thermal conductivity of the first material; and/or the first thermal conductivity is greater than 394 W/mK at 20° C.; and/or the first material comprises copper; and/or the second material comprises silver diamond; and/or the first material comprises copper and the second material comprises silver diamond; and/or the stiffener element and the heat distribution device are independent structures coupled together; and/or the heat distribution device includes a planar surface extending across an entire surface of the stiffener element and an entire rear surface of the microelectronic element; and/or the heat distribution device includes a top surface, an opposed bottom surface, and an edge surface extending therebetween, wherein the surface of the stiffener element is a top surface facing toward the bottom surface of the heat distribution device, wherein the stiffener element further includes an opposed bottom surface facing toward the substrate, and wherein an edge surface of the stiffener element extends between the top and bottom surfaces of the stiffener element; and/or the edge of the heat distribution device is laterally spaced away from the edge of the stiffener element; and/or the edge of the heat distribution device is vertically aligned with the edge of the stiffener element; and/or the edge of the heat distribution device is an internal edge extending around an aperture; and/or the aperture is a first aperture, the edge surface of the stiffener element is an internal stiffener edge extending around a second aperture of the stiffener element, and the internal edge of the heat distribution device extends beyond the internal stiffener edge of the stiffener element, such that the first and second apertures are aligned.

According to a seventh aspect of disclosure, a microelectronic device assembly comprises: a substrate; a microelectronic element electrically connected to the substrate, the microelectronic element having an active surface facing toward the substrate and a passive surface facing away from the substrate, a stiffener element overlying the substrate and extending around the microelectronic element, the stiffener element having a first CTE; a heat distribution device overlying rear surfaces of the microelectronic element and the stiffener element, the heat distribution device having a second CTE; and a thermally conductive interface material joining the heat distribution device to the rear surface of the microelectronic element, wherein the heat distribution device is comprised of a first material that is different than a second material comprising the stiffener element, and wherein the first CTE is at least 50% greater than the second CTE; and/or the assembly further comprises joining the stiffener element to the substrate with a first adhesive, and joining the stiffener element to the heat distribution device with a second adhesive, wherein the first adhesive has a different modulus of elasticity than the second adhesive; and/or the modulus of elasticity of the first adhesive is greater than the modulus of elasticity of the second adhesive; and/or the first material of the stiffener element has a first thermal conductivity and the second material of the heat distribution device has a second thermal conductivity, the second thermal conductivity of the heat distribution device being greater than the first thermal conductivity of the stiffener element; and/or the heat distribution device is comprised of silver diamond and the stiffener element is comprised of copper; and/or the heat distribution device includes a planar surface extending across an entire rear surface of the stiffener element and the microelectronic element; and/or the heat distribution device includes a top surface and an opposed bottom surface, and an edge surface extending therebetween, wherein the stiffener element includes a top surface facing toward the bottom surface of the heat distribution device, an opposed bottom surface, and an edge surface extending between the top and bottom surfaces of the stiffener element, wherein the edge of the heat distribution device is laterally spaced away from the edge surface of the stiffener element.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples described herein, as well as clauses phrased as "such as," "including," and the like, should not be interpreted as limiting the subject matter of the claims to the specific examples; rather, the examples are intended to illustrate only one of many possible implementations. Further, the same or similar reference numbers in different drawings can identify the same or similar elements.

The invention claimed is:
1. A microelectronic device assembly comprising:
a substrate;

a microelectronic element electrically connected to the substrate, the microelectronic element having an active surface facing toward the substrate and a rear surface facing away from the substrate, a stiffener element overlying the substrate and extending around the microelectronic element, the stiffener element comprised of a first material having a first coefficient of thermal expansion ("CTE"); and a heat distribution device overlying the rear surface of the microelectronic element and a surface of the stiffener element facing toward the heat distribution device, the heat distribution device comprised of a second material having a second CTE; and wherein the first material is different than the second material, wherein the first CTE of the first material of the stiffener element is greater than the second CTE of the second material of the heat distribution device.

2. The microelectronic device assembly of claim 1, wherein the stiffener element is joined to the substrate with a first adhesive, and the stiffener element is joined to the heat distribution device with a second adhesive, wherein the first adhesive has a first modulus of elasticity that is different than a second modulus of elasticity of the second adhesive.

3. The microelectronic device assembly of claim 2, wherein the first modulus of elasticity of the first adhesive is greater than the second modulus of elasticity of the second adhesive.

4. The microelectronic device assembly of claim 3, wherein the first modulus of elasticity ranges from 10 MPa to 100 MPa, and the second modulus of elasticity ranges from 0.10 MPa to 10 MPa.

5. The microelectronic device assembly of claim 1, wherein the first CTE of the first material is at least 50 percent greater than the second CTE of the second material of the heat distribution device.

6. The microelectronic device assembly of claim 5, wherein the first CTE is at least 17 ppm/WK at 20° C.

7. The microelectronic device assembly of claim 1, wherein the first material of the stiffener element further comprises a first thermal conductivity, and wherein the second material of the heat distribution device further comprises a second thermal conductivity, and wherein the second thermal conductivity of the second material is less than the first thermal conductivity of the first material.

8. The microelectronic device assembly of claim 7, wherein the first thermal conductivity is greater than 394 W/mK at 20° C.

9. The microelectronic device assembly of claim 1, wherein the first material comprises copper and the second material comprises silver diamond.

10. The microelectronic device assembly of claim 1, wherein the stiffener element and the heat distribution device are independent structures coupled together.

11. The microelectronic device assembly of claim 10, wherein the heat distribution device includes a planar surface extending across an entire surface of the stiffener element and an entire rear surface of the microelectronic element.

12. The microelectronic device assembly of claim 10, wherein the heat distribution device includes a top surface, an opposed bottom surface, and an edge surface extending therebetween, wherein the surface of the stiffener element is a top surface facing toward the bottom surface of the heat distribution device, wherein the stiffener element further includes an opposed bottom surface facing toward the substrate, and wherein an edge of the stiffener element extends between the top and bottom surfaces of the stiffener element.

13. The microelectronic device assembly of claim 12, where the edge of the heat distribution device is an internal edge extending around an aperture, and wherein the aperture is a first aperture, the edge of the stiffener element is an internal stiffener edge extending around a second aperture of the stiffener element, and the internal edge of the heat distribution device extends beyond the internal stiffener edge of the stiffener element, such that the first and second apertures are aligned.

14. A microelectronic device assembly comprising:

a substrate;

a microelectronic element electrically connected to the substrate, the microelectronic element having an active surface facing toward the substrate and a passive surface facing away from the substrate, a stiffener element overlying the substrate and extending around the microelectronic element, the stiffener element having a first CTE;

a heat distribution device overlying rear surfaces of the microelectronic element and the stiffener element, the heat distribution device having a second CTE; and a thermally conductive interface material joining the heat distribution device to the rear surface of the microelectronic element, wherein the heat distribution device is comprised of a first material that is different than a second material comprising the stiffener element, and wherein the first CTE is at least 50% greater than the second CTE.

15. The microelectronic device assembly of claim 14, further comprising a first adhesive joining the stiffener element to the substrate, and a second adhesive joining the stiffener element to the heat distribution device, wherein the first adhesive has a different modulus of elasticity than the second adhesive.

16. The microelectronic device assembly of claim 15, wherein the modulus of elasticity of the first adhesive is greater than the modulus of elasticity of the second adhesive.

17. The microelectronic device assembly of claim 14, wherein the first material of the stiffener element has a first thermal conductivity and the second material of the heat distribution device has a second thermal conductivity, the second thermal conductivity of the heat distribution device being greater than the first thermal conductivity of the stiffener element.

18. The microelectronic device assembly of claim 14, wherein the heat distribution device is comprised of silver diamond and the stiffener element is comprised of copper.

19. The microelectronic device assembly of claim 14, wherein the heat distribution device includes a planar surface extending across an entire rear surface of the stiffener element and the microelectronic element.

20. The a microelectronic device assembly of claim 14, wherein the heat distribution device includes a top surface and an opposed bottom surface, and an edge surface extending therebetween, wherein the stiffener element includes a top surface facing toward the bottom surface of the heat distribution device, an opposed bottom surface, and an edge surface extending between the top and bottom surfaces of the stiffener element, wherein the edge surface of the heat distribution device is laterally spaced away from the edge surface of the stiffener element.

* * * * *